United States Patent
Kumar et al.

(10) Patent No.: US 10,281,713 B1
(45) Date of Patent: May 7, 2019

(54) SYSTEM AND METHOD FOR ELECTROWETTING DISPLAY DEVICE INCLUDING PIXELS WITH SELF-ALIGNED IGZO TRANSISTORS

(71) Applicant: Amazon Technologies, Inc., Seattle, WA (US)

(72) Inventors: Abhishek Kumar, Tilburg (NL); Toru Sakai, Waalre (NL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 153 days.

(21) Appl. No.: 15/197,606

(22) Filed: Jun. 29, 2016

(51) Int. Cl.
| | |
|---|---|
| G02B 26/00 | (2006.01) |
| G02F 1/153 | (2006.01) |
| H01L 29/24 | (2006.01) |
| H01L 29/786 | (2006.01) |
| H01L 27/12 | (2006.01) |
| H01L 29/66 | (2006.01) |
| H01L 21/02 | (2006.01) |
| H01L 21/385 | (2006.01) |

(52) U.S. Cl.
CPC ........ *G02B 26/005* (2013.01); *H01L 21/0217* (2013.01); *H01L 21/02565* (2013.01); *H01L 21/385* (2013.01); *H01L 27/124* (2013.01); *H01L 27/1225* (2013.01); *H01L 27/1248* (2013.01); *H01L 27/1259* (2013.01); *H01L 29/24* (2013.01); *H01L 29/66969* (2013.01); *H01L 29/7869* (2013.01)

(58) Field of Classification Search
CPC .............. G02F 1/1368; G02F 1/136286; G02F 1/133345; G02F 1/133512; G02F 1/1339; G02F 1/136213; G02F 1/13624; G02F 2201/123; G02F 1/13338; G02F 1/133514; G02F 1/13394; G02F 1/134309; G02F 1/134336; G02F 1/134636; G02F 1/13454; G02F 1/136227
USPC ........ 359/237, 265–267, 273, 290–292, 295, 359/298, 321
See application file for complete search history.

(56) References Cited

U.S. PATENT DOCUMENTS

2014/0232976 A1* 8/2014 Chen ................. G02F 1/133707
349/139

* cited by examiner

*Primary Examiner* — Brandi N Thomas
(74) *Attorney, Agent, or Firm* — Quarles and Brady LLP

(57) ABSTRACT

A display device and a method for making the same are provided. In the method, source and drain contacts are patterned on a buffer layer. An IGZO layer is depositing over at least a portion of the source contact and a portion of the drain contact. A gate structure is formed over the IGZO layer. A silicon nitride layer is deposited over the gate structure and the IGZO layer to form a first doped region in the IGZO layer and a second doped region in the IGZO layer. A pixel electrode is formed over the buffer layer. A plurality of pixel walls are formed over the buffer layer, the plurality of pixel walls being associated with an electrowetting pixel and the pixel electrode being configured to a apply voltage within the electrowetting pixel. At least one of the source contact and the drain contact is connected to the pixel electrode.

18 Claims, 47 Drawing Sheets

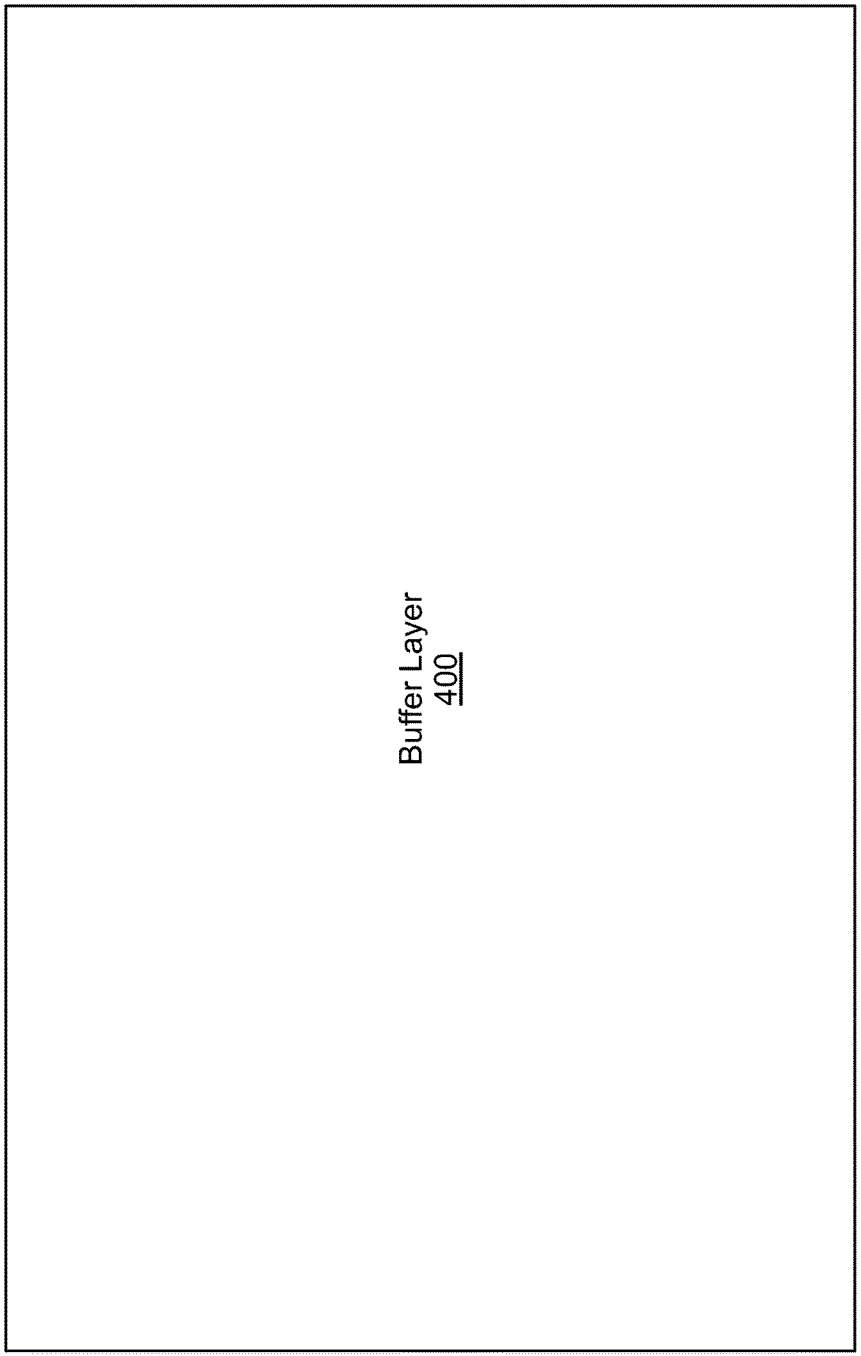

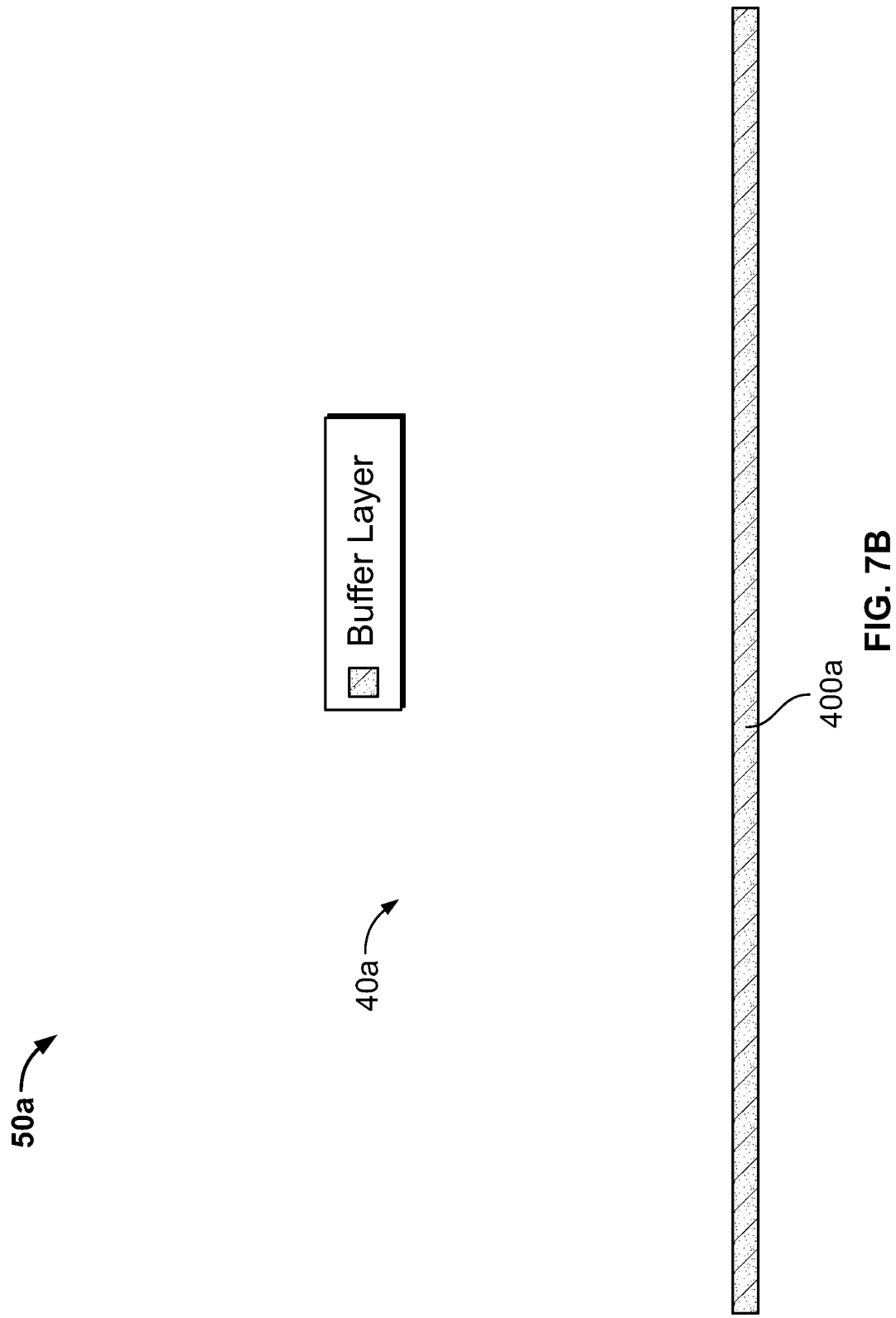

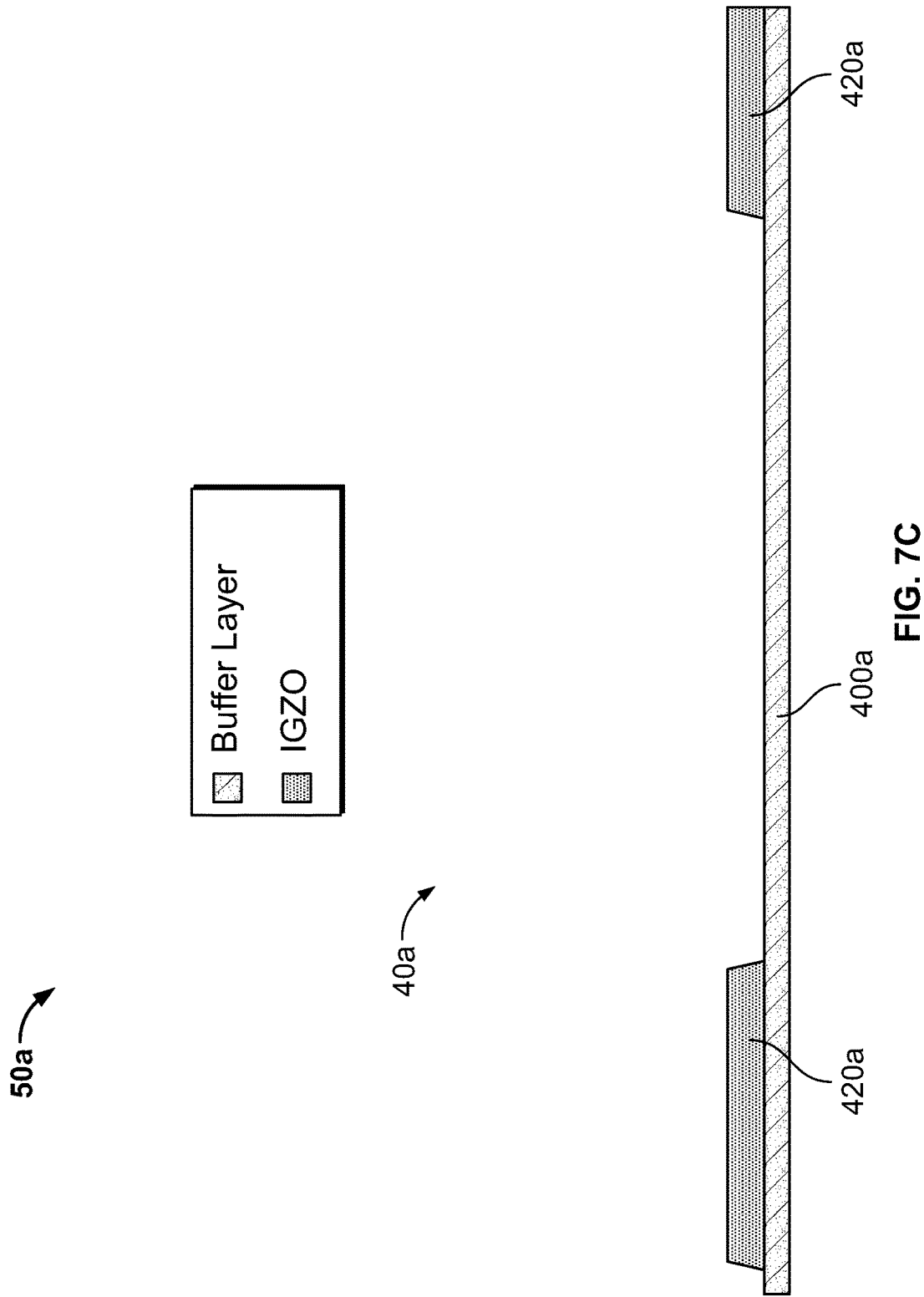

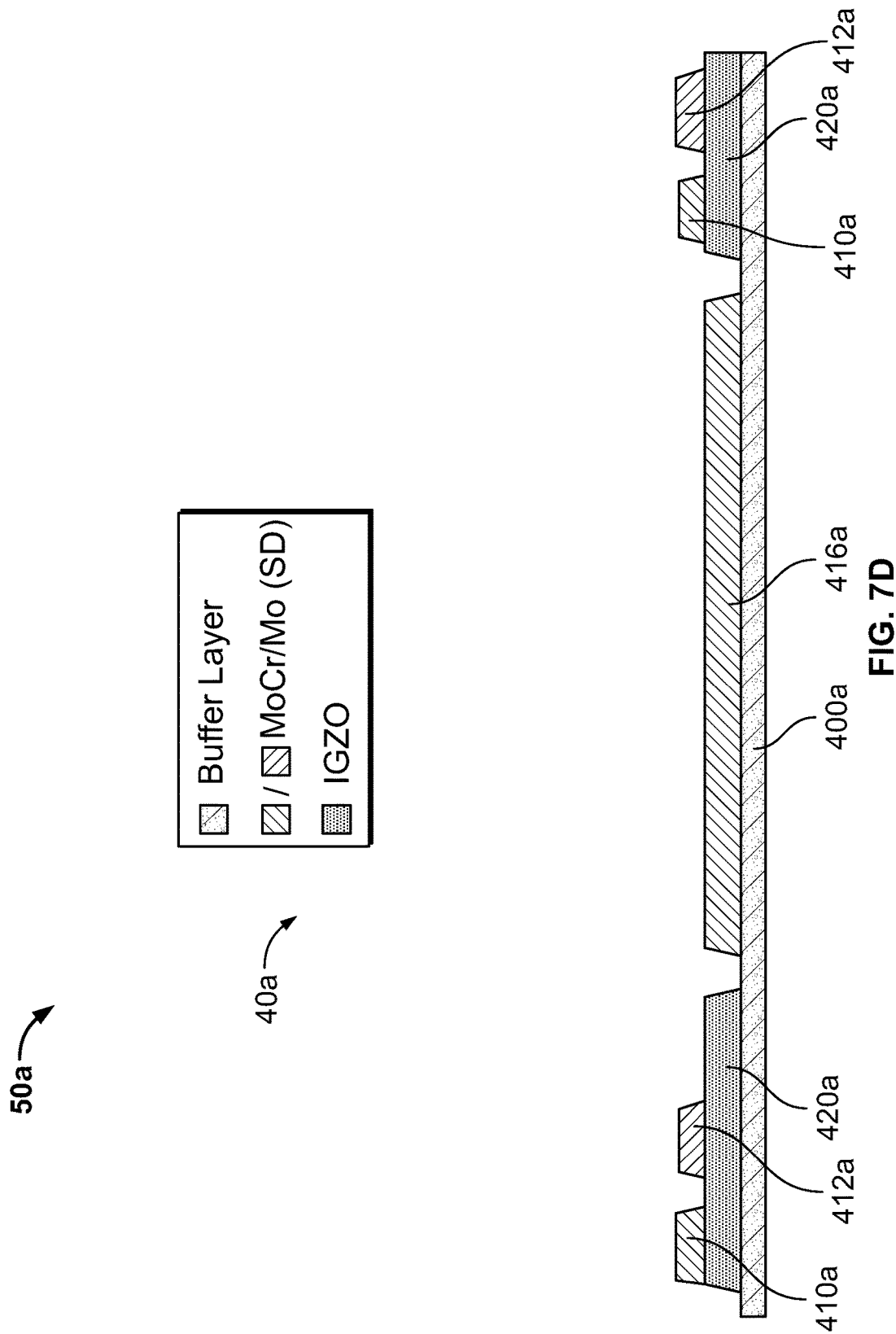

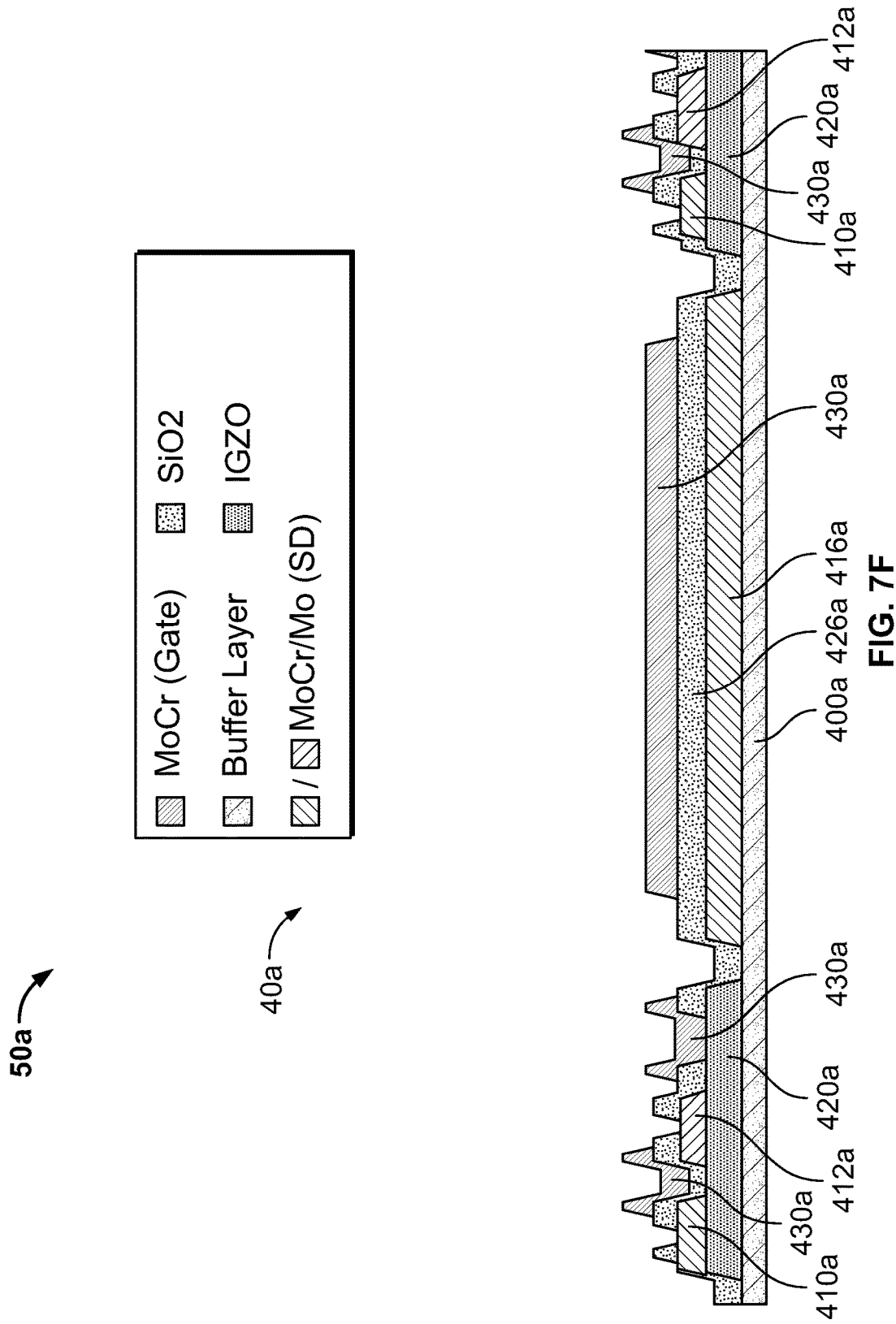

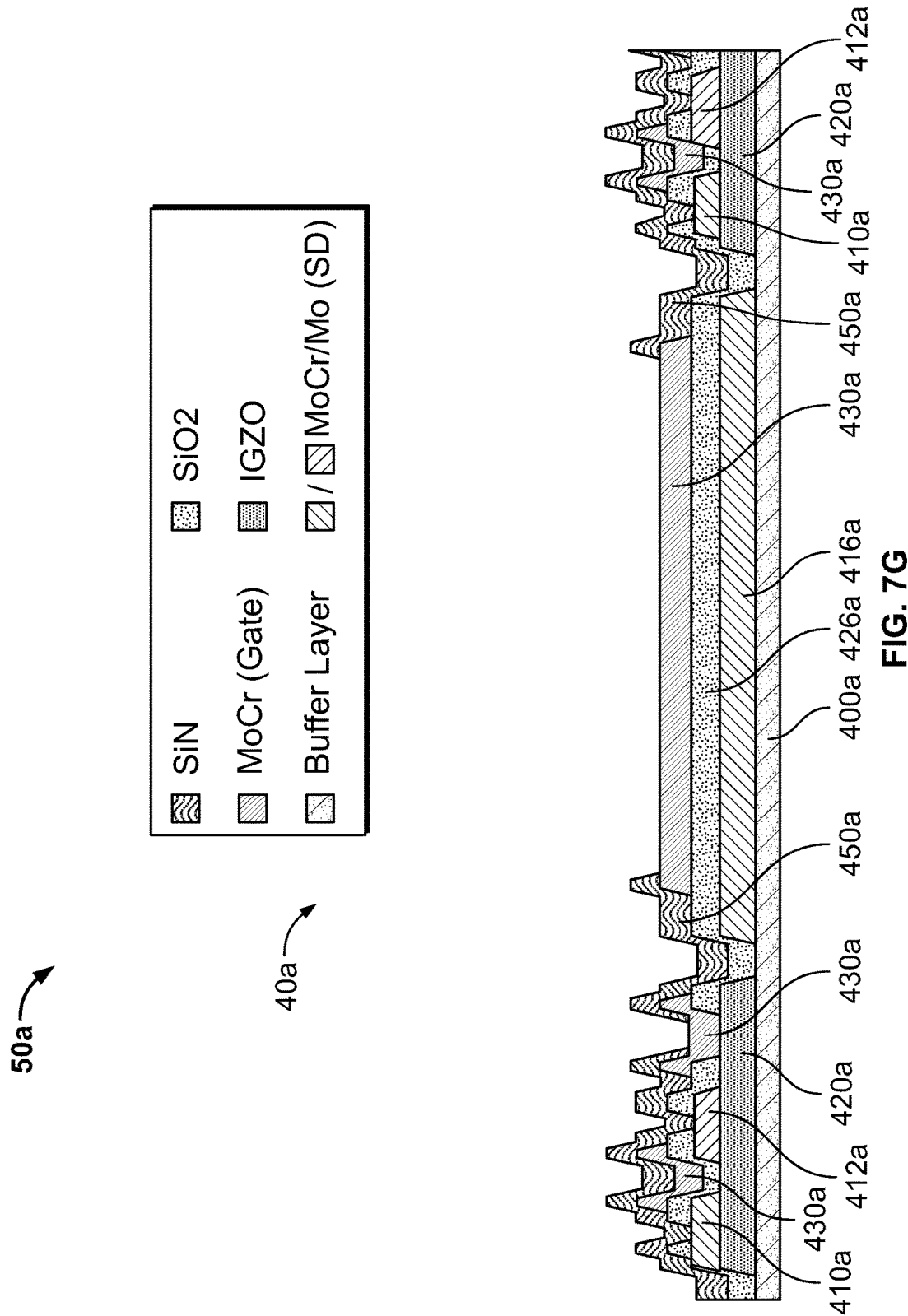

SYSTEM AND METHOD FOR ELECTROWETTING DISPLAY DEVICE INCLUDING PIXELS WITH SELF-ALIGNED IGZO TRANSISTORS

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, enhancing user experience and satisfaction continues to be a priority. Moreover, increased multimedia use imposes high demands on designing, packaging, and fabricating display devices, as content available for mobile use becomes more extensive and device portability continues to be a high priority to the consumer.

An electrowetting display includes an array of pixels individually bordered by pixel walls that retain fluid, such as an opaque oil, for example. Light transmission through each pixel is adjustable by electronically controlling a position of the fluid in the pixel.

BRIEF DESCRIPTION OF THE DRAWINGS

The detailed description is set forth with reference to the accompanying figures. The use of the same reference numbers in different figures indicates similar or identical items or features.

FIG. 4A illustrates a top view of a display device after a first processing step of buffer layer deposition.

FIGS. 7B-7K illustrate cross-sectional views of a process of fabricating the device of FIG. 6J.

DETAILED DESCRIPTION

Figure 1A:
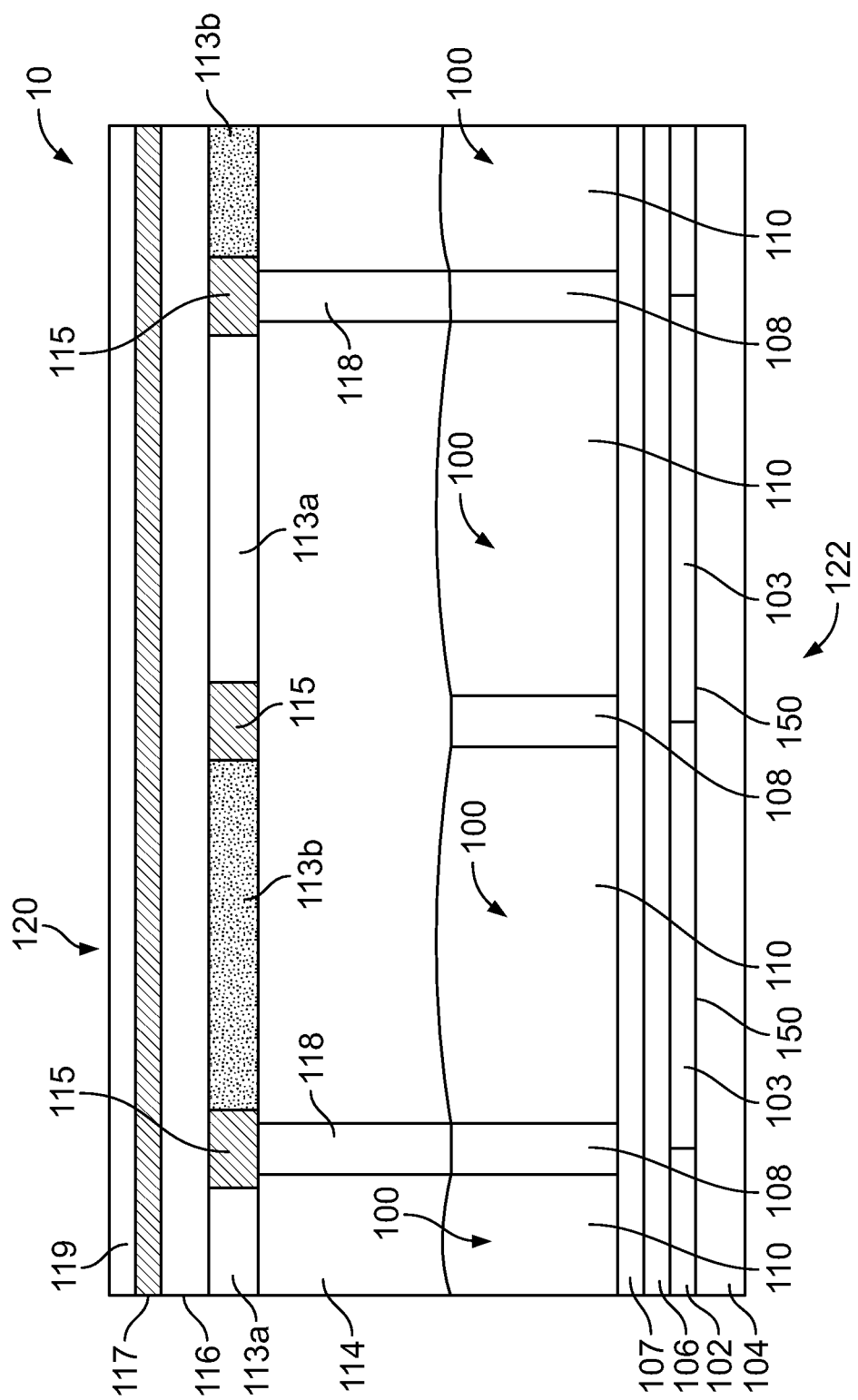
FIGS. 1A and 1B illustrate cross-sectional views of a portion of an electrowetting display device.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and/or a cover layer component, which may include antiglare properties, antireflective properties, anti-fingerprint properties, anti-cracking properties, and the like.

An electrowetting display includes a number of electrowetting pixels. Within the display, each electrowetting pixel is associated with a number of pixel walls. The pixel walls form a structure that is configured to contain at least a portion of a first fluid, such as a black opaque oil. Light transmission through the electrowetting pixel can be controlled by an application of an electric potential or driving voltage to the electrowetting pixel, which results in a movement of a second fluid, such as an electrolyte solution, into or within the electrowetting pixel, thereby displacing the oil.

When the electrowetting pixel is in a rest state, the oil is distributed throughout the pixel. The oil absorbs light and the pixel in this condition appears black. But when the driving voltage is applied, the oil is displaced to one or more sides of the pixel. Light can then enter the electrowetting pixel striking a reflector at the bottom of the pixel. The light then reflects out of the pixel, causing the pixel to appear less dark (e.g., white) to an observer. If the reflector only reflects a portion of the spectrum of visible light or if color filters are incorporated above the pixel, the pixel may appear to have color.

The application of the driving voltage to the pixel is controlled by a switch, such as a transistor. The state of the switch (i.e., whether the switch is closed or open) is controlled by a display controller, as described herein. In electrowetting display devices, the switches are often implemented as thin film transistors (TFTs) formed either within the pixel or in proximity to the pixel.

During operation of the display device, the TFT for a particular pixel may only be closed to supply the driving voltage to the pixel for a fraction of the display refresh period. In order to maintain the pixel at a particular driving voltage for the remainder of the display refresh period, the driving voltage supplied by the TFT is stored within a capacitive structure of the pixel. In a conventional display device, however, the switch coupled to the pixel's capacitive structure will leak current, meaning that the charge stored in the capacitive structure will diminish over time. That in turn means that driving voltage and, consequently, the pixel's brightness will diminish over time. To mitigate this effect, conventional devices must use a relatively high-frequency refresh rate (e.g., greater than 60 Hz) to ensure that the diminishing brightness due to current leakage within the pixels is not noticeable to a viewer.

In the present device, a TFT configuration is presented in which the semiconducting portions of the TFT are implemented using indium gallium zinc oxide (IGZO) materials, which, as described herein may significantly reduce leakage current through the TFT. In some IGZO TFTs, for example, leakage current may be reduced to less than 1 femtoamp (fA), as compared to conventional technologies in which the leakage current may be as high as 10 picoamps (pA). The reduction in leakage current of the new TFT design can allow for reduced refresh rates. For example, the present design can enable a display to be driven with a refresh rate of 20 Hz or lower without noticeable visual artifacts.

Additionally, the present TFT design may be assembled using fabrication techniques that may provide improved tolerance over the techniques used for conventional designs. As described herein, the formation of the IGZO TFT can rely, at least in part, on self-alignment of one or more component of the TFT. Self-alignment involves, while building up the structure of the TFT over a substrate, using a first component of the TFT as a mask while forming a second component. This technique means that the second component can be positioned relative to the first component. As a consequence, the second component will be positioned accurately with respect to the first component, even if the first component is slightly misplaced within the TFT structure. Accordingly, self-aligning architectures may more accurately position components than conventional approaches that rely instead upon absolute positioning of both the first and second component. For example, this self-alignment approach enables precise control over the relative positions of the TFT's gate structure with respect to the source and drain contacts and, specifically, an amount of overlap between source and drain contact regions and the gate region of the present TFT.

Accordingly, the self-aligned architecture can be used to create source and drain contacts with little or no overlap with the TFT's gate structure, which may reduce the TFT's parasitic capacitances between the source, drain, and gate structures. The present self-aligned IGZO TFT design may further reduce the RC load of the electrowetting display, which may enable faster switching in combination with lower power consumption.

A display device, such as an electrowetting display device, may be a transmissive, reflective or transflective display that generally includes an array of pixels configured to be operated by an active matrix addressing scheme. In this disclosure, a pixel may, unless otherwise specified, comprise a single sub-pixel or a pixel that includes two or more sub-pixels of an electrowetting display device. Such a pixel or sub-pixel may be the smallest light transmissive, reflective or transflective element of a display that is individually operable to directly control an amount of light transmission through and/or reflection from the element. For example, in some implementations, a pixel may be a red sub-pixel, a green sub-pixel, a blue sub-pixel or a white sub-pixel of a larger pixel or may, in some cases, include a number of sub-pixels. As such, a pixel may be a pixel that is a smallest component, e.g., the pixel does not include any sub-pixels.

Rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., used as switches) associated with each pixel. The transistors take up a relatively small fraction of the area of each pixel to allow light to efficiently pass through (or reflect from) the display pixel.

Electrowetting displays include an array of pixels sandwiched between two support plates, such as a bottom support plate and a top support plate. For example, a bottom support plate in cooperation with a top support plate may contain pixels that include electrowetting oil, electrolyte solution and pixel walls between the support plates. Support plates may include glass, plastic (e.g., a transparent thermoplastic such as a poly(methyl methacrylate) (PMMA) or other acrylic), or other transparent material and may be made of a rigid material or a flexible material, for example. Pixels include various layers of materials built upon a bottom support plate. One example layer is a hydrophobic layer, e.g. a fluoropolymer layer, around portions of which pixel walls are built.

Hereinafter, example embodiments include, but are not limited to, reflective electrowetting displays that include a clear, transparent, or semi-transparent top support plate and a bottom support plate, which need not be transparent. The clear top support plate may comprise glass or any of a number of transparent materials, such as transparent plastic, quartz, and semiconductors, for example, and claimed subject matter is not limited in this respect. "Top" and "bottom" as used herein to identify the support plates of an electrowetting display do not necessarily refer to a direction referenced to gravity or to a viewing side of the electrowetting display. Also, as used herein for the sake of convenience of describing example embodiments, the top support plate is that through which viewing of pixels of a (reflective) electrowetting display occurs.

In some embodiments, a reflective electrowetting display comprises an array of pixels sandwiched between a bottom support plate and a top support plate. The bottom support plate may be opaque while the top support plate is transparent. Herein, describing a pixel or material as being transparent generally means that the pixel or material may transmit or enable the propagation of a relatively large fraction of the light incident upon it. For example, a transparent material or layer may transmit or propagate more than 70% or 80% of the light impinging on its surface, though claimed subject matter is not limited in this respect. In contrast, opaque generally means that the pixel or material may block or inhibit the transmission or propagation of at least a portion of the visible light spectrum incident upon it. For example, a black opaque material or layer may block, absorb, or otherwise prevent the propagation of more than 70% or 80% of the light impinging on its surface, though claimed subject matter is not limited in this respect. In the present disclosure, materials that are described as preventing the propagation of light shall be understood to prevent propagation of at least 70% of the light striking the material. Alternatively, opaque material may be transmissive for a portion of the visible light spectrum and blocking other portions, forming a color filter. Similarly, materials that are described as being transparent or allowing propagation of light shall be understood to transmit or propagate at least 70% of the light striking the material. In this description, the visible light spectrum may include light having a wavelength between 390 nanometers (nm) and 700 nm.

Pixel walls retain at least a first fluid that is electrically non-conductive in the individual pixels. For example, the first fluid may include an opaque or colored oil. References in the present disclosure to an oil shall be understood to refer to any fluid that is electrically non-conductive. Each pixel includes a cavity formed between the support plates that is at least partially filled with the oil (e.g., retained by pixel walls) and a second fluid (e.g., considered to be an electrolyte solution) that is electrically conductive or polar and may be a water or a salt solution such as a solution of potassium chloride water. The second fluid may be transparent, but may be colored, or light-absorbing in some embodiments. The second fluid is immiscible with the first fluid. Herein, substances are immiscible with one another if the substances do not substantially form a solution.

Individual reflective electrowetting pixels may include a reflective layer on the bottom support plate of the electrowetting pixel, a transparent electrode layer adjacent to the reflective layer, and a hydrophobic layer on the electrode layer. Alternatively, the reflective layer may act as the pixel electrode. Pixel walls, associated with and formed around each pixel, the hydrophobic layer, and the transparent top support plate at least partially enclose a fluid region that includes an electrolyte solution and the oil, which is immiscible with the electrolyte solution. An "opaque" fluid, as described herein, is used to describe a fluid that appears black or to have color to an observer. For example, an opaque fluid appears black to an observer when it strongly absorbs a broad spectrum of wavelengths (e.g., including those of red, green and blue light) in the visible region of light or electromagnetic radiation. In some embodiments, the opaque fluid is a non-polar electrowetting oil.

The opaque fluid is disposed in the fluid region. A coverage area of the opaque fluid on the bottom hydrophobic layer is electrically adjustable to affect the amount of light incident on the reflective electrowetting display that reaches the reflective material at the bottom of each pixel.

In addition to pixels, spacers and edge seals may also be located between the two support plates. Spacers and edge seals that mechanically connect the first support plate with and opposite to the second overlying support plate, or which form a separation between the first support plate and the second support plate, can contribute to the mechanical integrity of the electrowetting display. Edge seals, for example, being disposed along a periphery of an array of electrowetting pixels, may contribute to retaining fluids (e.g., the first and second fluids) between the first support plate and the second overlying support plate. Spacers can be at least partially transparent so as to not hinder throughput of light in the electrowetting display. The transparency of spacers may at least partially depend on the refractive index of the spacer material, which can be similar to or the same as the refractive indices of surrounding media. Spacers may also be chemically inert to surrounding media.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a light guide of the display device. For example, display software may include code executable by a processor to modulate optical properties of individual pixels of the electrowetting display based, at least in part, on electronic signals representative of image and/or video data. The code may cause the processor to modulate the optical properties of pixels by controlling electrical signals (e.g., voltages, currents, and fields) on, over, and/or in layers of the electrowetting display.

Figure 1B:
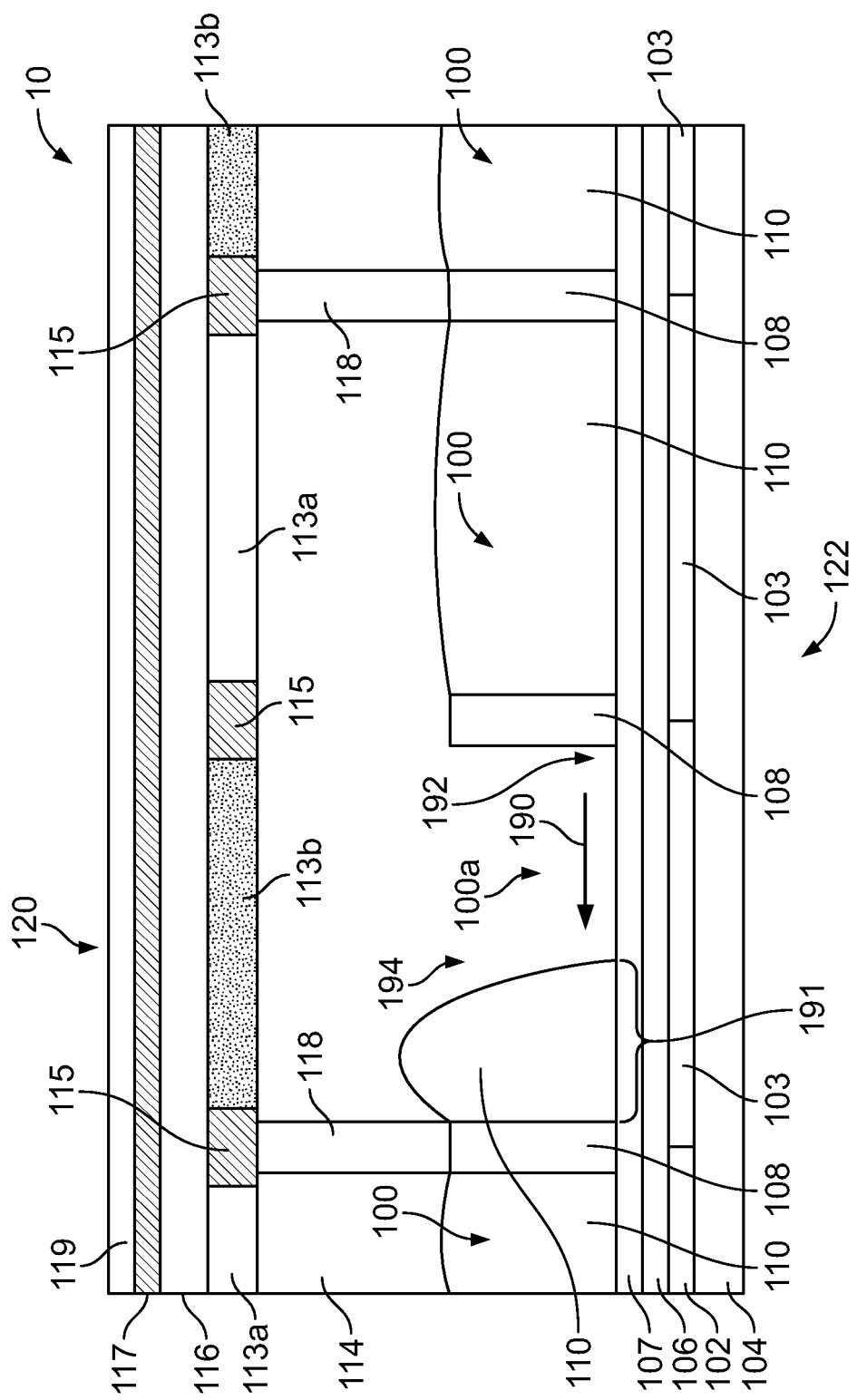
Figure 2:
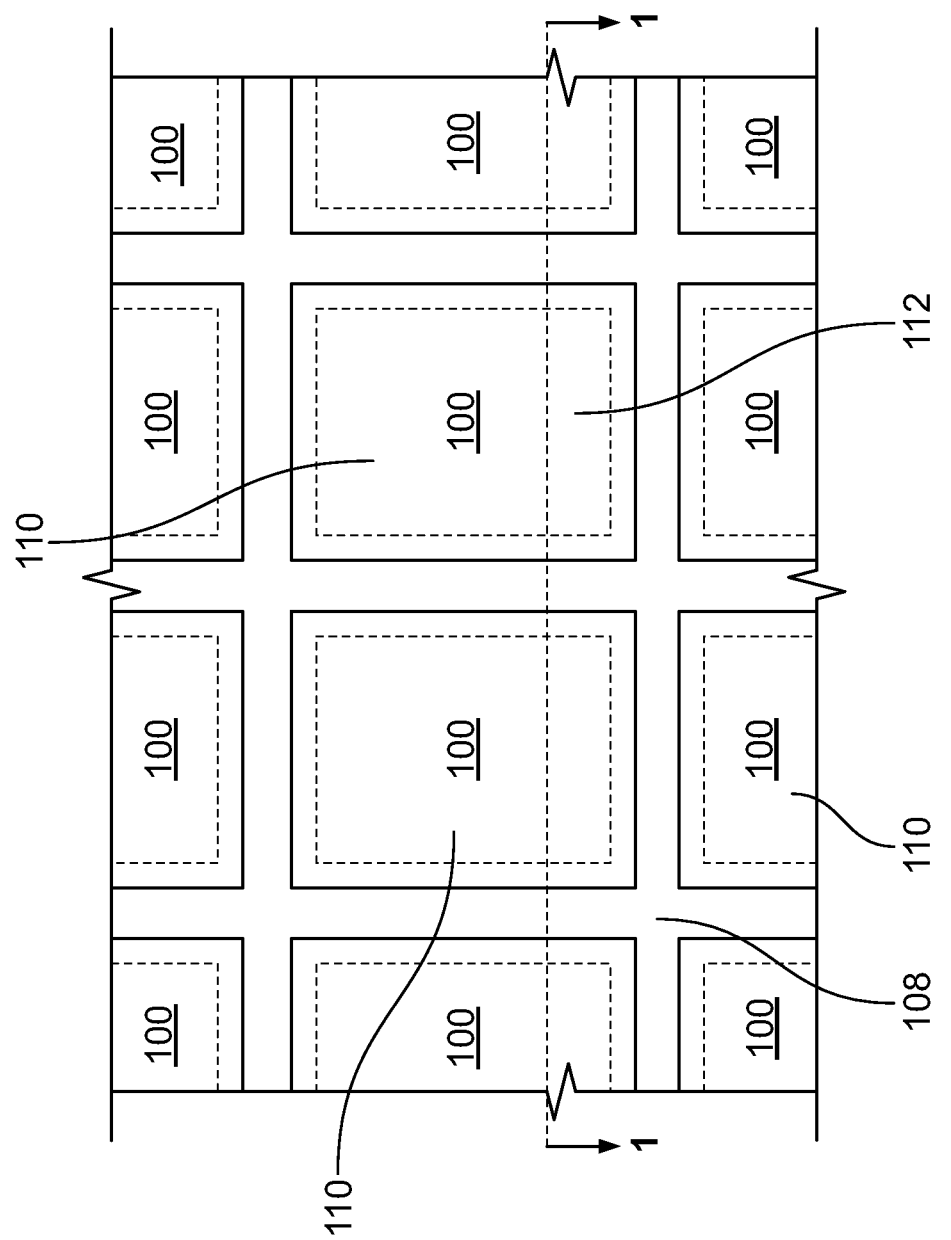
FIG. 2 illustrates a top view of the electrowetting pixels of FIGS. 1A and 1B mostly exposed by an electrowetting fluid, according to various embodiments.

FIG. 1A is a cross-section of a portion of an example conventional reflective electrowetting display device 10 illustrating several electrowetting pixels 100 taken along sectional line 1-1 of FIG. 2. FIG. 1B shows the same cross-sectional view as FIG. 1A in which an electric potential has been applied to one of the electrowetting pixels 100 causing displacement of an oil disposed therein, as described below. FIG. 2 shows a top view of electrowetting pixels 100 formed over a bottom support plate 104. The view shown in FIG. 2 is simplified and does not depict each component illustrated in FIGS. 1A and 1B and primarily illustrates the row and column layout of pixels 100.

In FIGS. 1A and 1B, two complete electrowetting pixels 100 and two partial electrowetting pixels 100 are illustrated. Electrowetting display device 10 may include any number (usually a very large number, such as thousands or millions) of electrowetting pixels 100. An electrode layer 102 is formed on a bottom support plate 104.

In various embodiments, electrode layer 102 consists of individual pixel electrodes 103, each addressing an individual pixel. The individual pixel electrodes 130 may be connected to a transistor, such as a thin film transistor (TFT) 150, that is switched or otherwise controlled to either select or deselect an electrowetting pixel 100 using an active matrix addressing scheme, for example. A TFT is a particular type of field-effect transistor that includes thin films of an active semiconductor layer as well as a dielectric layer and metallic contacts over a supporting (but non-conducting) substrate, which may be glass or any of a number of other suitable transparent or non-transparent materials, for example. The TFTs and corresponding data lines may be formed within electrode layer 102 or within other layers over or within support plate 104.

In some embodiments, a dielectric barrier layer 106 may at least partially separate electrode layer 102 from a hydrophobic layer 107, also formed on bottom support plate 104. Barrier layer 106 may be formed from various materials including organic/inorganic multilayer stacks or layers. In some embodiments, hydrophobic layer 107 is an amorphous fluoropolymer layer including any suitable fluoropolymer(s), such as AF1600®, produced by DuPont, based in Wilmington, Del. Hydrophobic layer 107 may also include suitable materials that affect wettability of an adjacent material, for example.

Pixel walls 108 form a patterned electrowetting pixel grid on hydrophobic layer 107. Pixel walls 108 may comprise a photoresist material such as, for example, epoxy-based negative photoresist SU-8. The patterned electrowetting pixel grid comprises rows and columns that form an array of electrowetting pixels. For example, an electrowetting pixel may have a width and a length in a range of about 50 to 500 micrometers.

Oil 110 (or another opaque fluid), which may have a thickness (e.g., a height) in a range of about 1 to 10 micrometers, for example, overlays hydrophobic layer 107. Oil 110 is partitioned by pixel walls 108 of the patterned electrowetting pixel grid. A second fluid 114, such as an electrolyte solution, overlays oil 110 and pixel walls 108 of the patterned electrowetting pixel grid. Oil 110 is immiscible with second fluid 114.

Color filters 113a, 113b (collectively, 113) are positioned over each of pixels 100. Each color filter 113 may be configured to be substantially transparent to particular ranges of wavelengths of light, while absorbing others. For example, color filter 113a may be transparent to red light having wavelengths ranging from 620 nm to 750 nm, while absorbing light having other wavelengths. Conversely, color filter 113b may be transparent to green light having wavelengths ranging from 495 nm to 570 nm, while absorbing light having other wavelengths. Various pixels 100 within device 10 may be associated with color filters 113 that are transparent to all wavelengths of visible light, namely visible white light. As used herein, visible light refers to wavelengths of electromagnetic radiation visible to the human eye. Generally, this includes electromagnetic radiation having wavelengths between about 400 nm to about 700 nm.

Color filters 113, therefore, may be utilized to assign each pixel 100 a color, so that when a particular pixel 100 is in an open or at least partially open state, light reflected by that pixel 100 will take on the color of the color filter 113 positioned over that pixel 100. In other embodiments of device 10, color filter 113 could instead be located over a bottom surface of each pixel (e.g., upon or incorporating into hydrophobic layer 107.

In an attempt to prevent cross-talk—light propagation between pixels 100—device 10 includes a number of black matrix members 115 positioned over each pixel wall 108 in device 10. Black matrix members 115 are configured to block or absorb all wavelengths of visible light and therefore reduce an amount of light that may enter device 10 over one pixel while exiting device 10 over a second pixel.

A support plate 116, in conjunction with color filters 113 and black matrix members 115, covers second fluid 114 and spacers 118 to maintain second fluid 114 over the electrowetting pixel array. A diffuser film (not shown) may be formed over or, in some cases, integrated into a portion of, support plate 116 to diffuse light striking a surface of support plate 116 and passing therethrough.

In one embodiment, spacers 118 extend to support plate 116 and may rest upon a top surface of one or more pixel walls 108. Multiple spacers 118 may be interspersed throughout the array of pixels 100. The dimensions and shape of the spacers is not restricted to pillar shape as shown in FIG. 1A, alternative shapes include crosses, lines of spacers, or full grid spacer structures.

In some embodiments of device 10, a front light component may be positioned over an edge of viewing side 120 of device 10. In these embodiments, a light guide 117 may be positioned over device 10 to guide light generated by the front light component over viewing side 120 of device 10. A layer 119, e.g. glass or other material, incorporating various touch-sensitive structures may also be positioned over device 10.

A driving voltage applied across, among other things, second fluid 114 and a pixel electrode in electrode layer 102 addressing a particular electrowetting pixel 100 may control transmittance or reflectance of individual electrowetting pixels 100.

Display device 10 has viewing side 120 on which an image formed by electrowetting display device 10 may be viewed, and an opposing rear side 122. Support plate 116 faces viewing side 120 and bottom support plate 104 faces rear side 122. Reflective electrowetting display device 10 may be a segmented display type in which the image is built of segments. The segments may be switched simultaneously or separately. Each segment includes one electrowetting pixel 100 or a number of electrowetting pixels 100 that may be adjacent or distant from one another. Electrowetting pixels 100 included in one segment are switched simultaneously, for example. Electrowetting display device 10 may also be an active matrix driven display type or a passive matrix driven display, for example.

As mentioned above, second fluid 114 is immiscible with oil 110. Second fluid 114 is electrically conductive and/or polar, and may be water or a salt solution such as a solution of potassium chloride in water, for example. In certain embodiments, second fluid 114 is transparent, but may be colored or light absorbing. Oil 110 is electrically non-conductive and may for instance be an alkane like hexadecane or (silicone) oil.

Hydrophobic layer 107 is arranged on bottom support plate 104 to create an electrowetting surface area. The hydrophobic character of hydrophobic layer 107 causes oil 110 to adhere preferentially to hydrophobic layer 107 because oil 110 has a higher wettability with respect to the surface of hydrophobic layer 107 than second fluid 114 in the absence of a voltage. Wettability relates to the relative affinity of a fluid for the surface of a solid. Wettability increases with increasing affinity, and it may be measured by the contact angle formed between the fluid and the solid and measured internal to the fluid of interest. For example, such a contact angle may increase from relative non-wettability of more than 90° to complete wettability at 0°, in which case the fluid tends to form a film on the surface of the solid.

In some embodiments, oil 110 absorbs light within at least a portion of the optical spectrum and so may form a color filter. The fluid may be colored by addition of pigment particles or dye, for example. Alternatively, oil 110 may be black (e.g., absorbing substantially all light within the optical spectrum) or reflecting. Hydrophobic layer 107 may be transparent or reflective. A reflective layer may reflect light within the entire visible spectrum, making the layer appear bright, or reflect a portion of light within the visible spectrum, making the layer have a color.

If a voltage is applied across an electrowetting pixel 100, electrowetting pixel 100 will enter into an active or at least partially open state. Electrostatic forces will move second fluid 114 toward electrode layer 102 within the active pixel, thereby displacing oil 110 from that area of hydrophobic layer 107 to pixel walls 108 surrounding the area of hydrophobic layer 107, to a droplet-like form. Such displacing action at least partly uncovers oil 110 from the surface of hydrophobic layer 107 of electrowetting pixel 100. Due to the configuration of electrode layer 102, when the voltage is applied across the electrowetting pixel 100, oil 110 generally always move in the same direction within the pixel 100 so as to form into a droplet against the same wall 108 of the pixel 100.

FIG. 1B shows one of electrowetting pixels 100 in an active state (see pixel 100a). With an electric potential applied to a pixel electrode in electrode layer 102 underneath the activated electrowetting pixel 100a, second fluid 114 is attracted towards pixel electrode in electrode layer 102 displacing oil 110 within the activated electrowetting pixel 100.

As second fluid 114 moves towards hydrophobic layer 107 of the activated electrowetting pixel 100, oil 110 is displaced in a predictable direction within pixel 100a (e.g., in the direction of arrow 190), referred to herein as the oil displacement direction, and moves towards a pixel wall 108 of the activated pixel 100 or is otherwise displaced. In the example of FIG. 1B, pixel 100a is fully open at a maximum driving voltage and oil 110 of pixel 100a has formed a droplet over an oil accumulation area 191 of pixel 100a as a result of the driving voltage being applied to pixel 100a. After activation of pixel 100a, when the voltage across electrowetting pixel 100a is returned to an inactive signal level of zero or a value near to zero, electrowetting pixel 100a will return to an inactive or closed state, where oil 110 flows back to cover hydrophobic layer 107. In this way, oil 110 forms an electrically controllable optical switch in each electrowetting pixel 100.

With oil 110 of pixel 100a displaced following the application of a driving voltage to pixel 100a, light can enter pixel 100a through color filter 113b, strike the exposed portion of the reflective surface at the bottom of pixel 100a, and reflect back out through color filter 113b.

Figure 3:
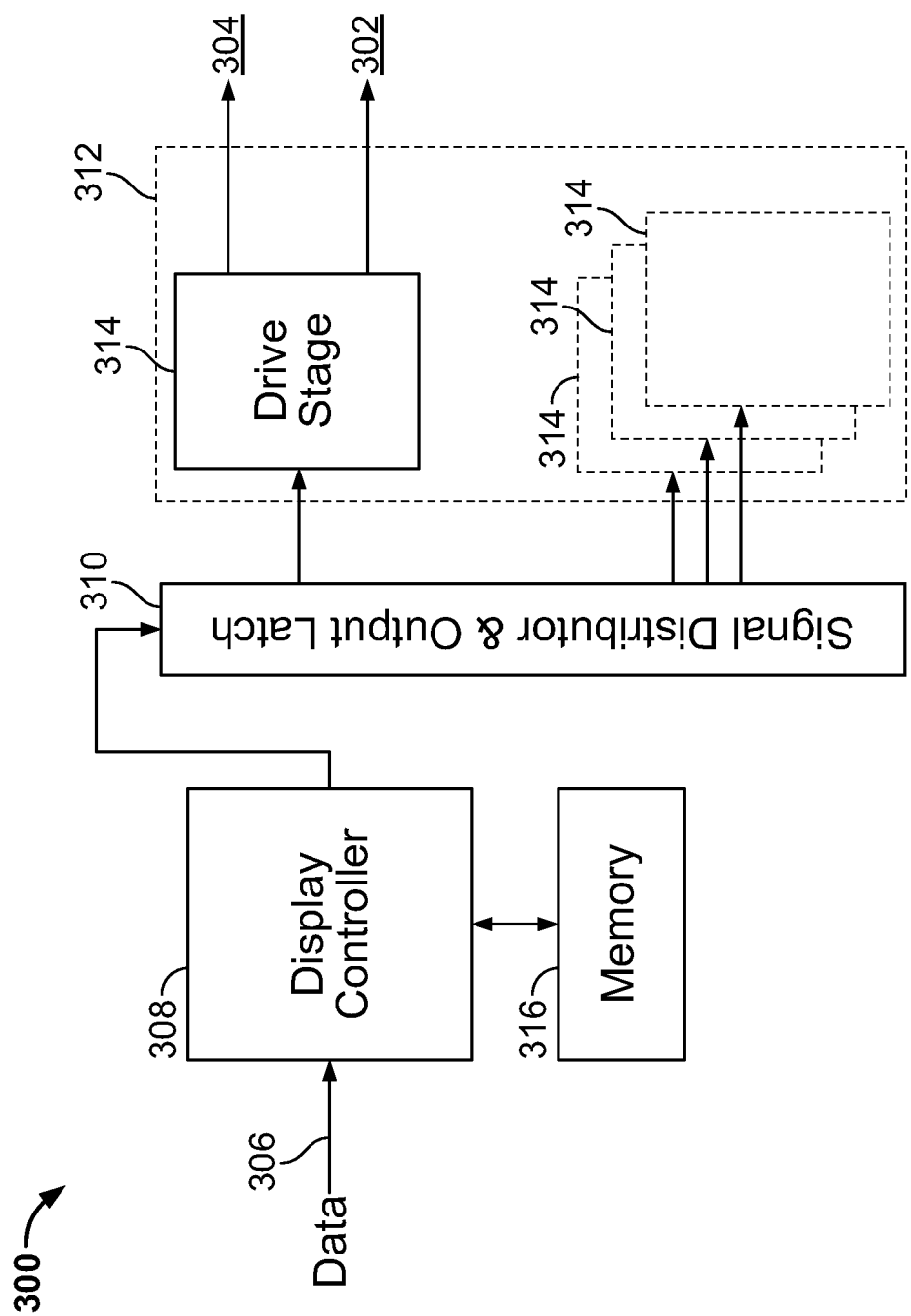
FIG. 3 is a block diagram of an example embodiment of an electrowetting display driving system, including a control system of the electrowetting display device.

FIG. 3 shows a block diagram of an example embodiment of an electrowetting display driving system 300, including a control system of the display device. Display driving system 300 can be of the so-called direct drive type and may be in the form of an integrated circuit adhered or otherwise connected to bottom support plate 104. Display driving system 300 includes control logic and switching logic, and is connected to the display by means of electrode signal lines 302 and a common signal line 304. Each electrode signal line 302 connects an output from display driving system 300 to a different electrode within each pixel 100, respectively. Common signal line 304 is connected to second fluid 114 through a common electrode, e.g. an electrode deposited over the color filter layer on the top support plate. Also included are one or more input data lines 306, whereby display driving system 300 can be instructed with data so as to determine which pixels 100 should be in an active or open state and which pixels 100 should be in an inactive or closed state at any moment of time. In this manner, display driving system 300 can determine a target reflectance value for each pixel 100 within the display.

Electrowetting display driving system 300 as shown in FIG. 3 includes a display controller 308, e.g., a microcontroller, receiving input data from input data lines 306 relating to the image to be displayed. Display controller 308, being in this embodiment the control system, is configured to apply a voltage to the first electrode to establish a particular display state (i.e., reflectance value) for a pixel 100. The microcontroller controls a timing and/or a signal level of at least one signal level for a pixel 100.

The output of display controller 308 is connected to the data input of a signal distributor and data output latch 310. Signal distributor and data output latch 310 distributes incoming data over a plurality of outputs connected to the display device, via drivers in certain embodiments. Signal distributor and data output latch 310 cause data input indicating that a certain pixel 100 is to be set in a specific display state to be sent to the output connected to pixel 100. Signal distributor and data output latch 310 may be a shift register. The input data is clocked into the shift register and at receipt of a latch pulse the content of the shift register is copied to signal distributor and data output latch 310. Signal distributor and data output latch 310 has one or more outputs, connected to a driver assembly 312. The outputs of signal distributor and data output latch 310 are connected to the inputs of one or more driver stages 314 within electrowetting display driving system 300. The outputs of each driver stage 314 are connected through electrode signal lines 302 and common signal line 304 to a corresponding pixel 100. In response to the input data, a driver stage 314 will output a voltage of the signal level set by display controller 308 to set one of pixels 100 to a corresponding display state having a target reflectance level.

To assist in setting a particular pixel to a target reflectance level, memory 316 may also store data that maps a particular driving voltage for a pixel to a corresponding reflectance value and vice versa. The data may be stored as one or more curves depicting the relationship between driving voltage and reflectance value, or a number of discrete data points that map a driving voltage to a reflectance value and vice versa. As such, when display controller 308 identifies a target reflectance value for a particular pixel, display controller 308 can use the data mapping driving voltage to reflectance value to identify a corresponding driving voltage. The pixel can then be driven with that driving voltage.

In the present display device, a transistor such as a TFT is connected to each pixel and is configured to operate as a switching element for controlling the state of the corresponding pixel. Specifically, the transistor of each pixel is configured to control the application of a driving voltage to each pixel that, in turn, controls the movement of the oil within the pixel and, thereby, the pixel's reflectance or brightness.

In conventional display devices, the transistors that control pixel state often exhibit a leakage current, causing charge to leak from the capacitor storing the pixel's driving voltage over time. This causes a reduction in the pixel's brightness and requires a relatively high refresh rate so that the reduction in brightness is not noticeable to a viewer.

The present pixel and TFT design provides a configuration utilizing IGZO materials enabling the implementation of TFTs having low leakage current. One of the important problems of conventional TFTs used in conventional display devices is their relatively large off-state leakage current, which can affect display brightness. Conventional devices may exhibit leakage currents up to about 10 pA. In contrast, the present IGZO TFT may have a leakage current of less than 1 fA. The reduced leakage current may enable reduced device refresh rates (and, consequently, reduced power consumption) compared to conventional display devices. For example, in some embodiments, the display may operate at refresh rates as low as 20 Hz with no noticeable visual artifacts. Such a low refresh rate may be well suited, for example, for displaying relatively static content such as text in electronic books.

The present IGZO TFT device implementation may also reduce issues surrounding light absorption found in conventional display devices. The materials used in conventional TFTs in display devices have a relatively large bandgap meaning that they may absorb light and convert that light into an electrical charge. In other words, the conventional materials may operate as a light detector, generating a voltage in response to light striking the materials. The generated voltage can, in some cases, cause unwanted pixel behavior by mimicking the application of a driving voltage to the pixel or turning on the TFT, which can cause the pixel to open or otherwise modify its brightness. The materials making up the present IGZO TFT design have a bandgap of approximately 3 eV meaning that they are nearly transparent to the visible spectrum of light and do not generate a voltage in response to light striking their surface.

A final difficulty in implementing conventional TFTs in conventional display devices relates to possible errors during fabrication. Because the machines utilized during fabrication may not be perfectly accurate, misalignments between the components of the conventional TFT may occur. To mitigate these misalignments different components of the TFT (such as the gate contact and source and drain contacts) may be to substantially overlap one another to ensure that in the event of misalignment, the TFT will still function. In other words, the overlap is relied upon to provide a sufficient margin of error should the fabrication machines misplace one of the components of the TFT. But, as the amount of overlap increases (i.e., the overlap of the gate contact and source and drain contacts), the parasitic capacitances of the TFT increase (and, particularly the gate-source and gate-drain parasitic capacitances), reducing the TFT's performance. The present IGZO TFT design relies upon a self-aligning architecture that can reduce the likelihood of misalignment and, therefore, reduce the need for significant overlap of the gate region and source and drain regions, reducing IGZO TFT's parasitic capacitances.

FIGS. 4A-4I show top views depicting the steps in a fabrication process for device 50, wherein device 50 includes a bottom-contact-top gate TFT fabricated using self-aligning IGZO materials. In this example, device 50 may include an electrowetting pixel, in which case device 50 may be incorporated into an electrowetting display device, as described herein. Accordingly, the various interconnect structures of many devices 50, such as source contact region 410 and drain contact region 412 (shown in FIG. 4B) and gate electrode 430 (shown in FIG. 4E) may be electrically connected in a manner enabling active matrix control of the state of many pixels in a display device, where each pixel may be fabricated in the manner illustrated in FIGS. 4A-4I.

In FIG. 4A, a buffer layer 400 is provided. In various embodiments, buffer layer 400 may be formed over a suitable substrate, such as bottom support plate 104 depicted in FIGS. 1A and 1B. Generally, the buffer layer 400 may include materials like $SiO_2$ or $Al_2O_3$. A combination of SiN and $SiO_2$ may also be used to deposit the buffer layer 400. Buffer layer 400 can provide insulation for the one or more components formed over buffer layer 400. For example, buffer layer 400 can isolate the TFT formed over buffer layer 400 from ambient conditions (e.g., voltages or currents present within bottom support plate 104) which might lead to higher leakage current or otherwise interfere with the operation of the IGZO TFT. Thus, the buffer layer 400 may reduce the leakage current that flows from the TFT to ground through the buffer layer 400, especially during the OFF state of the TFT. As depicted in FIG. 5J, the buffer layer 400 is at the bottom of the pixel 40 in the cross sectional view.

Figure 4B:
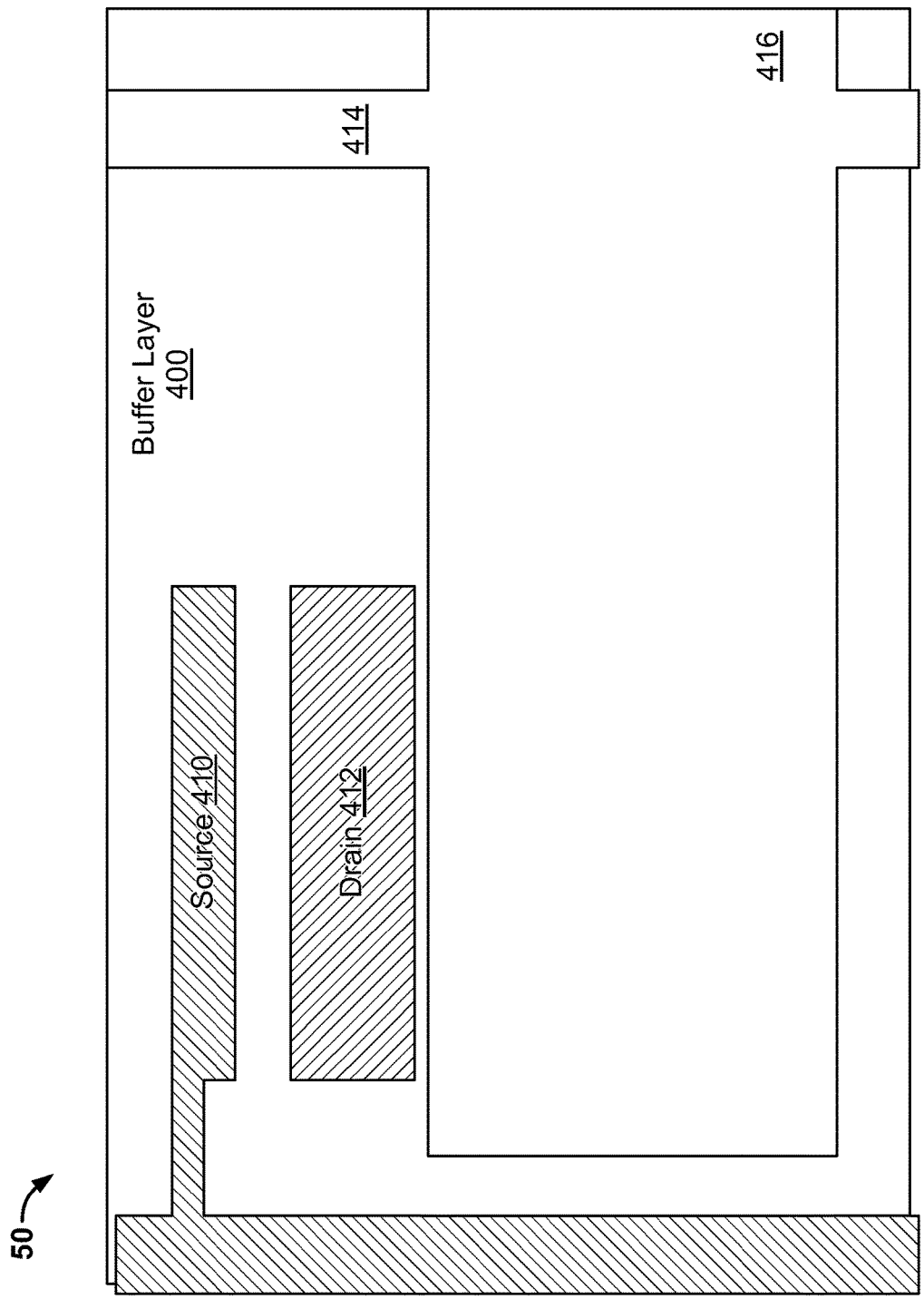
FIG. 4B illustrates a top view of a display device after a second processing step of forming source and drain contacts.

With the buffer layer 400 provided, in FIG. 4B, a source contact region 410 and a drain contact region 412 are fabricated on the buffer layer 400 using patterned metal including at least one of Molybdenum Chromium (MoCr) and Molybdenum (Mo). A common connector 414 may also be fabricated using the same metal material. The common connector 414 may be used to connect a common voltage to a common electrode of the pixel. A storage capacitor bottom electrode 416 may be fabricated while fabricating the source and drain contact regions 410 and 412. The source contact region 410, drain contact region 412, common connector 414, and bottom electrode 416 may be formed over buffer layer 400 initially as a single layer of conductive (e.g., metal) material, with the metal layer then being patterned to form the various structures depicted in FIG. 4B.

Figure 4C:
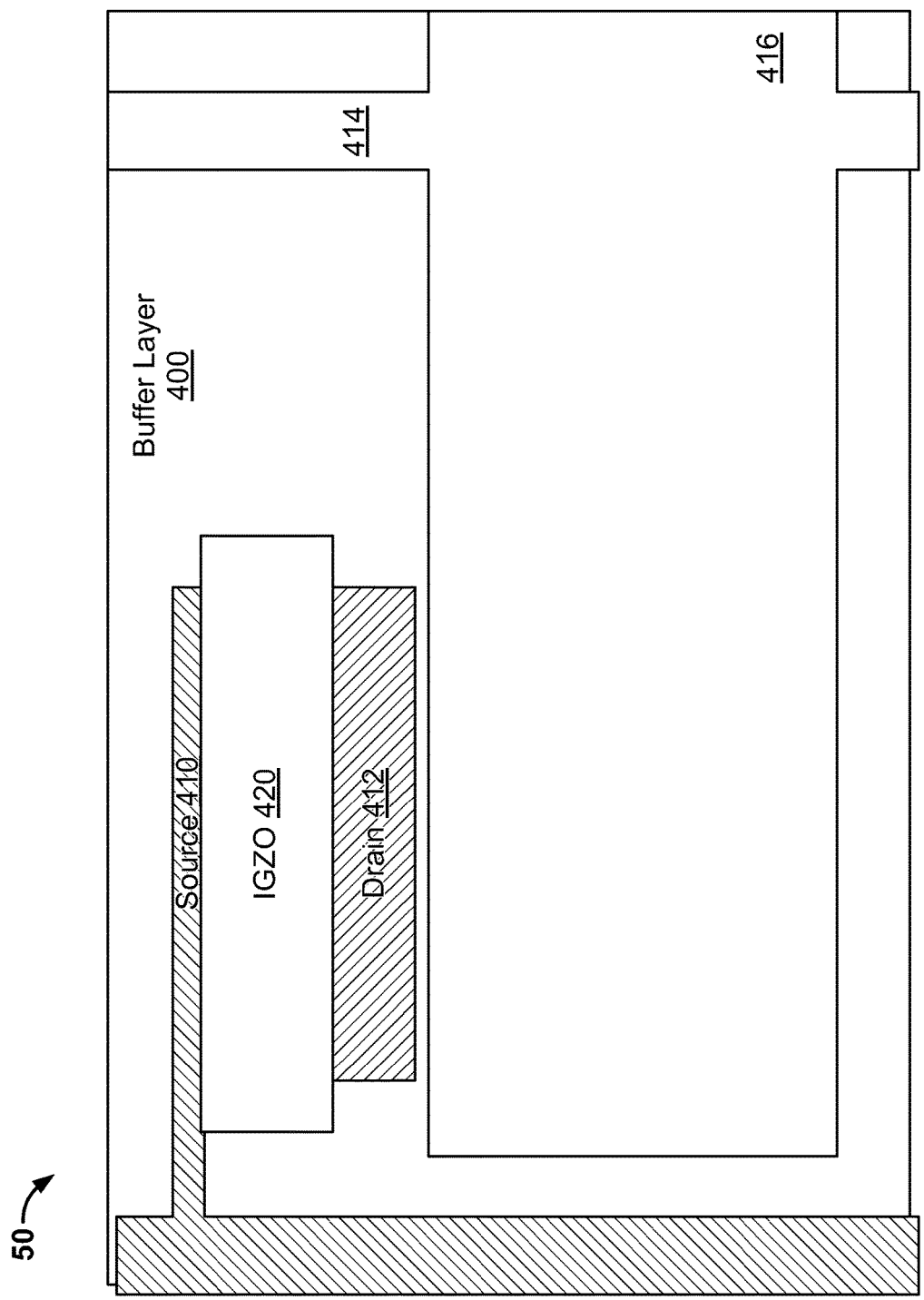
FIG. 4C illustrates a top view of a display device after a third processing step of patterning an IGZO layer.
Figure 5A:
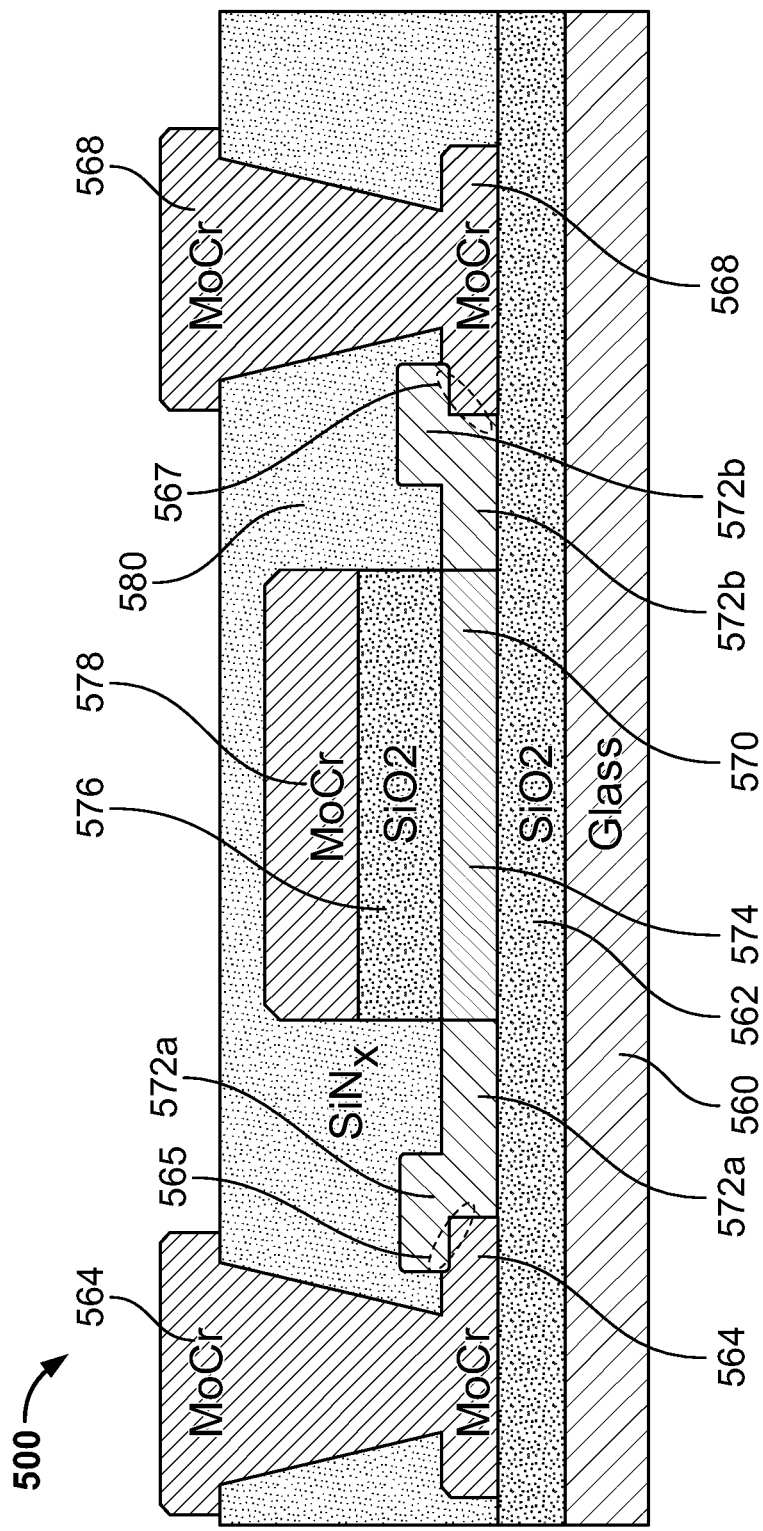
FIG. 5A depicts a cross-section view of a bottom contact top gate IGZO TFT architecture according to one or more embodiments of the present disclosure.

In FIG. 4C, a semiconducting island 420 is fabricated at least partially on the source contact region 410 and the drain contact region 412. As illustrated in FIG. 5A, the semiconductor island 420 fills the gap between the source contact region 410 and the drain contact region 412. The semiconductor island 420 also extends over both the source contact region 410 and the drain contact region 412 and overlaps with those regions. The semiconducting island 420 may include a layer of IGZO as semiconductor material, which may have a thickness between 10 nm to 15 nm. For example, the IGZO may be patterned using wet-etching that uses liquid chemicals or etchants to remove materials from a wafer. For example, the wet-etching may use oxalic acid or other etchants including at least one of: acetic acid, citric acid, hydrochloric acid, perchloric acid, and aqua ammonia. The IGZO patterning may use other wet-based processing techniques such as selective wetting, gravure printing, flexography, and inkjet printing.

In the wet etching process, the IGZO material may be removed by the etchants, with the specific pattern of the IGZO being at least partially determined by masks on or over device 50. In that case, materials that are not protected by the masks are etched away by liquid chemicals. These masks are deposited and patterned on the wafers in a prior fabrication step using lithography. Following mask formation, the wet etching process may involve the application of multiple chemical reactions that consume the original reactants and produce new reactants. For example, the wet etch process may include three basic steps. (1) Diffusion of the liquid etchant to the structure that is to be removed. (2) The reaction between the liquid etchant and the material being etched away. A reduction-oxidation (redox) reaction usually occurs. This reaction entails the oxidation of the material then dissolving the oxidized material. (3) Diffusion of the byproducts in the reaction from the reacted surface.

Alternatively, the IGZO may be patterned using dry etching techniques such as physical dry etching, chemical dry etching, and physical-chemical etching. In dry etching, plasmas or etchant gasses are used to remove the substrate material. The reaction that takes place can be done utilizing high kinetic energy of particle beams, chemical reaction, or a combination of both. Physical dry etching generally requires high energy kinetic energy (ion, electron, or photon) beams to etch off the substrate atoms. When the high energy particles knock out the atoms from the substrate surface, the material evaporates after leaving the substrate. No chemical reaction takes place and therefore only the material that is unmasked will be removed. Chemical dry etching may not use liquid chemicals or etchants. Instead, this process may involve a chemical reaction between etchant gases to attack or modify silicon surfaces. The chemical dry etching process is usually isotropic and exhibits high selectively. Anisotropic dry etching has the ability to etch with finer resolution and higher aspect ratio than isotropic etching. Another form of etching that may be utilized for form semiconducting island 402 may include reactive ion etching (RIE). RIE uses both physical and chemical mechanisms to achieve high levels of resolution. Because the process combines both physical and chemical interactions, the process can be faster than other approaches for etching.

Figure 4D:
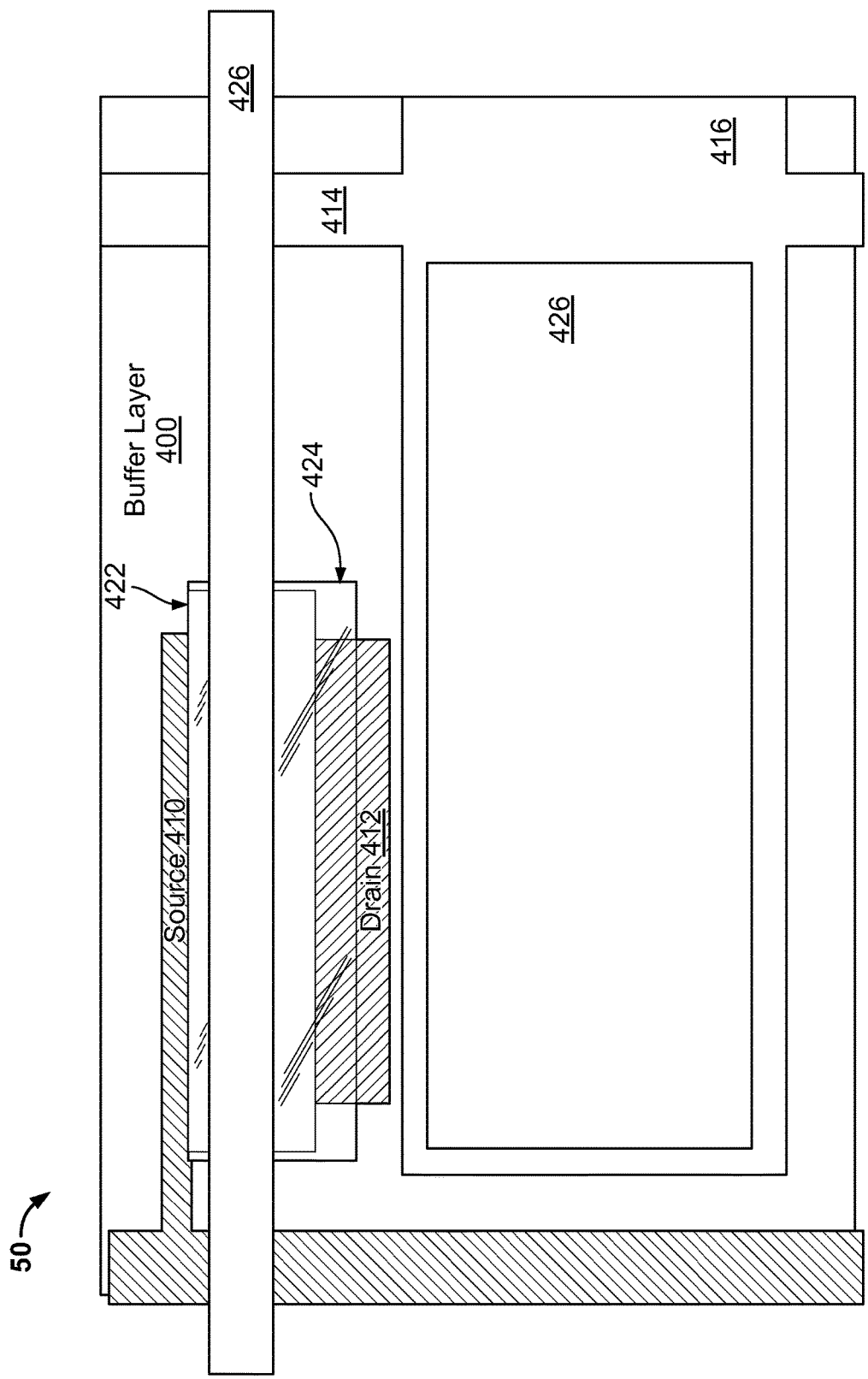
FIG. 4D illustrates a top view of a display device after a fourth processing step of depositing an insulation layer and forming contact regions in the insulation layer.

In FIG. 4D, dielectric layer 426 is formed over device 50. Dielectric layer 426 is patterned to include windows or open regions 422 and 424. As illustrated, open regions 422 and 424 at least partially overlap portions of the semiconducting island 420 and enable layers of material formed over dielectric layer 426 to come into contact with the portions of device 50 directly underlying open regions 422 and 424. For example, open regions 422 and 424 expose portions of semiconducting island 420 located underneath open regions 422 and 424, source contact region 410 and drain contact region 412, respectively. The dielectric layer 426 may have a thickness of a few hundred nanometers.

Figure 4E:
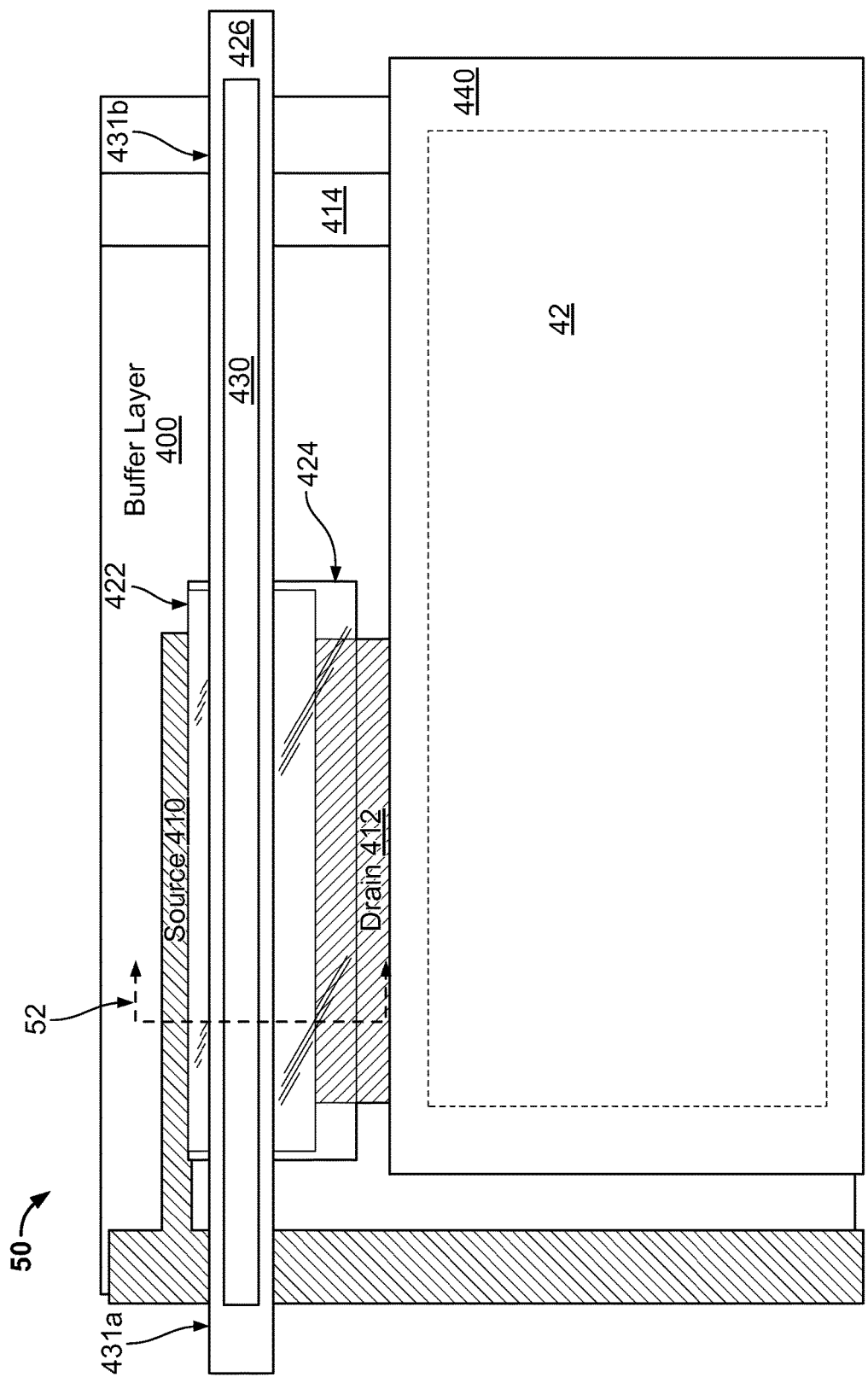
FIG. 4E illustrates a top view of a display device after a fifth processing step of gate metal patterning and forming a reflector metal layer.

In FIG. 4E, gate electrode or gate contact 430 is formed on dielectric layer 426 over the semiconducting island 420. The gate electrode 430 may include metal such as MoCr, Cr, Mo, Aluminum (Al), and etc. Dielectric layer 426 may extend between gate electrode 430 and source contact region 410 at cross over point 431a. Dielectric layer 426 may also extend between gate electrode 430 and common connector 414 at cross over point 431b. As seen in FIG. 4E, in this arrangement, the gate structure including gate electrode 430 overlays a portion of semiconducting island 420. As such, gate electrode 430 can act as a hard mask to shield the region of the semiconducting island 420 directly beneath gate electrode 430. Additionally, gate electrode 430 does not overlap with any portion of source contact region 410 or drain contact region 412. This lack of overlap may reduce the parasitic capacitances in the TFT including gate electrode 430, source contact region 410, and drain contact region 412.

FIG. 4E also shows a reflector 440 that is formed on the pixel region 42 over dielectric layer 426. The reflector 440 may include but is not limited to materials comprised of reflective metals, multi-layer inorganic or organic dielectric mirrors, white diffuse materials, refractive materials, prismatic materials, or combinations thereof. For example, the reflector 440 may include MoCr. Additionally, the reflector 440 may include color material so that the reflector can act as a color filter. Alternatively, a color filter layer may be formed over the reflector. The reflector 440 may have a thickness generally within, but not limited to, the range of 0.05 μm to 1 μm.

Figure 4F:
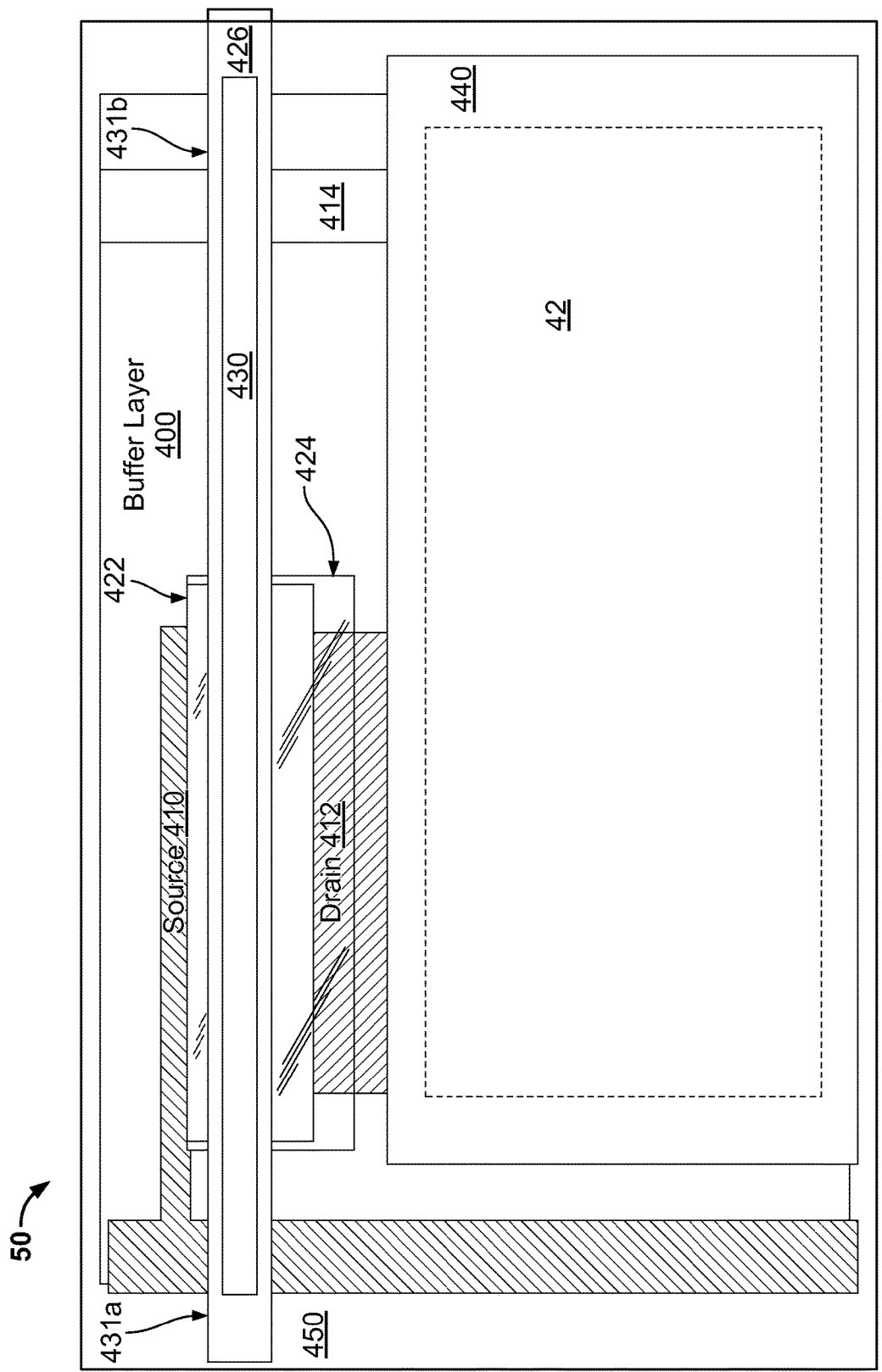
FIG. 4F illustrates a top view of a display device after a sixth processing step of depositing a SiNx layer and doping the IGZO layer.

FIG. 4F shows that a silicon nitride (SiNx) layer 450 is deposited on the complete region of device 50 including the source contact region 410, the drain contact region 412, the buffer layer 400, the gate electrode 430, and the reflector 440. The SiNx layer 450 is deposited to provide dopants for the source contact region 410 and drain contact region 412.

When SiNx layer 450 is deposited over device 50, portions of SiNx layer 450 pass through the gaps formed by open regions 422 and 424 in dielectric layer 426 to the underlying semiconducting island 420 including the IGZO material. The regions of IGZO in semiconducting island 420 that are contacted by SiNx layer 450 become conductive when they come into contact with SiNx. That is, SiNx layer 450 dopes the exposed portions or regions of semiconducting island 420 to make those portions or regions conductive. Thus, the deposition of SiNx layer 450 forms first and second doped regions (see elements 451 and 453 in the cross-sectional view of FIG. 5J) within semiconducting island 420. Doped region 451 corresponds to a source contact and is connected to source contact region 410. Doped region 453 corresponds to a drain contact and is connected to drain contact region 412. The portion of the semiconducting island 420 underneath gate electrode 430 is not exposed to the SiNx layer 450 (gate electrode 430 forms a mask for that region) and, as such, doped regions 451 and 453 are separated from one another by a portion of undoped 455 and non-conductive semiconducting island 420 (see element 455 in the cross-sectional view of FIG. 5J). In this manner, the position of doped regions 451 and 453 with respect to gate electrode 430 are determined by the position of gate electrode 430 itself. This approach is referred to as self-alignment—in this example, gate electrode 430 is considered to be self-aligned.

The distinguishing feature of the self-alignment processing method is that the method relies on a previously patterned device layer as a mask to pattern one or more subsequent device layers. This is in contrast to a standard photolithographic process where patterns are transferred from a rigid glass mask to the top device layer on the substrate. Thus, the previously patterned device layer (such as the gate layer) blocks UV light and acts as a mask in self-alignment processes.

The self-aligned architecture allows for more precise placement of the doped regions 451 and 453 regions in semiconducting island 420. This increase in accuracy can reduce the need for the gate electrode 430 to overlap with source contact region 410 and drain contact region 412, which could otherwise introduce or increase the parasitic capacitances of the TFT.

The source and drain contact regions 410 and 412 may be doped n-type during over-etch of the gate dielectric with SiH4/NH3/H2 plasma. This process causes surface modification and hydrogen diffusion into the source and drain area (e.g., doped regions 451 and 453) of the semiconducting island 420. Hydrogen diffusion into the IGZO material of semiconducting island 420 may reduce the resistivity of the exposed portions of the IGZO material because Hydrogen acts as an n-type dopant for regions 451 and 453 in the semiconducting island 420.

In one embodiment, the deposition of SiNx layer 450 may take place according to the following parameters: radio frequency (RF) power at 500 W to 1500 W, a SiH4 at 5 sccm to 50 sccm, a NH3 at 500 sccm to 2000 sccm, a H2 at 500 sccm to 2000 sccm, a pressure at 500 mT to 2000 mT, at a substrate temperature at 200 Celsius to 300 Celsius, and a measured reflective index (RI) of the SiNx layer at 1.6 to 1.9. When the mixture of the gas is dissolved on the substrate, lots of hydrogen is generated in the plasma. When excess hydrogen are generated at surface, the hydrogen actually diffuses into IGZO material. The diffusion of hydrogen in this particular case with deposition of SiN with the above settings, results in conductive IGZO. The resistance of doped IGZO may go below 1K Ohms to 600 Ohms with the above settings during deposition of SiNx.

In some embodiments, the deposition of SiNx layer 450 may be combined with the formation of a multi-barrier layer over device 50 when the barrier layer consists of SiN/Pl/SiN/Pl. Such a four-layer structure may have a better passivation quality compared to a two-layer structure.

In this arrangement, when a sufficiently high voltage is applied to gate electrode 430, the undoped region 455 of semiconducting island 420 underneath gate electrode 430 becomes conductive. This allows current to flow from source contact region 410, through the doped region 451 of the semiconducting island 420, the undoped region of semiconducting island 420, and the doped region 453 of semiconducting island 420 to drain contact region 412. When gate electrode 430 is not subject to a sufficiently high voltage, the non-doped region of semiconducting island 420 is not conductive and current cannot flow from source contact region 410 to drain contact region 412.

Accordingly, the combination of the partially doped semiconducting island 420 with the source contact region 410, drain contact region 412, and gate electrode 430 operates as an IGZO TFT that may be used to control a pixel's state. Specifically, gate electrode 430 may be utilized to control the application of a driving voltage to a pixel associated with the IGZO TFT as described herein.

Figure 4G:
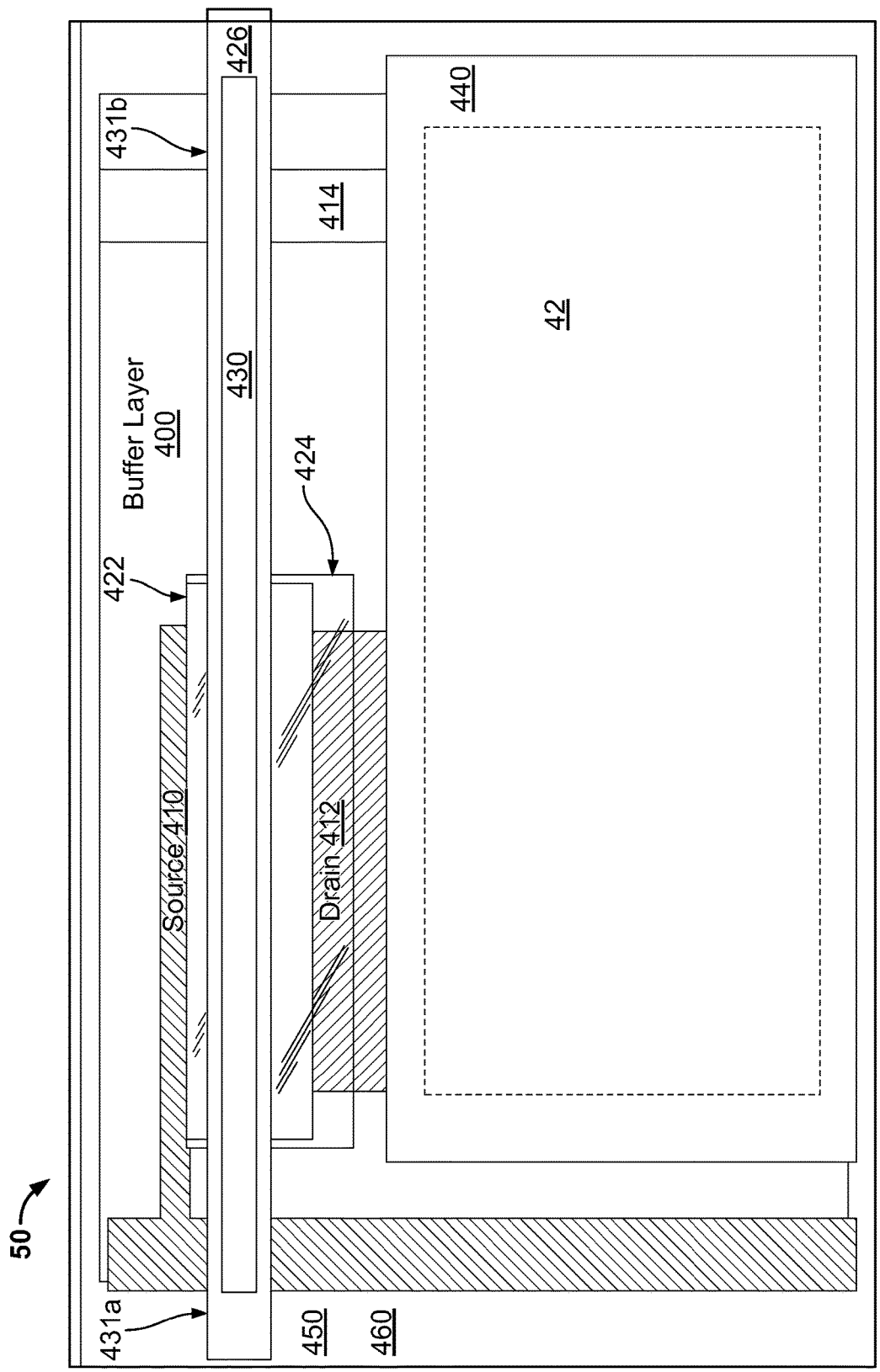
FIG. 4G illustrates a top view of a display device after a seventh processing step of depositing a barrier layer.

FIG. 4G shows that a barrier layer 460 is deposited on top of the SiNx layer 450. The barrier layer deposition may be a blanket deposition done by patch coater. The barrier layer 460 may be formed from various materials including organic/inorganic multilayer stacks or layers. The barrier layer 460 may prevent electro-chemical reactions (e.g., electrolysis) between the reflector 440 and an electrolyte fluid, such as the second fluid 114 depicted in FIG. 1A. For example, the barrier layer may include one or more layers of Silicon Dioxide ($SiO_2$).

Figure 4H:
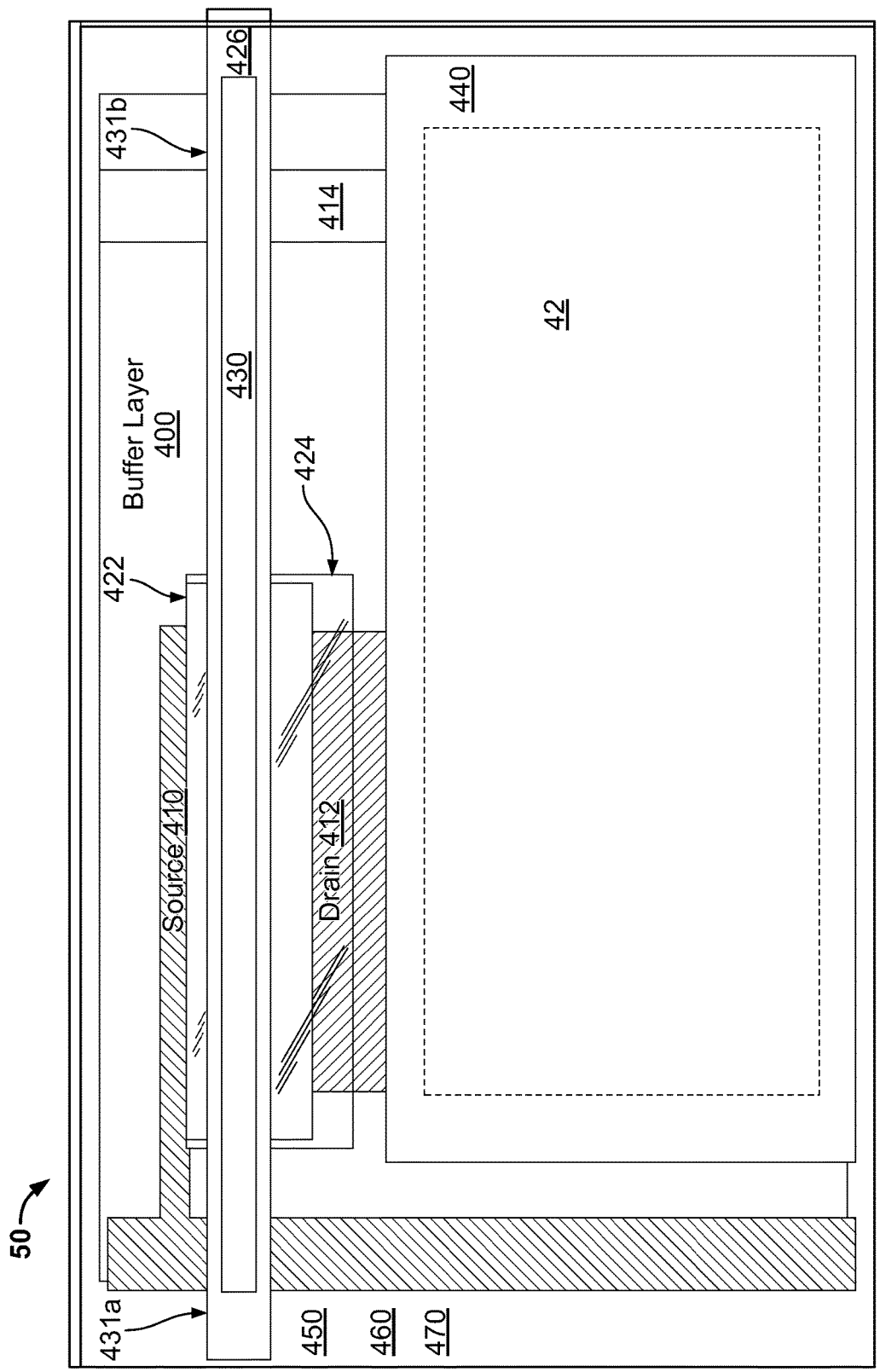
FIG. 4H illustrates a top view of a display device after an eighth processing step of depositing a fluoropolymer (FP) layer.

FIG. 4H shows that a fluoropolymer (FP) layer 470 is formed on top of the barrier layer 460. The deposition process may be a blanket deposition of fluoropolymer on top of the barrier layer. First, a gas phase fluoromonomer and a gas phase free radical polymerization initiator may be delivered on top of the barrier layer 460. Second, the gas phase fluoromonomer and the gas phase free radical polymerization initiator may be mixed to form a gas phase mixture to be contacted to the barrier layer 460. Finally, the polymerization of the fluoromonomer with the free radical polymerization initiator may be initiated to form the fluoropolymer layer 470 on the barrier layer 460.

Figure 4I:
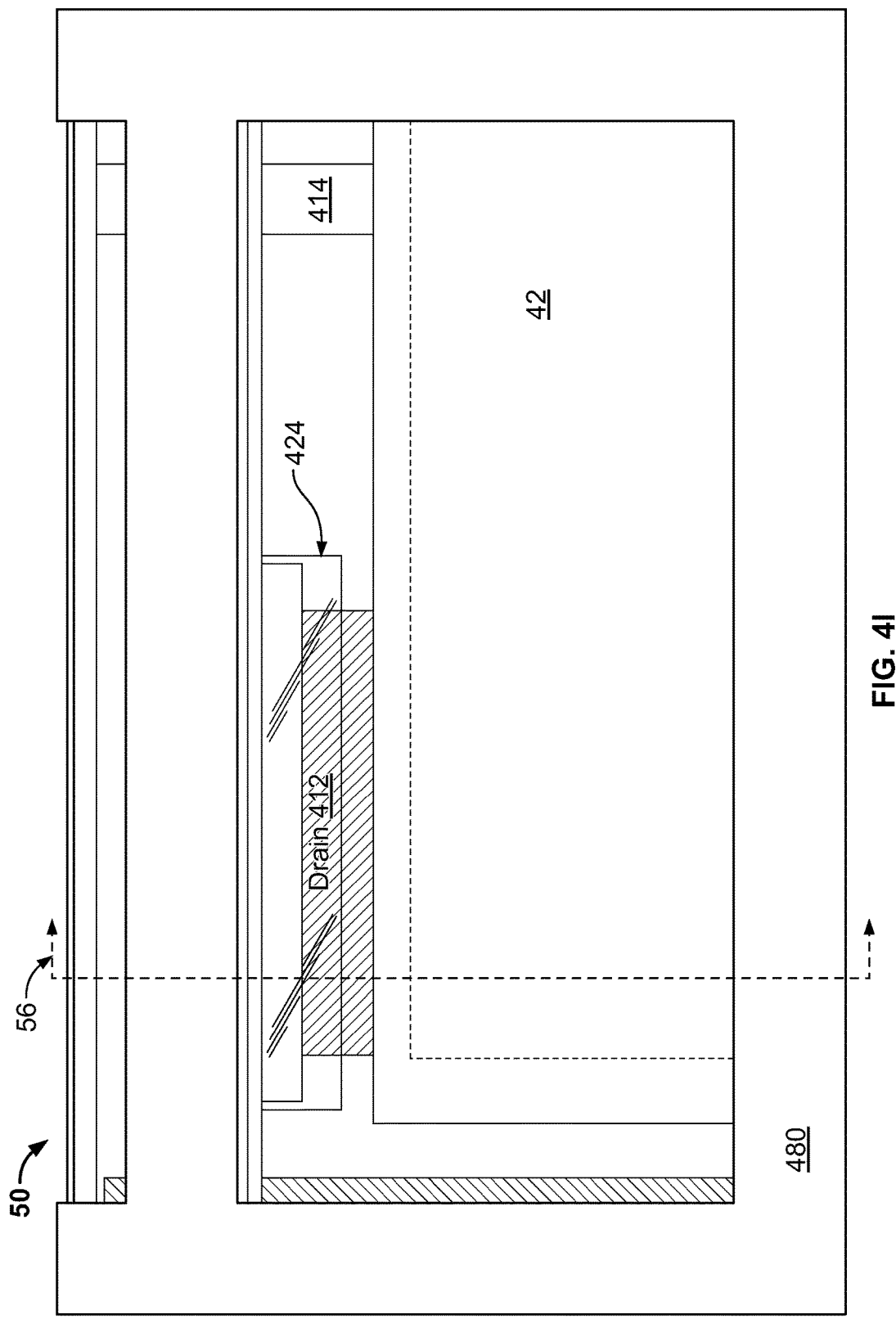
FIG. 4I illustrates a top view of a display device after a ninth processing step of patterning a pixel wall.

As illustrated in FIG. 4I, a pixel wall 480 is formed on top of the FP layer 470. The pixel wall 480 forms a structure that is configured to contain at least a portion of a first fluid, such as a black opaque oil. The pixel wall 480 may include pixel wall material such as a photoresist material that is deposited onto the hydrophobic FP layer 470. Due to the hydrophobicity of the material in the FP layer 470, the pixel wall material will normally not adhere to the FP layer 470. The fabricating process may modify the FP layer 470 making at least a portion of FP layer 470 hydrophilic. Such a surface modification can be performed using, for example, reactive ion etching (RIE) or plasma etching or UV Ozone treatment. Accordingly, the pixel material will adhere to the modified FP layer so that the pixel wall 480 can be processed. After deposition of the pixel wall material, however, the hydrophilic property of the modified FP layer is no longer desirable. Thus, the hydrophobic property of the modified FP layer may need to be restored, which may be accomplished using thermal reflow at elevated temperatures.

Further, pixel walls of the display area may include structural features to mitigate stress that can lead to pixel wall and pixel deformation. In particular, pixel walls can include structural features or portions configured to reduce the impact of sheer stress between pixel wall material and an underlying hydrophobic layer on the position of the array of pixels. For example, such structural features can be introduced in the fabrication process by including particular patterns in a mask used for patterning the photoresist layer. Among possible implementations, such structural features of the pixel walls can include curves, bends, spring-shaped (e.g., serpentine) structures, relatively thin portions, voids, gaps between the outer rim of the pixel display area and the pixel walls, zigzag wall-intersection patterns and angled connections between the pixel walls and the outer rim.

FIG. 5A shows a cross-sectional view of a bottom-contact top-gate IGZO TFT architecture 500 (the view shown in FIG. 5A may be representative, for example, of a cross-sectional view of a portion of device 50 taken along the dashed line 52 in FIG. 4E). The bottom-contact top-gate IGZO TFT architecture 500 may be formed based on processing steps illustrated in FIGS. 4A-4I. The various structures are depicted in FIG. 5A for illustrative purposes and so FIG. 5A and FIG. 4E may not have the same scale. In FIG. 5A, the bottom contact top gate IGZO TFT 500 includes the IGZO island 570 deposited at least partially on the SiO2 layer 562, the source contact region 564, and the drain contact region 568. More specifically, the IGZO island 570 includes an undoped region 574 between the doped regions 572a and 572b. The doped regions 572a and 572b are doped when the SiNx layer is deposited. The IGZO island 570 in FIG. 5A corresponds to the IGZO layer 420 in FIG. 5J.

In FIG. 5A, the bottom contact top gate IGZO TFT 500 includes a substrate 560 at the bottom. The substrate 560 may be a glass substrate. A dielectric layer 562 is deposited on the substrate 560. The dielectric layer 562 may include $SiO_2$ or other dielectric material. A semiconducting layer 570 is deposited on the dielectric layer 562. The semiconducting layer 570 may include doped IGZO regions 572a, 572b and undoped IGZO region 574 between the doped IGZO regions 572a and 572b. Here, the doped IGZO region 572a overlaps with the source contact region 564 so that IGZO region 572a is in contact with both a side surface of source contact region 564 as well as a portion of the top surface of source contact region 564. The doped IGZO region 572b overlaps with the drain contact region 568 so that IGZO region 572b is in contact with both a side surface of drain contact region 568 as well as a portion of the top surface of drain contact region 568.

The source contact region 564 is deposited on the dielectric layer 562. The source contact region 564 directly contacts the doped IGZO region 572a from a first overlapped surface 565. The drain region 568 is deposited on the first dielectric layer 562 and also directly contacts the doped IGZO region 572b from a second overlapped surface 567. The source region 564 and the drain region 568 may be disposed symmetrically to the central undoped IGZO region 574 of the semiconducting layer 570.

The bottom contact top gate IGZO TFT 500 also includes a gate structure that includes a metal gate electrode 578 on top of the dielectric gate layer 576. The metal gate electrode 578 may include metal such as MoCr. The dielectric gate layer 576 may include $SiO_2$ or other dielectric material.

Figure 5B:
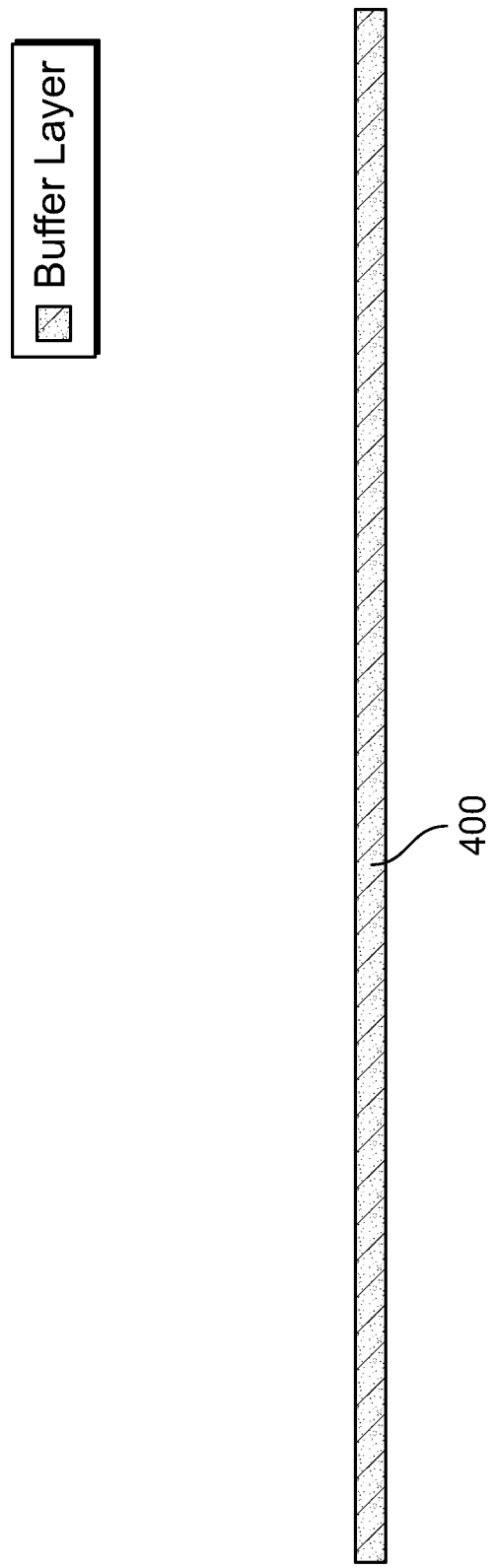
FIGS. 5B-5J illustrate cross-sectional views of a process of fabricating the device of FIG. 4I.
Figure 5C:
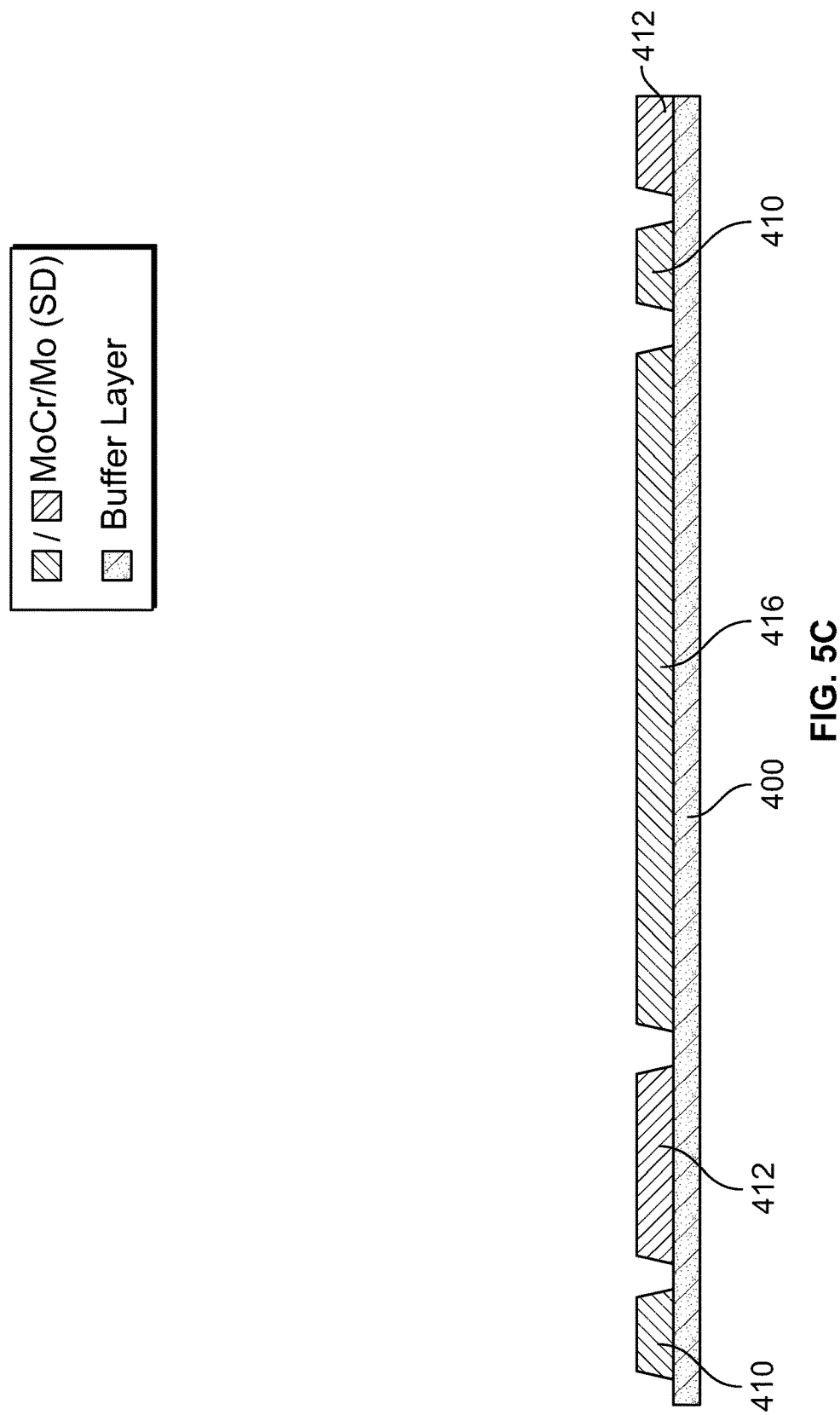
Figure 5D:
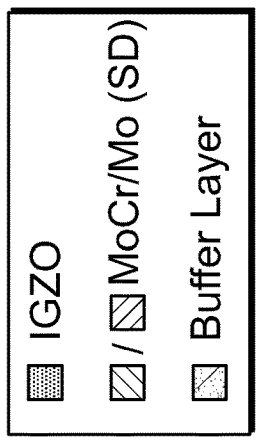
Figure 5D:
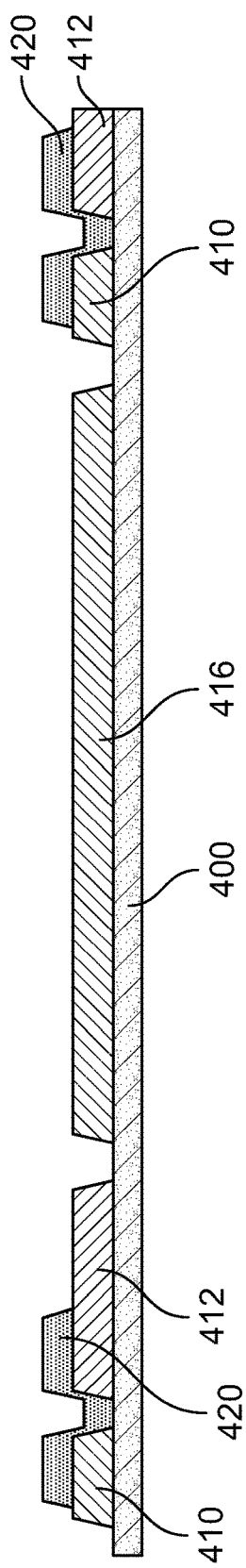
Figure 5E:
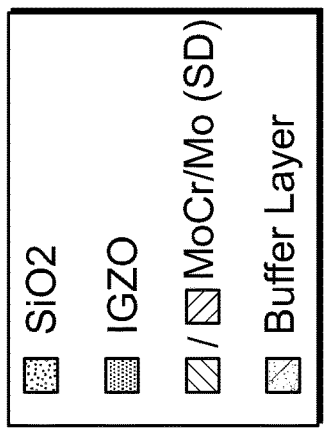
Figure 5E:
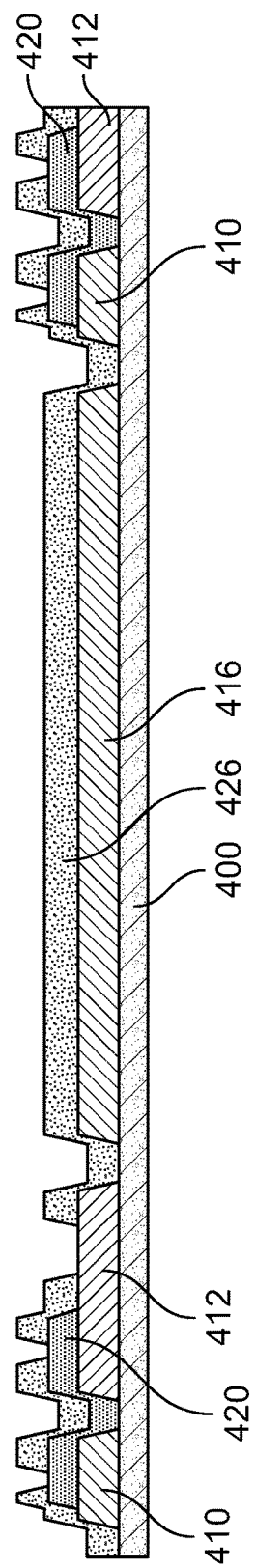
Figure 5F:
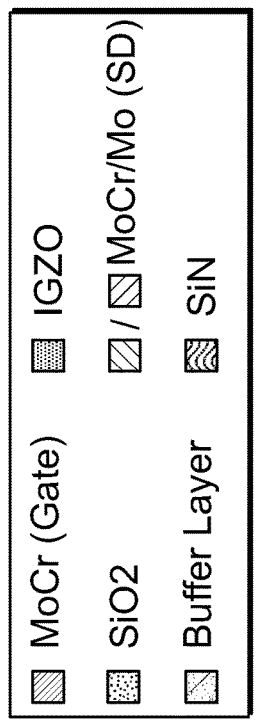
Figure 5F:
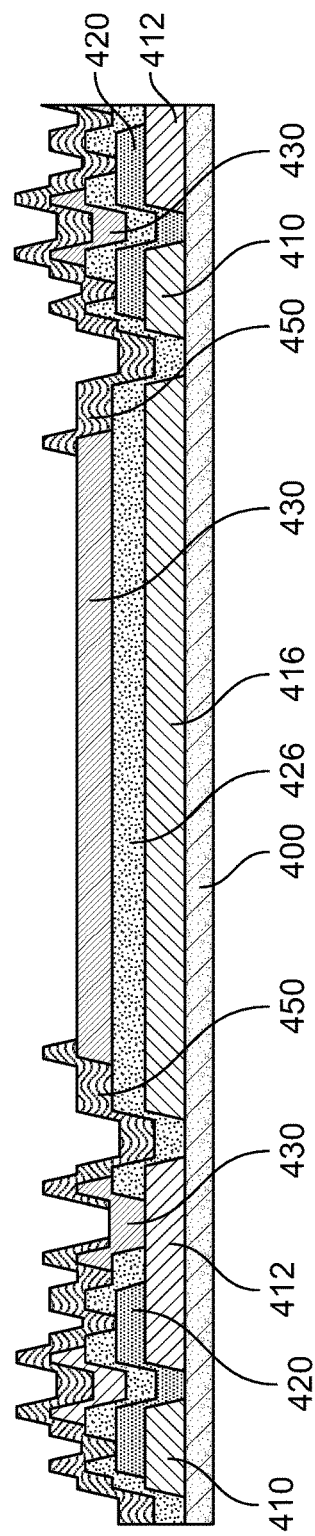
Figure 5G:
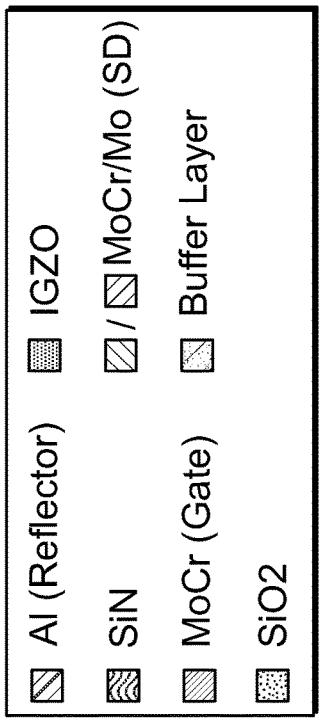
Figure 5G:
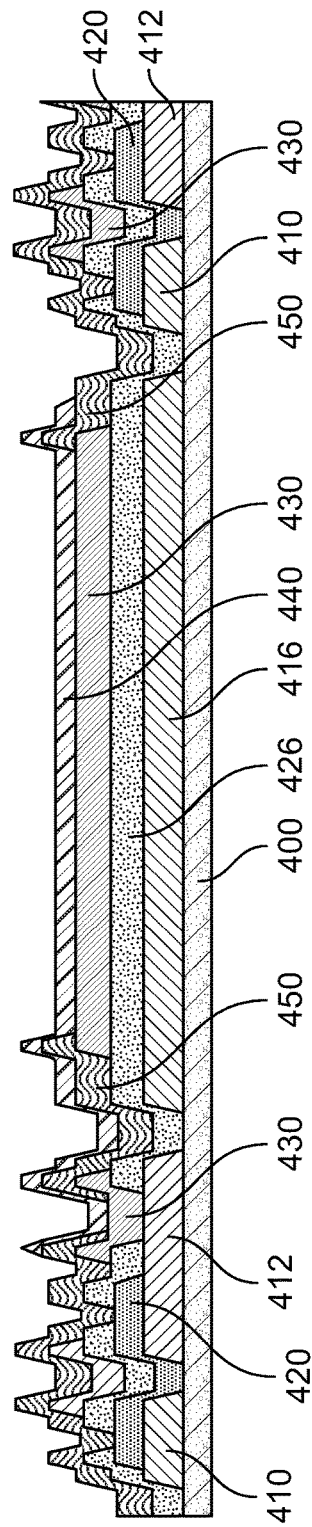
Figure 5H:
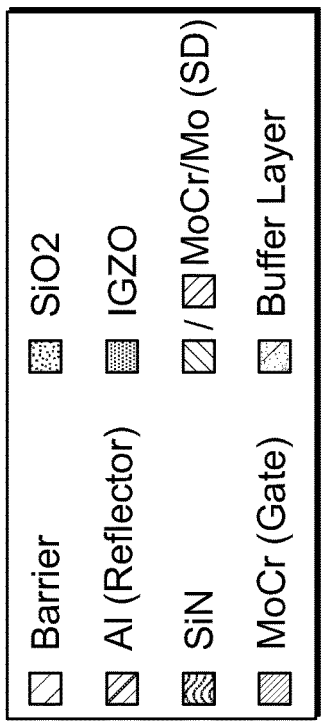
Figure 5H:
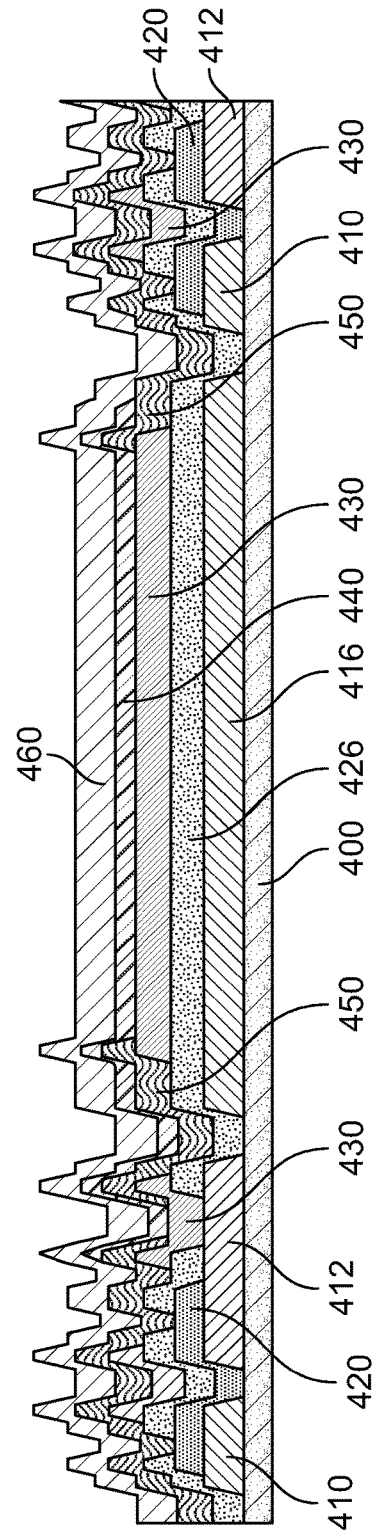
Figure 5I:
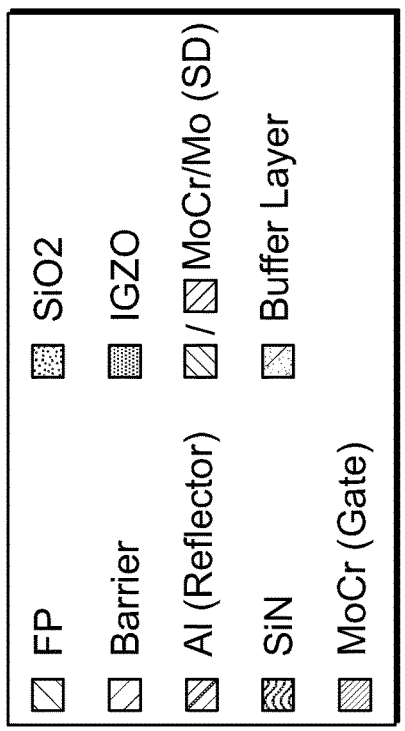
Figure 5I:
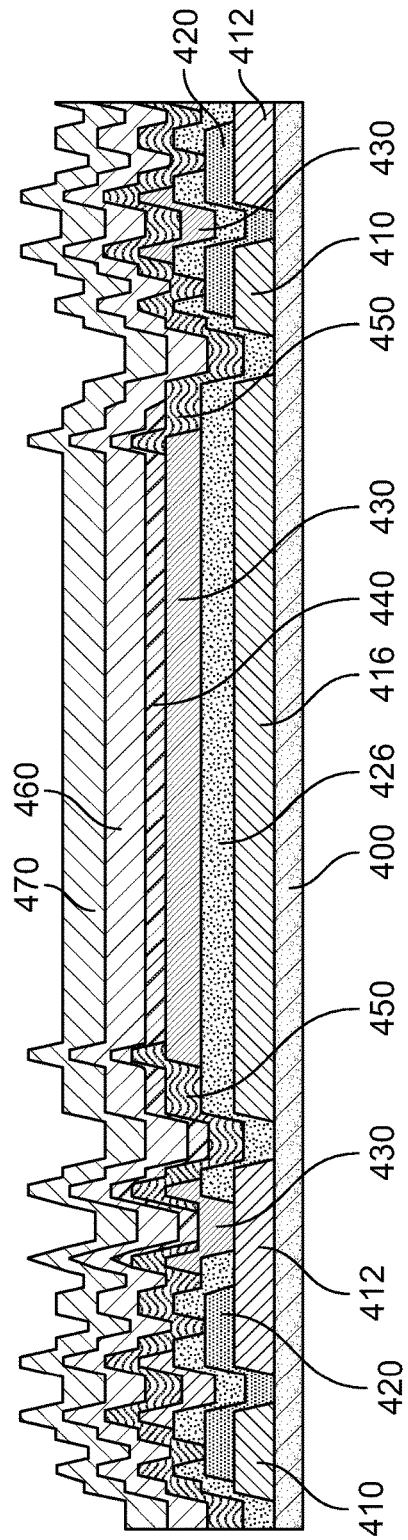
Figure 5J:
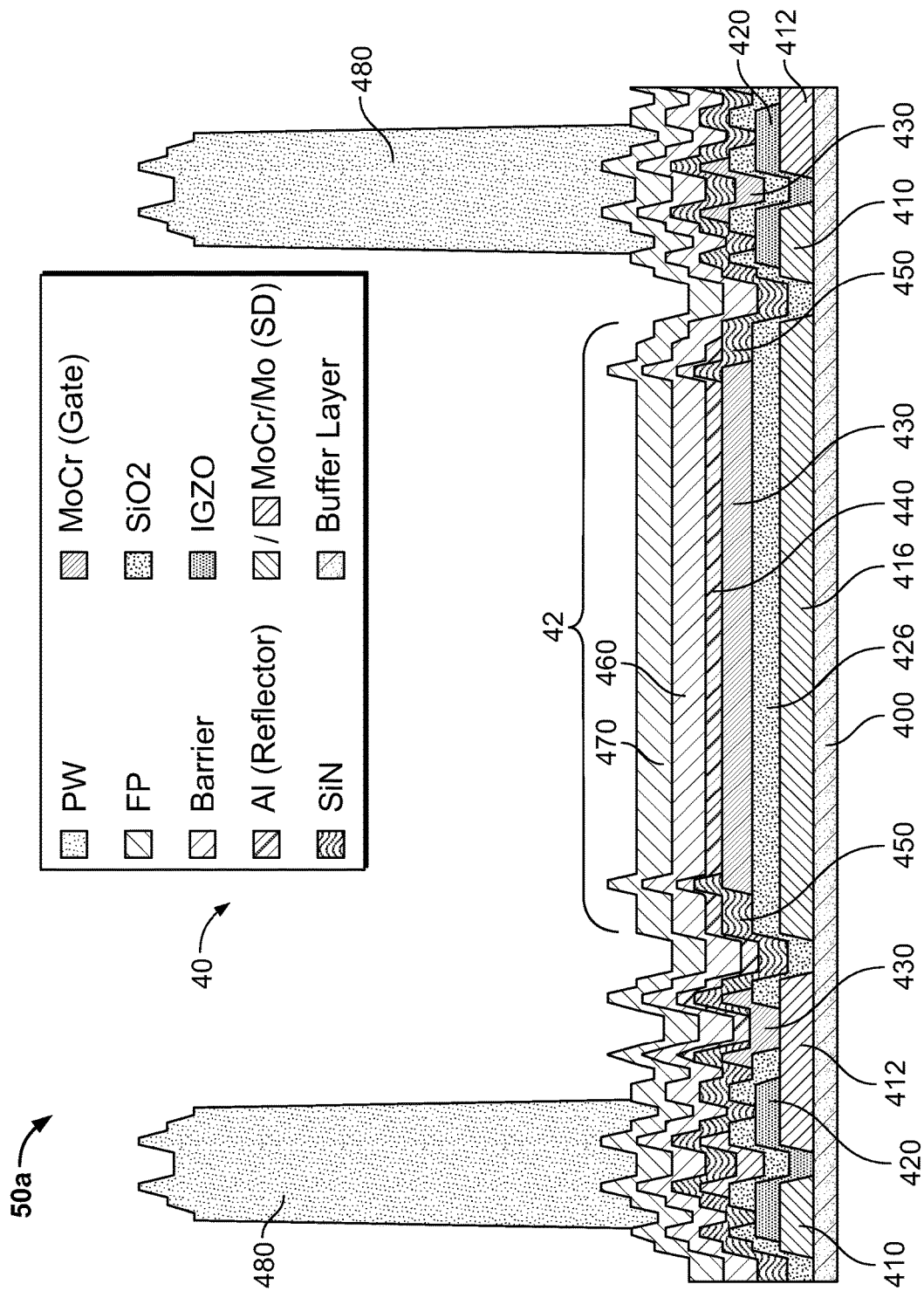

FIGS. 5B-5J illustrate cross-sectional views of a process of fabricating the device of FIG. 4I. FIG. 5B illustrates a cross-section view of a display device after a processing step of buffer layer deposition, which corresponds to FIG. 4A. FIG. 5C illustrates a cross-section view of a display device after a processing step of forming source and drain contacts, which corresponds to FIG. 4B. FIG. 5D illustrates a cross-section view of a display device after a processing step of patterning an IGZO layer, which corresponds to FIG. 4C. FIG. 5E illustrates a cross-section view of a display device after a processing step of depositing an insulation layer and forming contact regions in the insulation layer, which corresponds to FIG. 4D. FIG. 5F illustrates a cross-section view of a display device after a processing step of depositing a SiNx layer and doping the IGZO layer, which corresponds to FIG. 4F. FIG. 5G illustrates a cross-section view of a display device after a processing step of gate metal patterning and forming a reflector metal layer, which corresponds to FIG. 4E. The processing steps in FIG. 4E-4F do not need to follow the specific order. In other words, the SiNx layer may be deposited before forming the reflector metal layer. FIG. 5H illustrates a cross-section view of a display device after a processing step of depositing a barrier layer, which corresponds to FIG. 4G. FIG. 5I illustrates a cross-section view of a display device after a processing step of depositing a fluoropolymer (FP) layer, which corresponds to FIG. 4H. FIG. 5J shows a cross-sectional view of a device along the cross-sectional view plane indicated by the dashed line 56 in FIG. 4I. The device may include a pixel 40 in an electrowetting display using the above processing steps illustrated in FIGS. 4A-4I.

In FIG. 5J, the source contact region 410 and the drain contact region 412 are disposed on the buffer layer 400. The semiconducting island 420 is disposed at least partially on the source contact region 410, the drain contact region 412, and the buffer layer 400. The gate electrode 430 is disposed on the insulation layer 426 disposed on the semiconducting island 420. The same material used for the gate electrode 430 is also deposited on the pixel region 42 between the pixel walls 480.

In FIG. 5J, the SiNx layer 450 is deposited partially on the insulation layer 426 and the gate electrode 430. The SiNx layer 450 also contacts the source contact region 410 and the drain contact region 412 via the contact regions, which may include contact holes. The SiNx layer 450, however, is not deposited in the pixel region 42, which is covered by the reflector 440. Thus, the reflector 440 is disposed directly on the gate material in the pixel region 42. The reflector 440 also partially covers the SiNx layer 450 near the boundaries of the pixel region 42. The barrier layer 460 is deposited directly on the SiNx layer 450 and the reflector 440. The FP layer 470 fully covers the barrier layer 460. The pixel wall 480 is formed on the FP layer 470 so that the oil can be contained in each pixel.

FIGS. 6A-6I shows top views depicting the steps in a fabrication process for device 50a, wherein device 50a includes a top gate top contact TFT fabricated using self-aligning IGZO materials. In this example, device 50a may be an electrowetting pixel, in which case device 50a may be incorporated into an electrowetting display device, as described herein. Accordingly, the various interconnect structures of many devices 50a, such as source contact region 410a and drain contact region 412a (shown in FIG. 6G) and gate electrode 430a (shown in FIG. 6E) may be electrically connected in a manner enabling active matrix control of the state of many pixels in a display device, where each pixel may be fabricated in the manner illustrated in FIGS. 6A-6I.

Figure 6A:
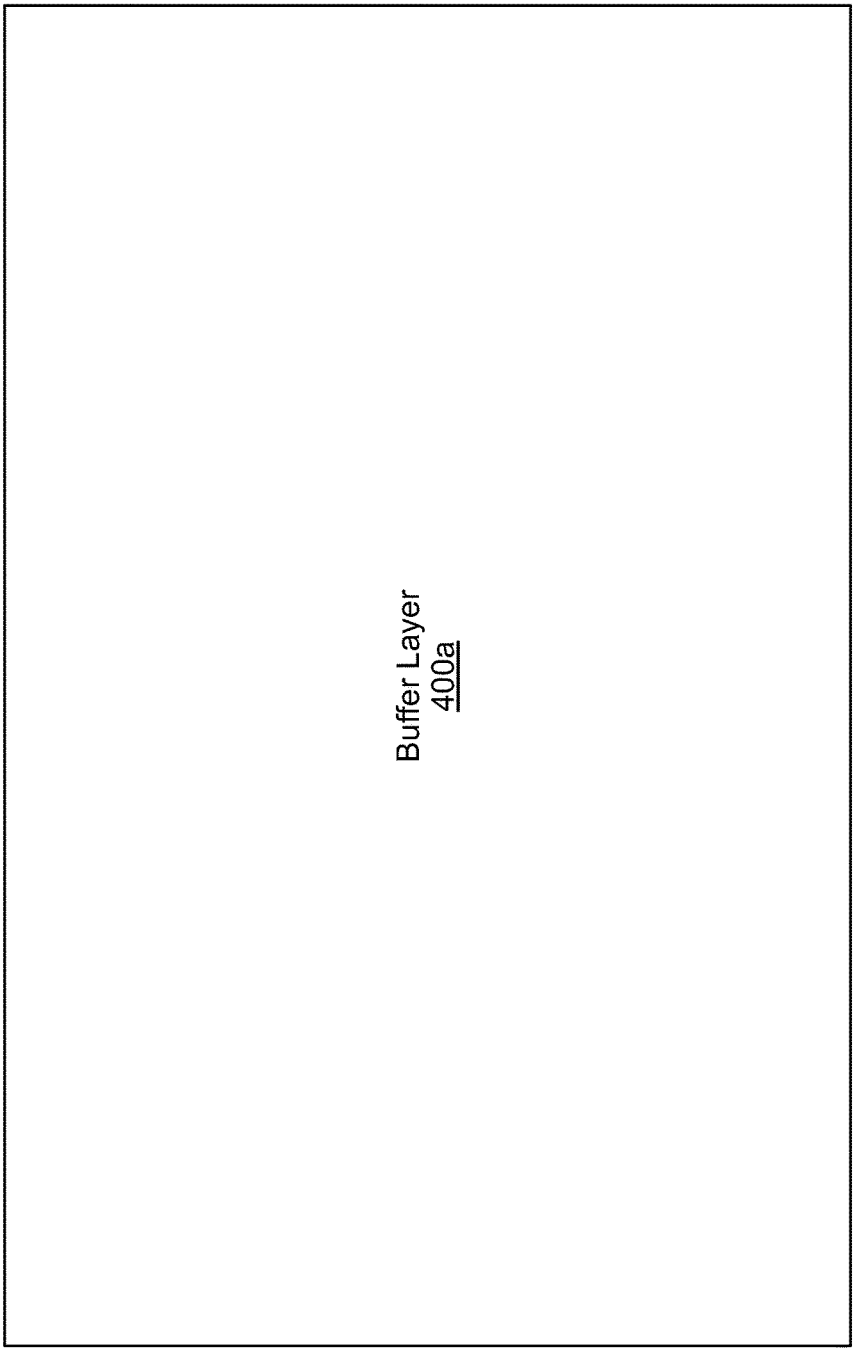
FIG. 6A illustrates a top view of a display device after a first processing step of buffer layer deposition.

In FIG. 6A, a buffer layer a buffer layer 400a is provided. In various embodiments, buffer layer 400a may be formed over a suitable substrate, such as bottom support plate 104 depicted in FIGS. 1A and 1B. Generally, the buffer layer 400a may include materials like $SiO_2$ or $Al_2O_3$ as buffer layer 400 illustrated in FIG. 4A. A combination of SiN and $SiO_2$ may also be used to deposit the buffer layer 400a. Buffer layer 400a can provide insulation for the one or more components formed over buffer layer 400a.

Figure 6B:
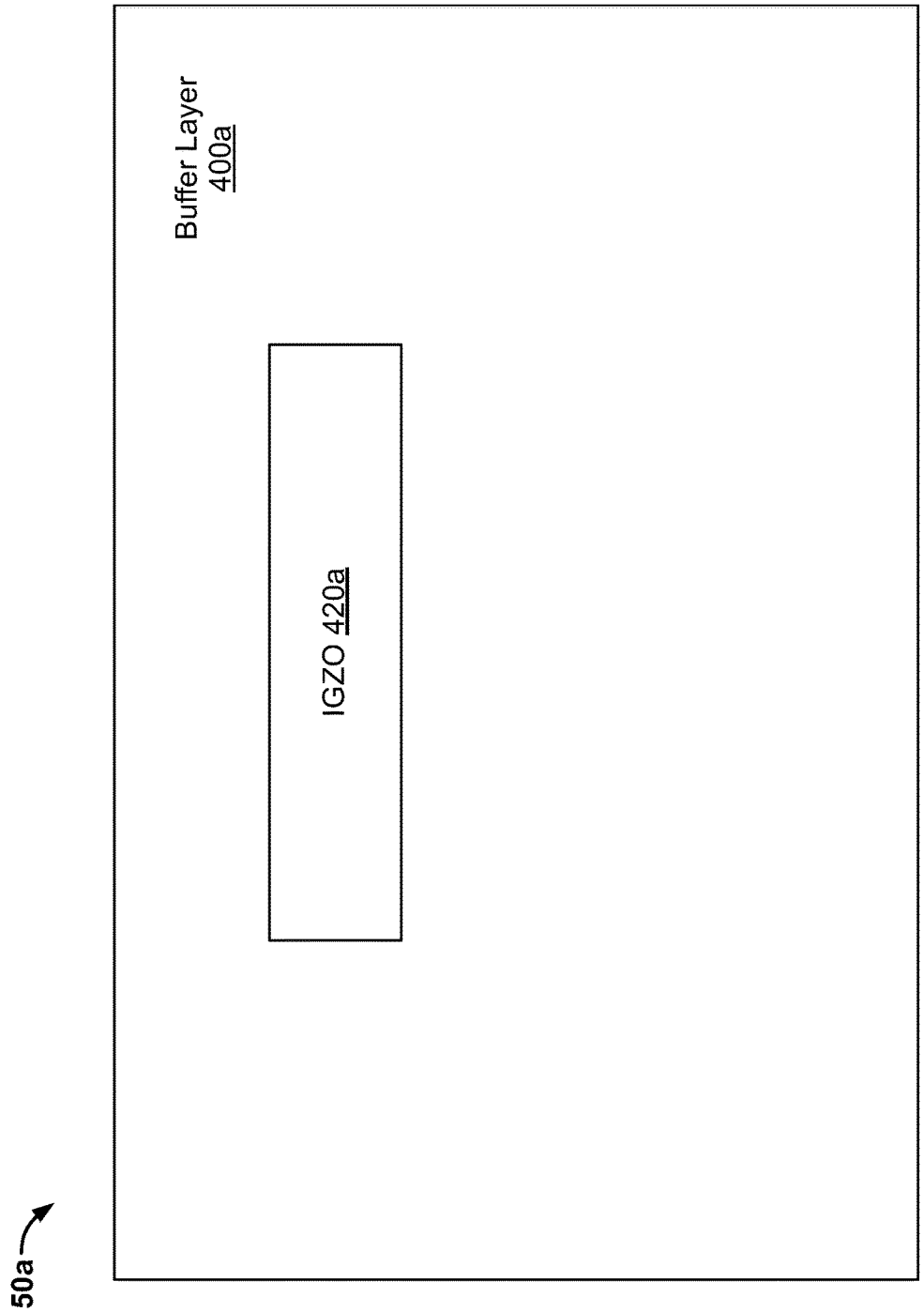
FIG. 6B illustrates a top view of a display device after a second processing step of patterning an IGZO layer.

In FIG. 6B, an IGZO island 420a is patterned on the buffer layer 400a. IGZO island 420a may be formed by wet-etching using oxalic acid. The IGZO island 420a works as semiconducting island for the top gate top contact TFT. Other etching methods may be used to form the IGZO island 420a.

Figure 6C:
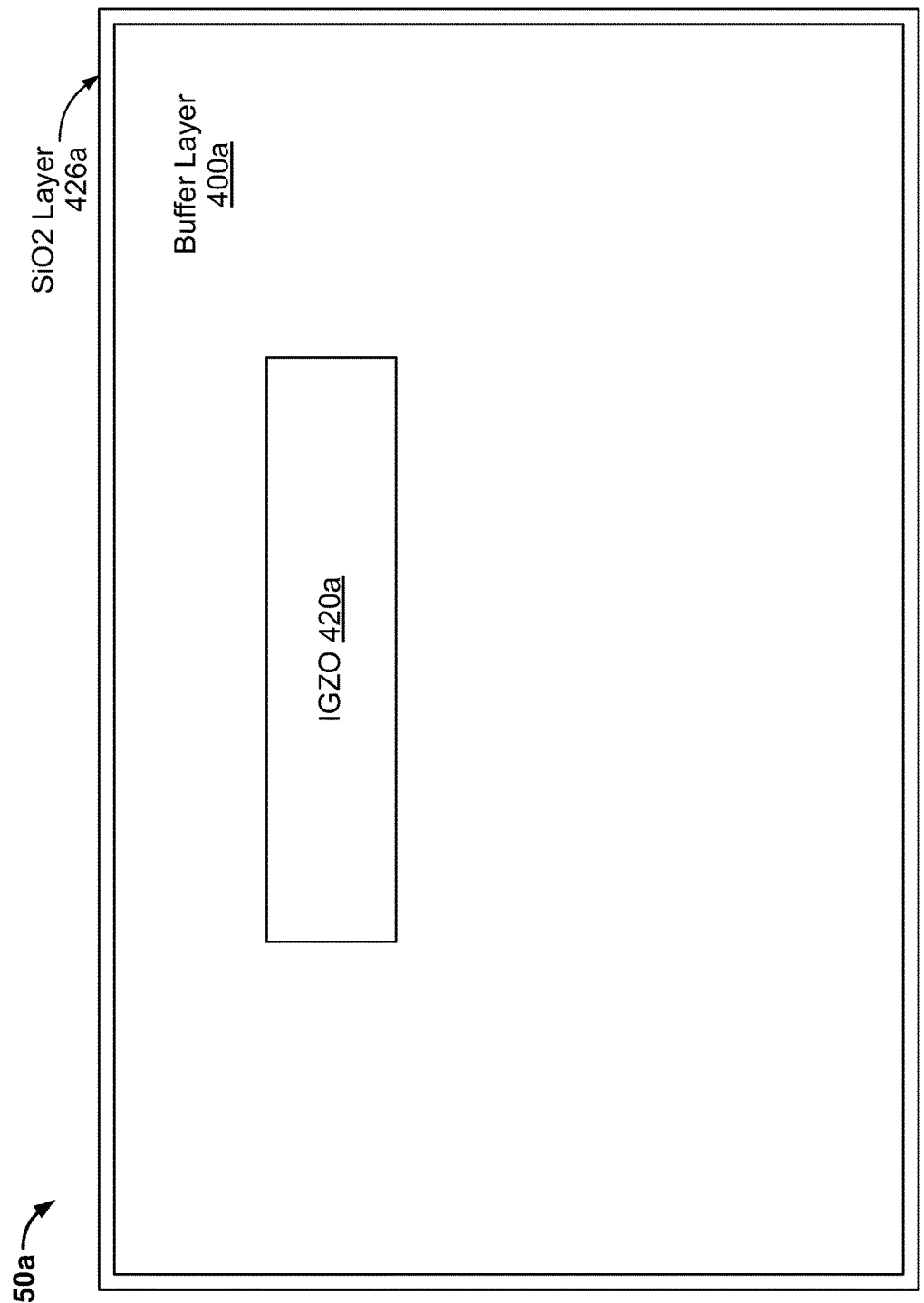
FIG. 6C illustrates a top view of a display device after a third processing step of depositing a gate dielectric layer.

In FIG. 6C, a dielectric layer 426a is formed on device 50a using blanket deposition. For example, the dielectric layer 426a may include $SiO_2$ or other dielectric materials.

Figure 6D:
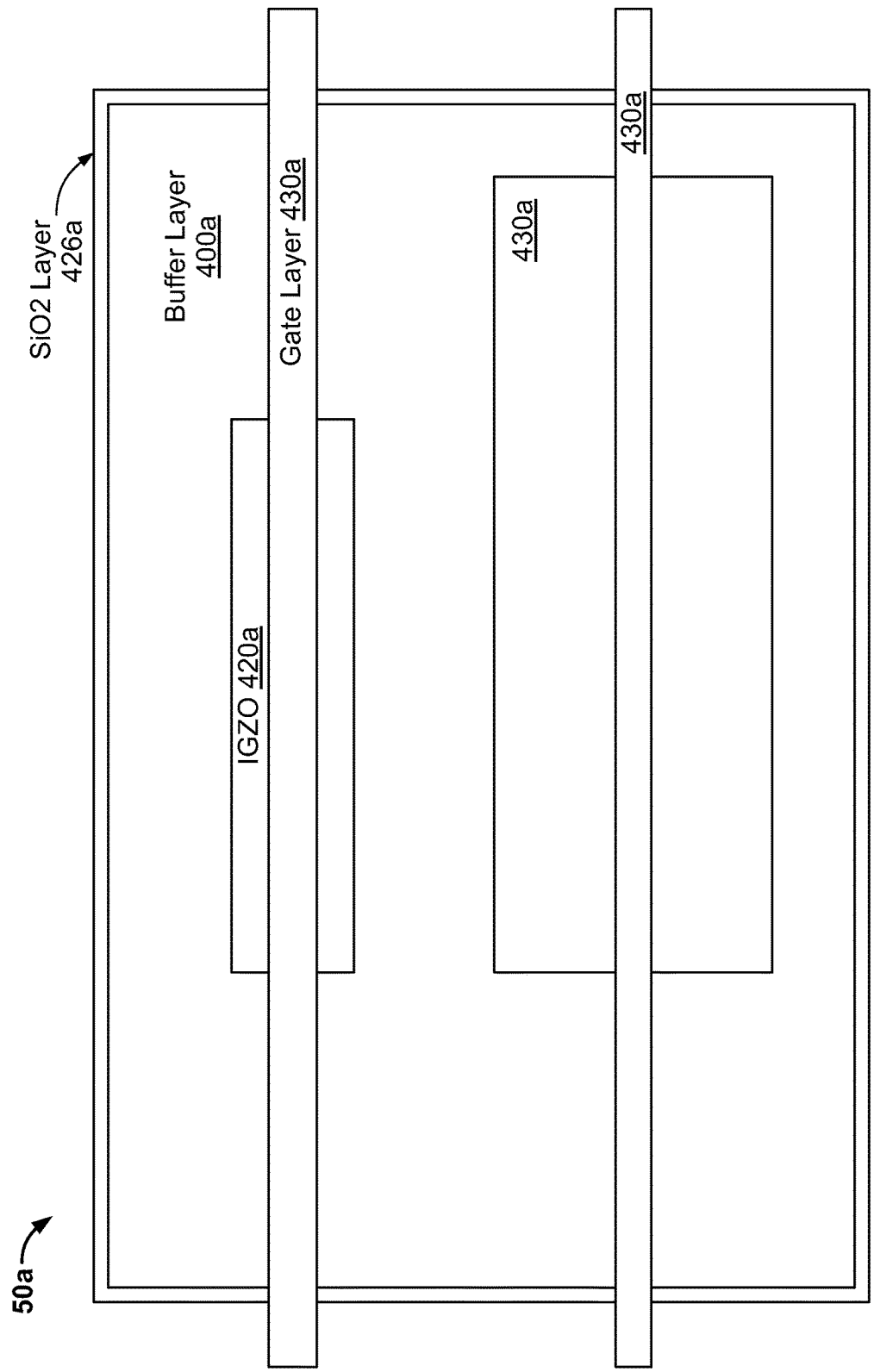
FIG. 6D illustrates a top view of a display device after a fourth processing step of patterning a gate metal layer.

In FIG. 6D, gate electrode 430a is patterned over the insulation layer 426a disposed on the semiconducting island 420a. The same material used for the gate electrode 430a may also be deposited on a pixel region 42 as discussed above.

Figure 6E:
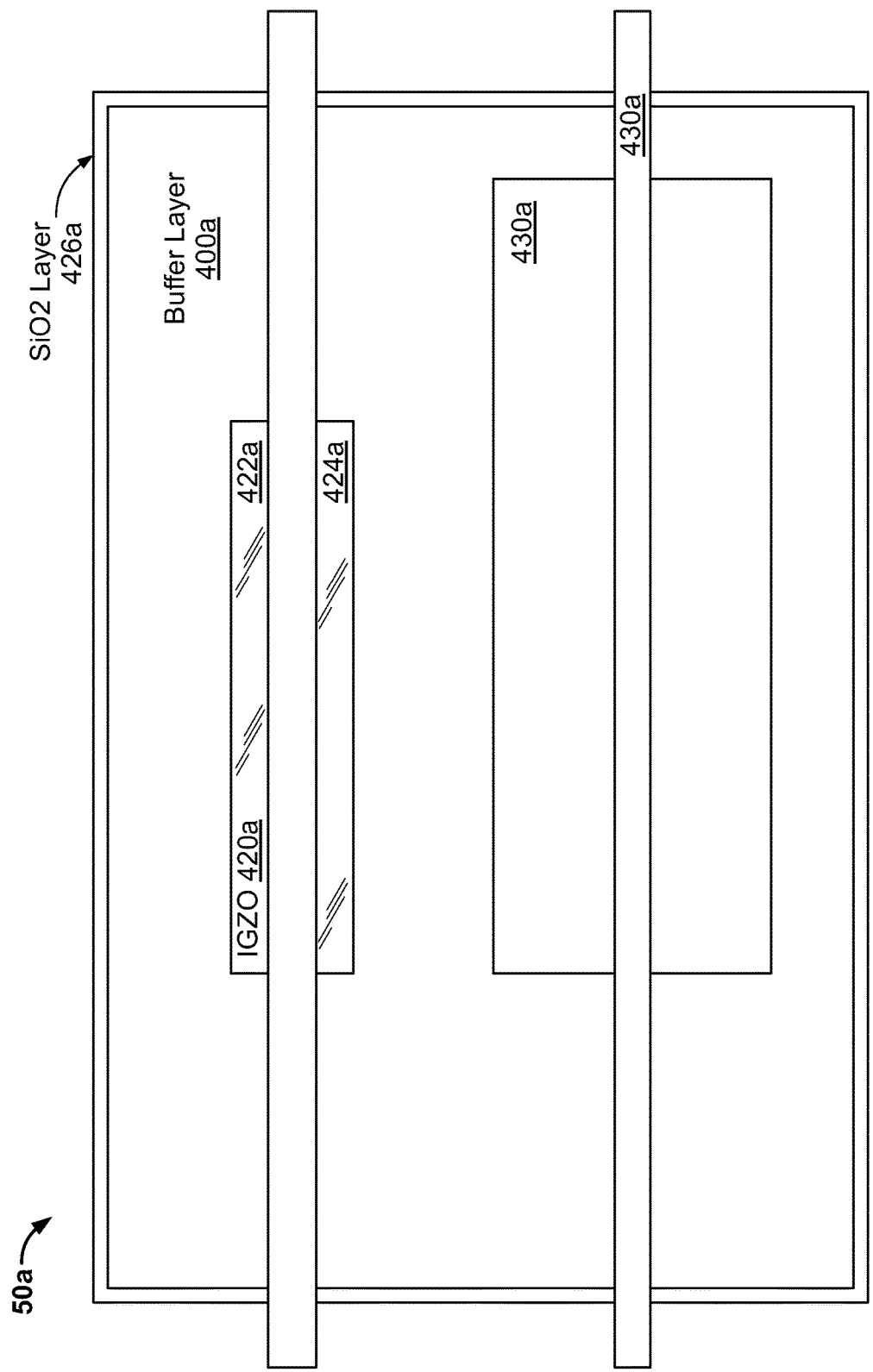
FIG. 6E illustrates a top view of a display device after a fifth processing step of forming via openings in the IGZO layer.

In FIG. 6E, dielectric layer 426a is patterned to include contact regions 422a and 424a, which may include one or more openings to expose portions of semiconducting island 420a.

Figure 6F:
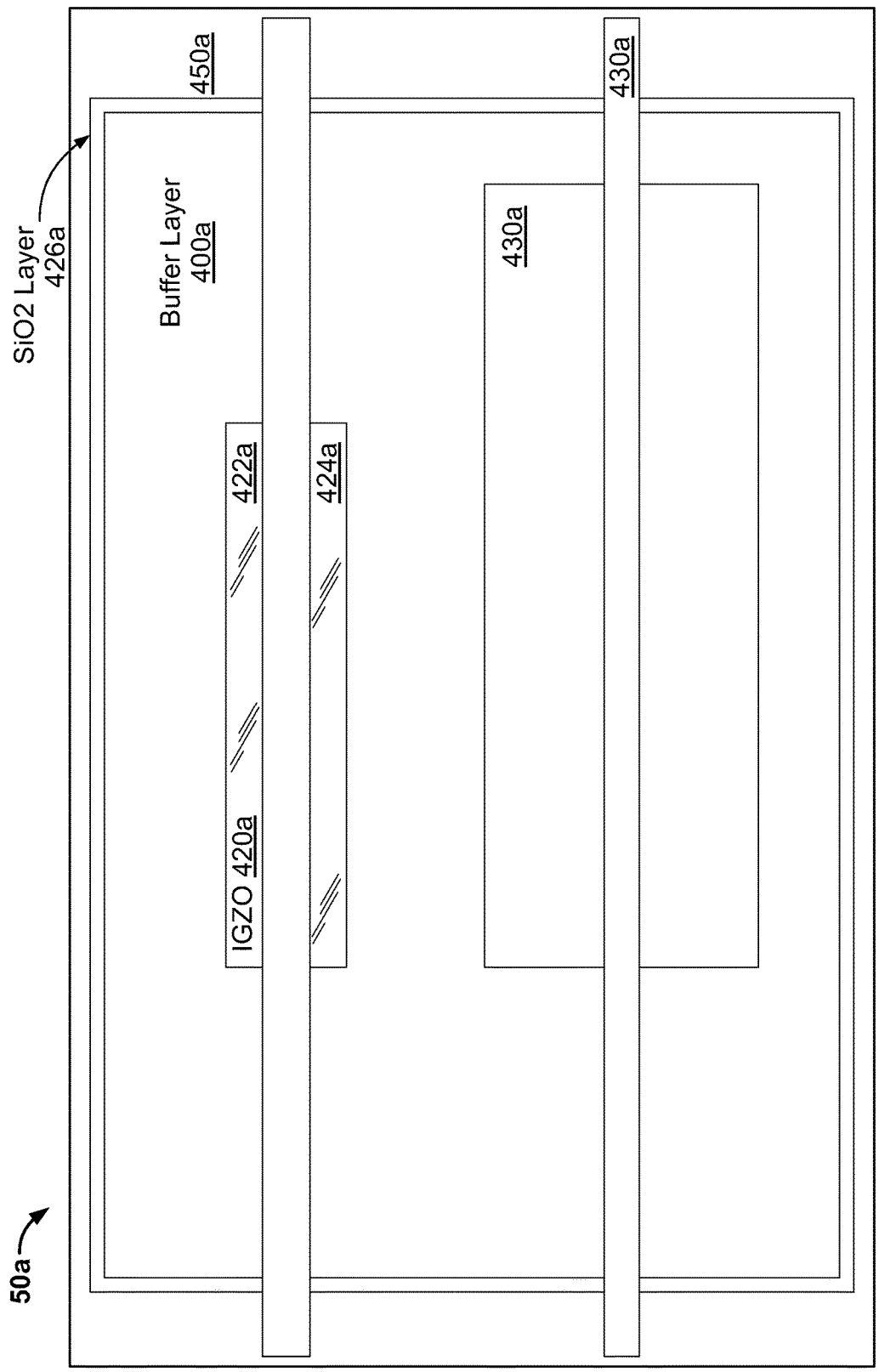
FIG. 6F illustrates a top view of a display device after a sixth processing step of depositing a SiNx layer and doping the IGZO layer.

FIG. 6F shows a top view of the device 50a after depositing a SiNx layer 450a. For example, the silicon nitride (SiNx) layer 450a is deposited on the complete region of device 50a to dope the IGZO region 420a. The SiNx layer 450a may provide dopants for IGZO regions through the contact regions 422a and 424a. When SiNx layer 450a is deposited over device 50a, portions of SiNx layer 450a pass through the gaps formed by contact regions 422a and 424a to the underlying semiconducting island 420a including the IGZO material. The regions of IGZO that are contacted by SiNx layer 450a become conductive when they come into contact with SiNx. Thus, the deposition of SiNx layer 450a forms first and second doped regions (see elements 530a and 530c in the cross-sectional view of FIG. 7A) within semiconducting island 530. The region of IGZO island 420a under the gate electrode 430a and dielectric layer 426a are undoped by the SiNx deposition. Additional vias may need to be formed in the SiNx layer 450a to connect the gate electrode 430a.

Figure 6G:
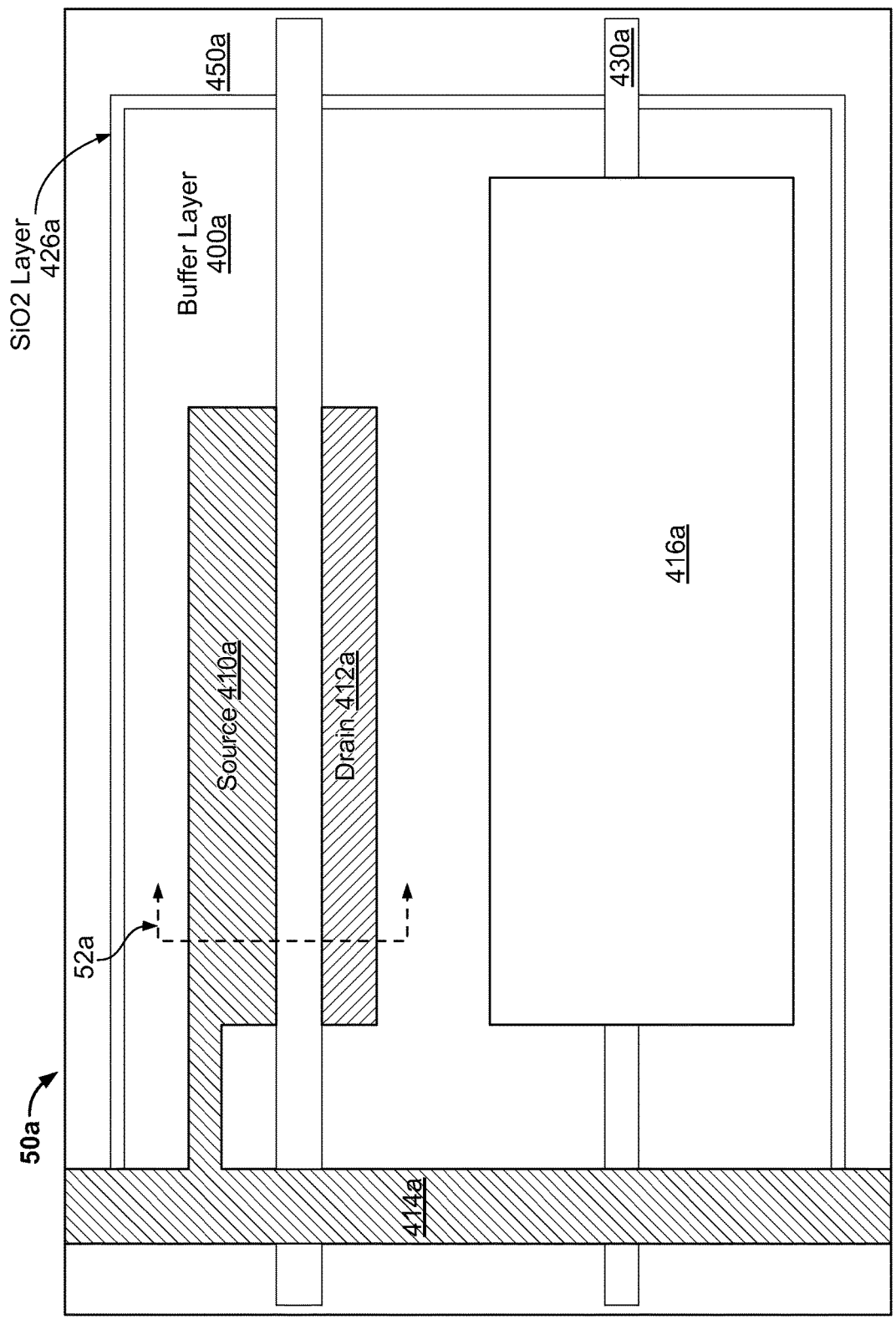
FIG. 6G illustrates a top view of a display device after a seventh processing step of forming source and drain contacts.
Figure 7A:
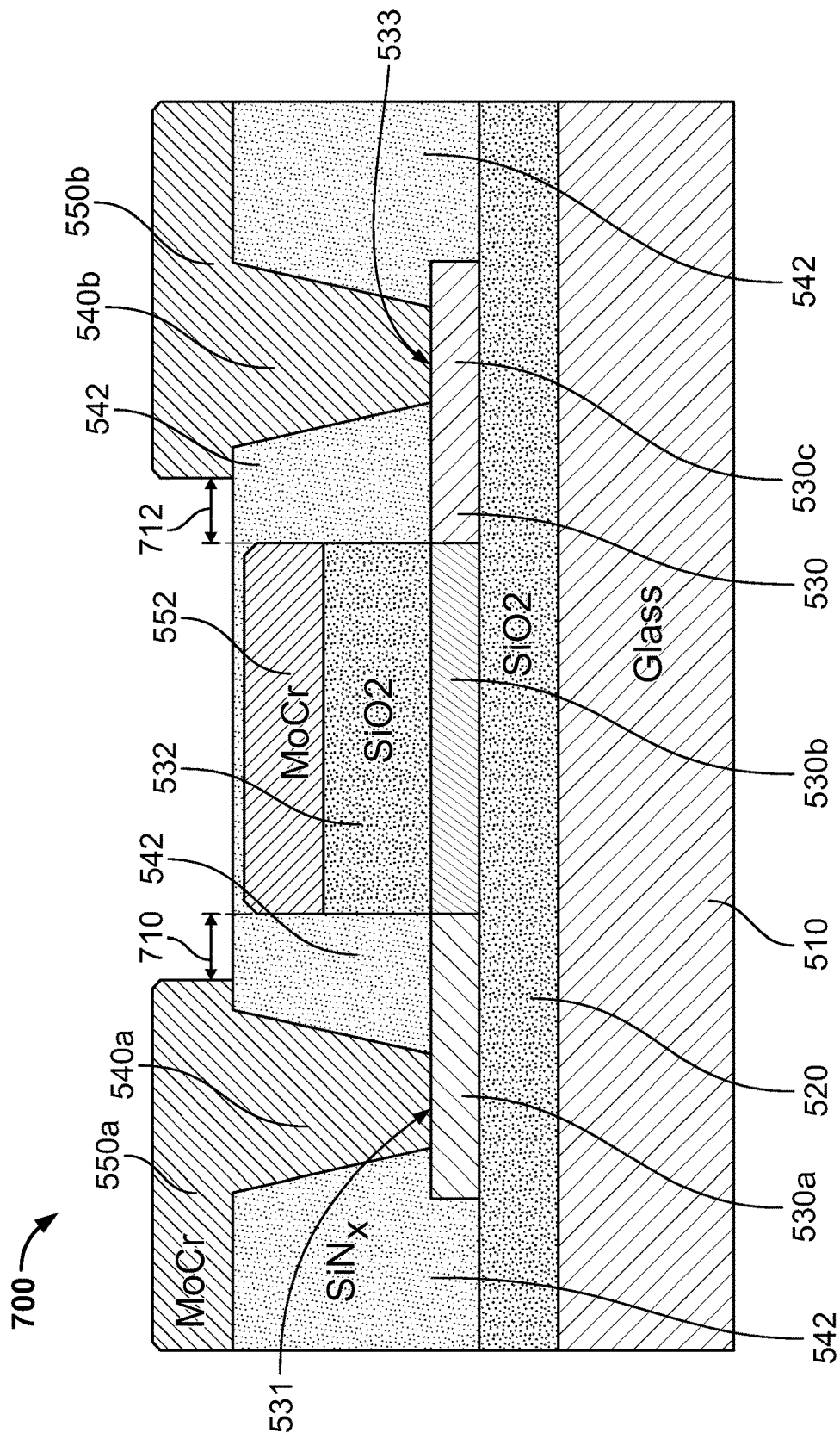
FIG. 7A depicts a cross-section view of a top gate top contact IGZO TFT architecture according to one or more embodiments of the present disclosure.

In FIG. 6G, source contact region 410a and a drain contact region 412a are fabricated on the buffer layer 400a using metal material similar to source contact region 410 and drain contact region 412 in FIG. 4B. Contact regions including vias may need to be formed before depositing the metal layer. A common connector 414a may also be fabricated using metal material. The common connector 414a may be used to connect a common voltage to a common electrode of the pixel. A storage capacitor bottom electrode 416a may be fabricated while fabricating the source and drain contact regions 410a and 412a. The source contact region 410a, drain contact region 412a, common connector 414a, and bottom electrode 416a may be formed over the insulation layer 520 as depicted in FIG. 7A.

Figure 6H:
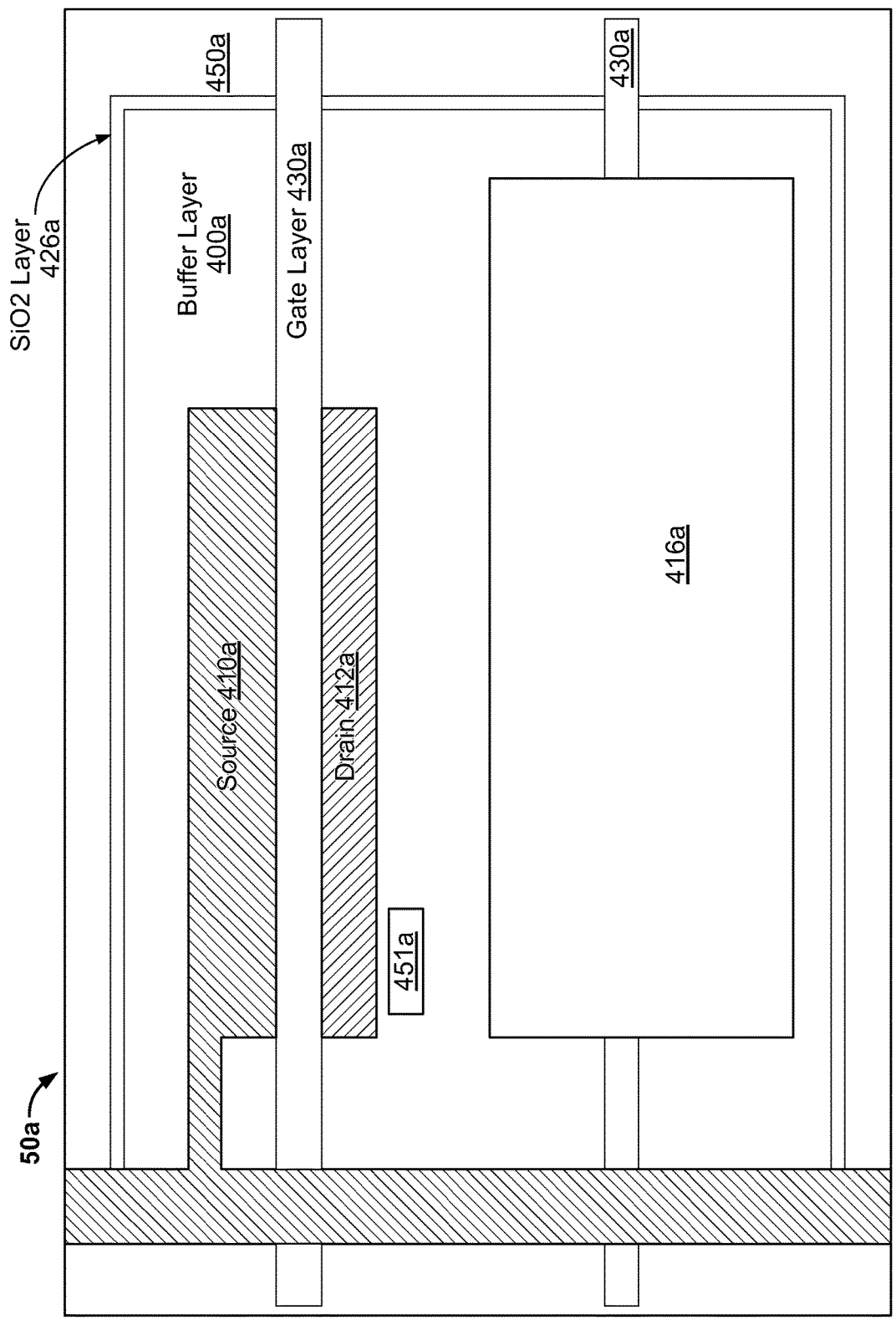
FIG. 6H illustrates a top view of a display device after an eighth processing step of passivation of SiN and via openings.

In FIG. 6H, a passivation layer of SiN may be deposited over the source and drain contact regions. A contact hole 451a is formed in the passivation layer to connect driving circuits outside of device 50a to the source and drain contact regions in the pixel electrode.

Figure 6I:
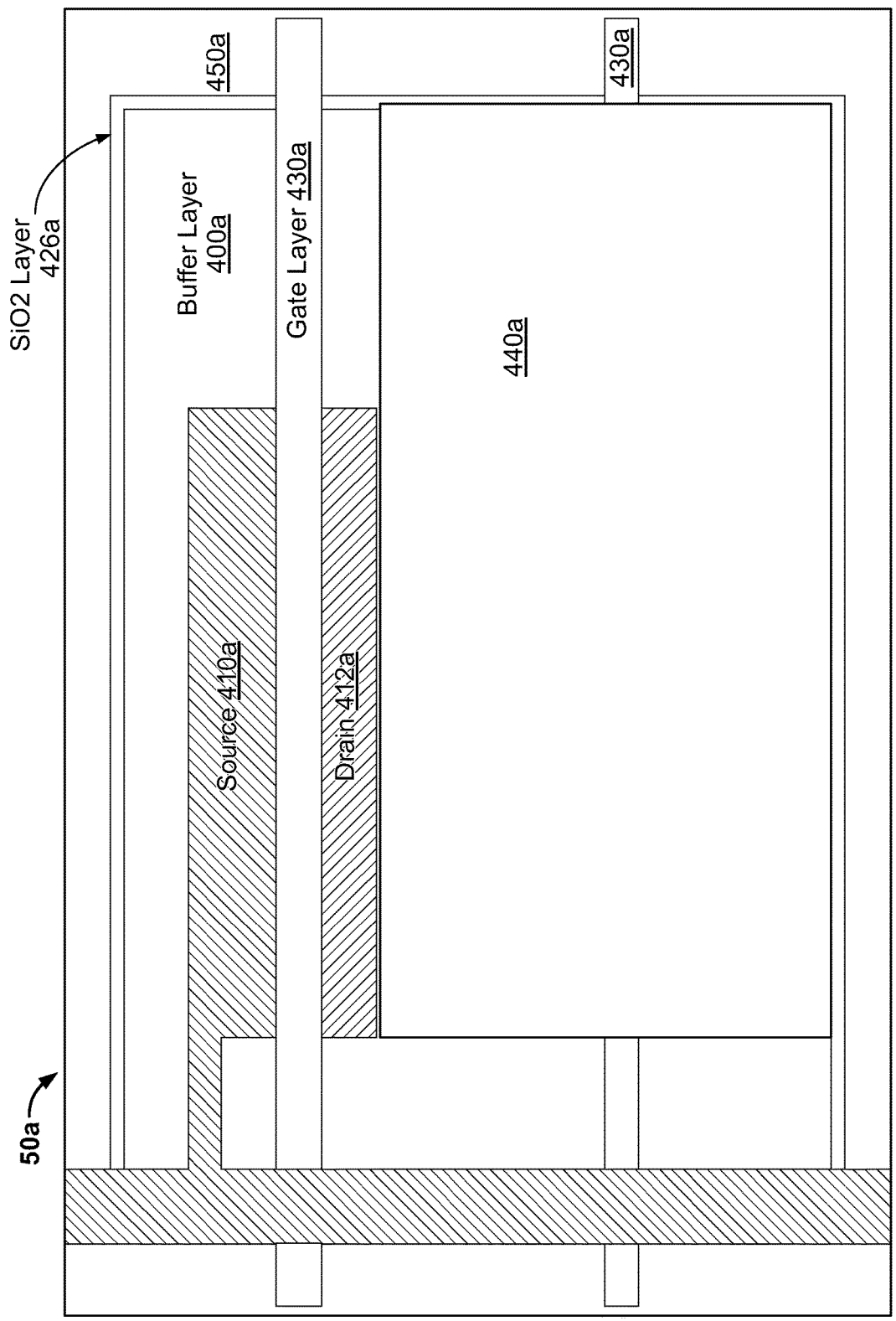
FIG. 6I illustrates a top view of a display device after a ninth processing step of patterning reflector metal layer.

In FIG. 6I, a reflector metal layer 440a is formed in the pixel region. Here, as discussed above regarding FIG. 4E, the reflector 440a may include but is not limited to materials comprised of reflective metals, multi-layer inorganic or organic dielectric mirrors, white diffuse materials, refractive materials, prismatic materials, or combinations thereof. For example, the reflector 440a may include MoCr. Additionally, the reflector 440a may include color material so that the reflector can act as a color filter.

Figure 6J:
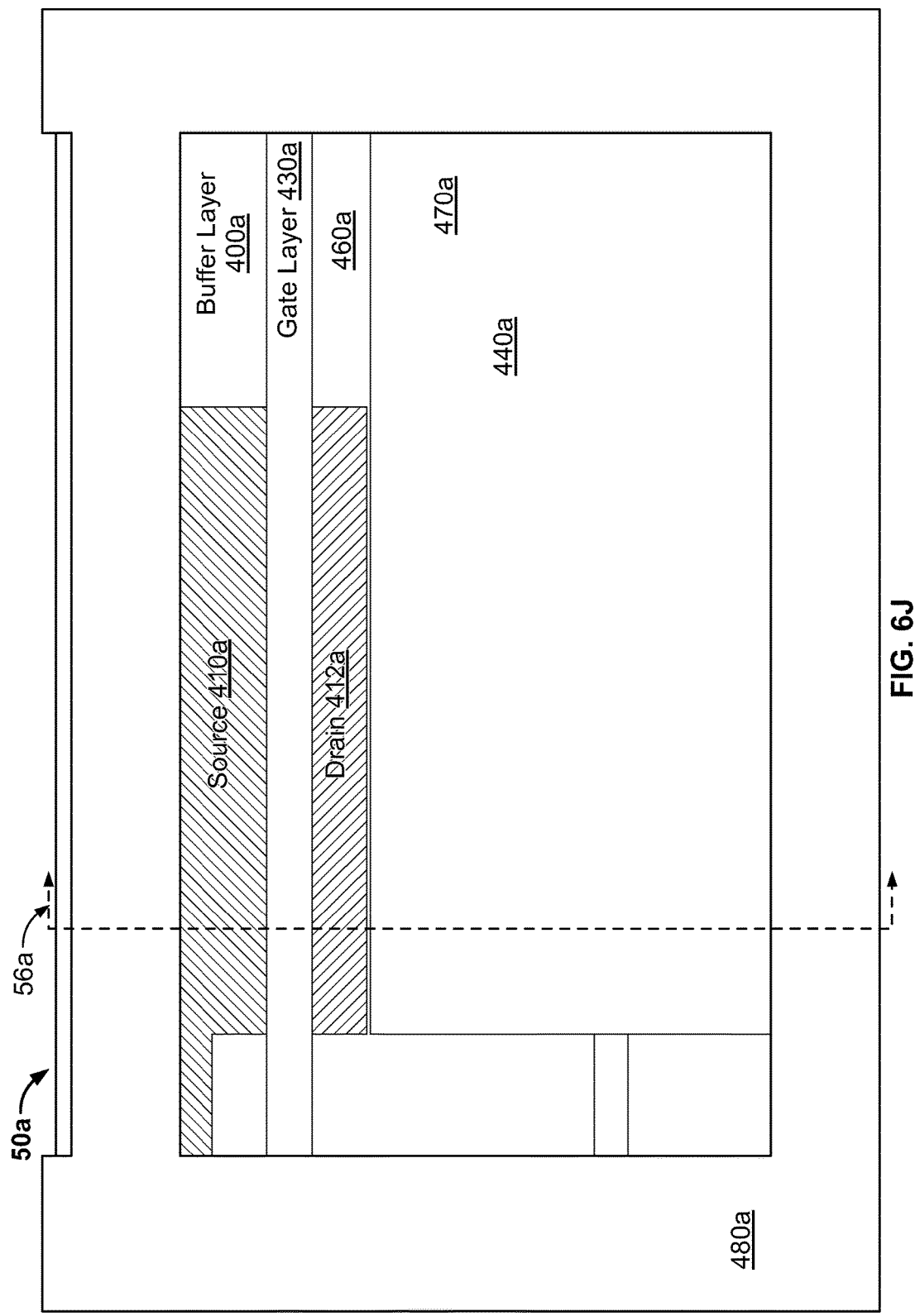
FIG. 6J shows an example device after the pixel wall layer is formed.

After the reflector layer 440a is formed, additional layers such as barrier layer 460a, fluoropolymer layer 470a, and pixel wall layer 480a may be formed as described in FIGS. 4G-4I. FIG. 6J shows the device 50a after the pixel wall layer 480a is formed.

FIG. 7A illustrates a cross-section view of a top-gate top-contact self-aligned IGZO TFT architecture that may be fabricated using processing steps similar to FIGS. 6A-6I (the view shown in FIG. 7A may be representative, for example, of a cross-sectional view of a portion of device 50a taken along the dashed line 52a in FIG. 6G). The self-aligned IGZO TFT 500a includes a glass substrate 510 at the bottom. An insulation layer 520 is disposed on the glass substrate 510. The insulation layer 520 may include $SiO_2$ or other dielectric material. The self-aligned IGZO TFT 500a includes a self-aligned IGZO layer 530 on top of the insulation layer 520. The self-aligned IGZO layer 530 includes a first doped region 530a, a second doped region 530c, and an undoped region 530b between the first doped region 530a and the second doped region 530c.

The self-aligned IGZO TFT 500a further includes a conductive via formed through SiNx layer 542 to form a source contact region 540a contacting the first doped region 530a of the self-aligned IGZO layer 530, and a second conductive via formed through SiNx layer 542 to form a drain contact region 540b contacting the second doped region 530c of the self-aligned IGZO layer 530. A $SiO2$ layer 532 is deposited on the undoped region 530b. The self-aligned IGZO TFT 500a may include SiNx layer 542 deposited partially on the $SiO2$ layer 520 and the self-aligned IGZO layer 530. The source contact region 540a and the drain contact region 540b are formed without additional processing after the SiNx layer 542 is deposited. The gate region 552 is deposited on the $SiO2$ layer 532 to form a complete gate stack that acts as a hard mask to shield the undoped IGZO region 530b from being doped by the SiNx deposition. Metal contacts may be disposed on top of the source and drain regions 540a and 540b. The source contact region 540a directly contacts a first upper surface or top surface 531 of the first doped region 530a. In this configuration, the source contact region 540a does not contact a side surface of the first doped region 530a. The drain contact region 540b directly contacts a second upper surface or top surface 533 of the second doped region 530c. In this configuration, the drain contact region 540b does not contact a side surface of the second doped region 530c.

In FIG. 7A, there is no overlap between the source contact metal 550a and the gate electrode 552 because there is a distance 710 between the two metal structures. Similarly, there is no overlap between the source drain contact metal 550b and the gate electrode 552 because there is a distance 712 between the two metal structures.

Figure 7E:
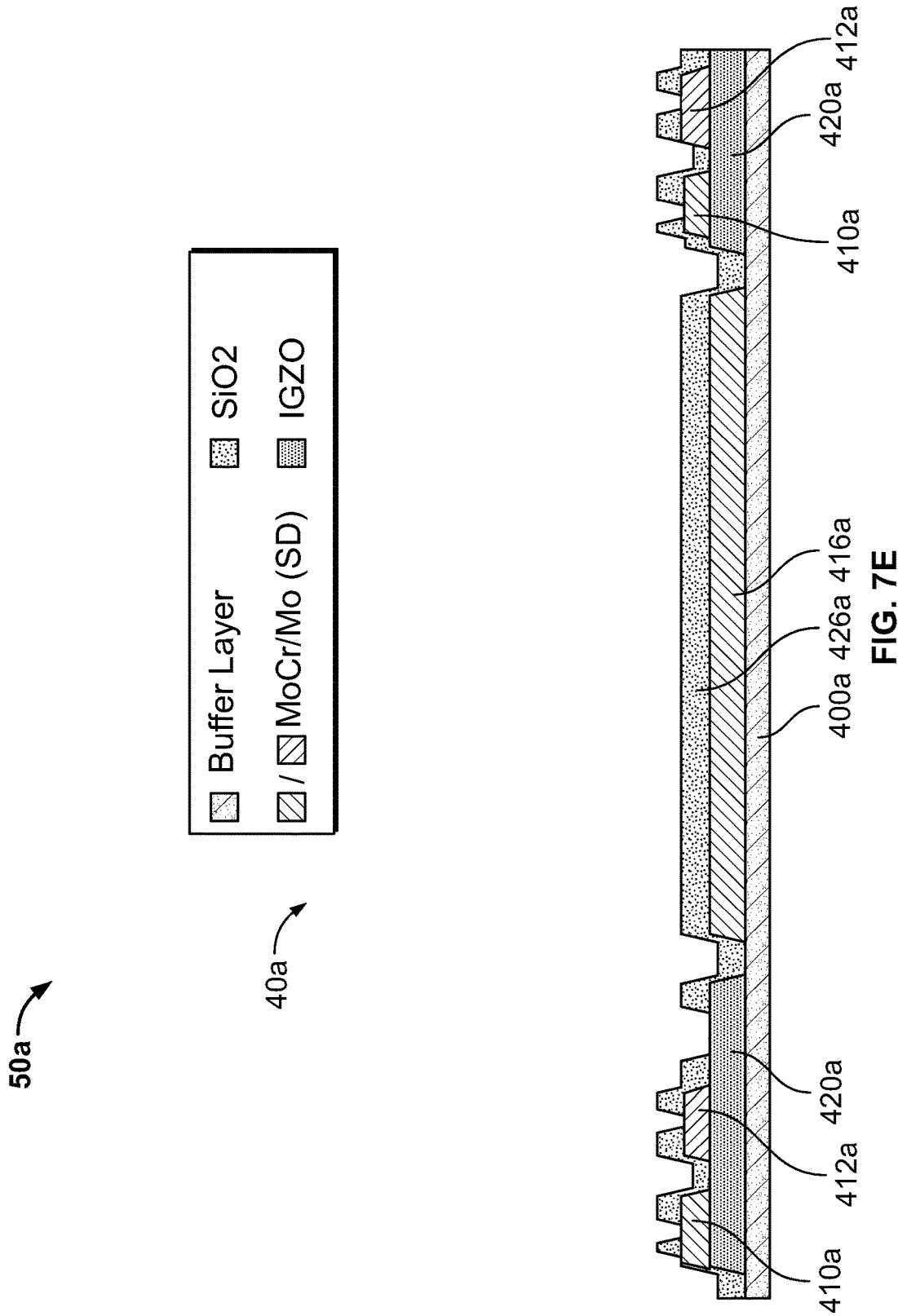
Figure 7H:
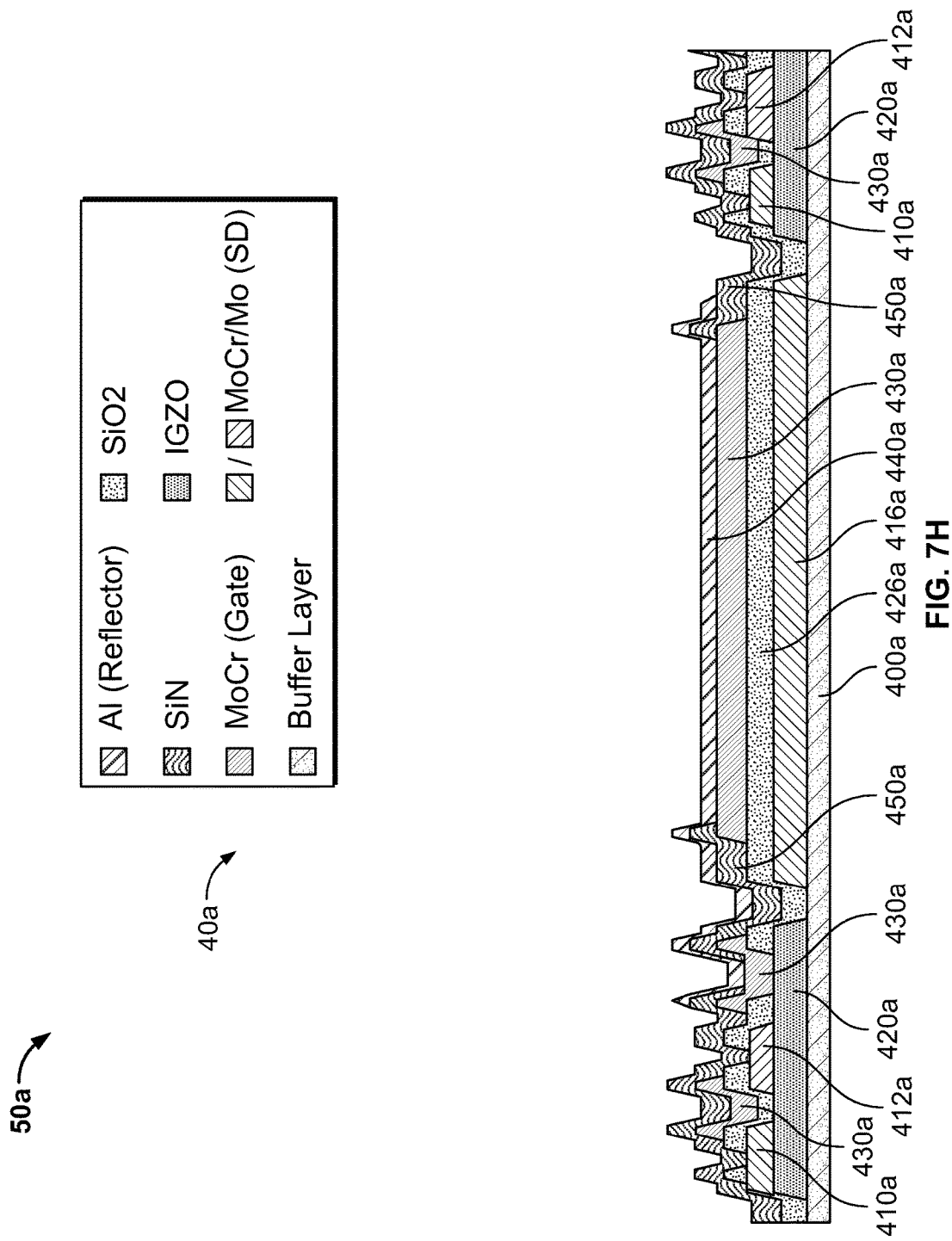
Figure 7I:
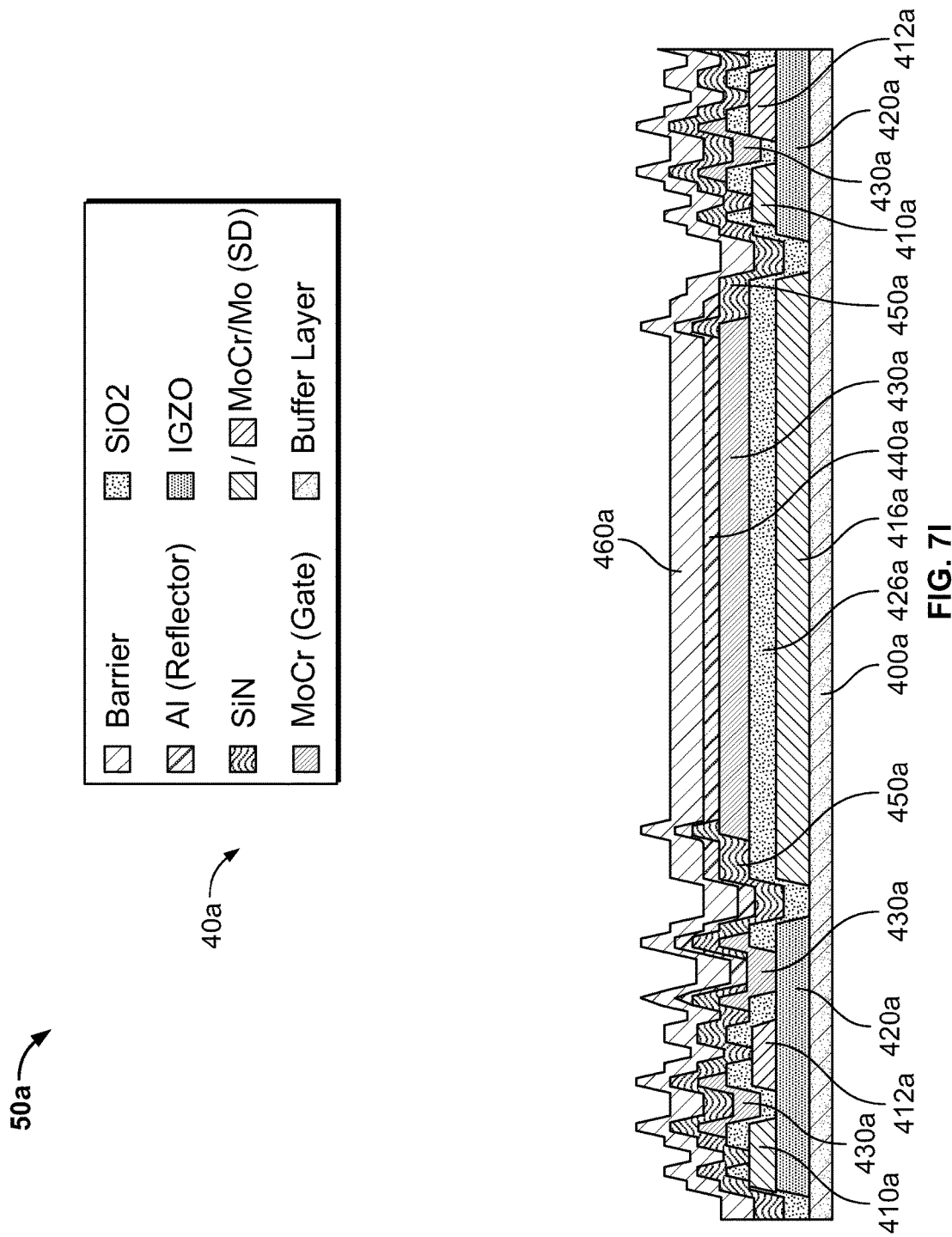
Figure 7J:
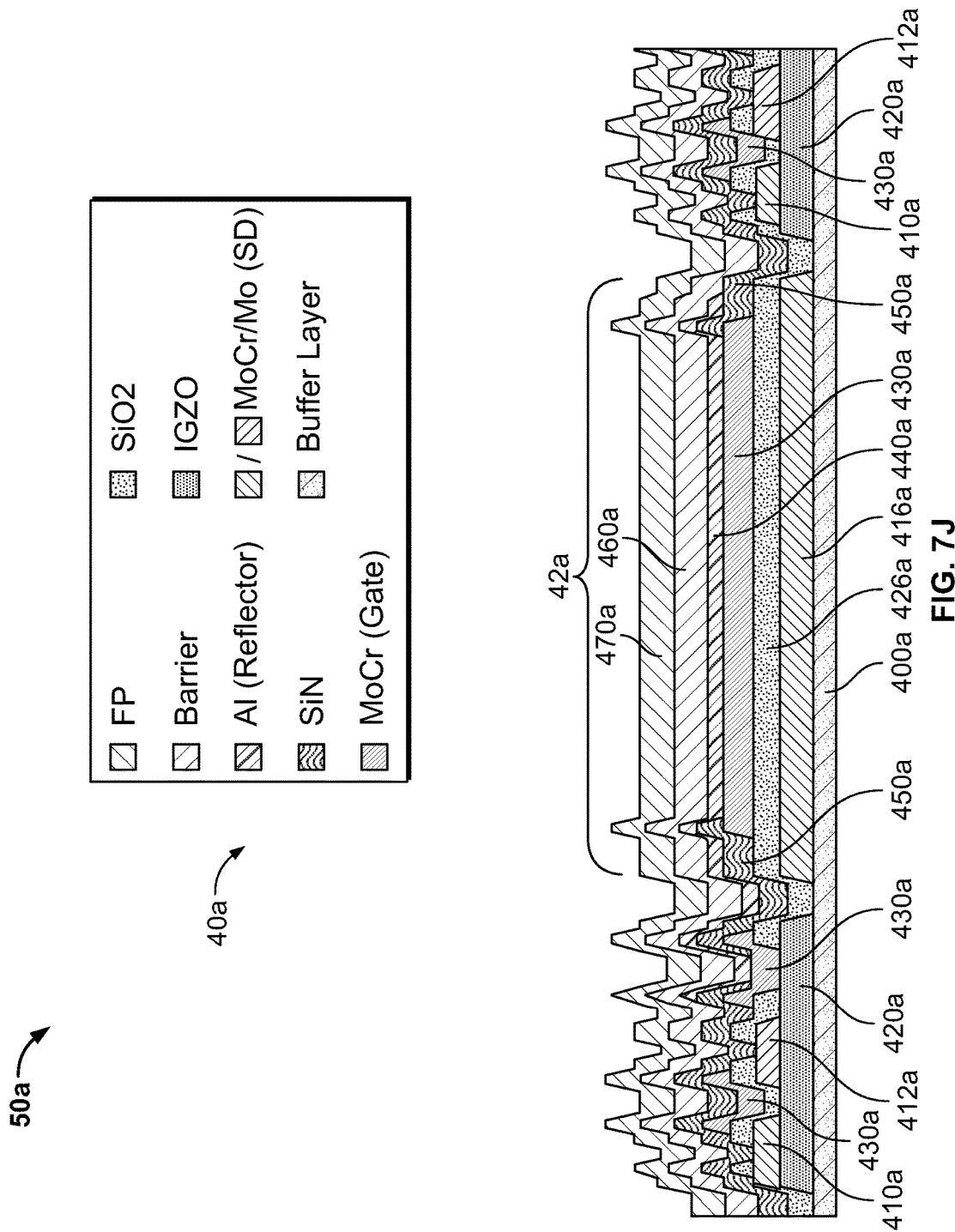

FIGS. 7B-7K illustrate cross-sectional views of a process of fabricating the device of FIG. 6J. FIG. 7B illustrates a cross-section view of a display device 50a after a processing step of depositing a buffer layer 400a. FIG. 7C illustrates a cross-section view of a display device 50a after a processing step of patterning an IGZO layer 420a. FIG. 7D illustrates a cross-section view of a display device after a processing step of forming source region 410a and drain region 412a. FIG. 7E illustrates a cross-section view of a display device after a processing step of patterning a SiO2 layer 426a. FIG. 7F illustrates a cross-section view of a display device after a processing step of forming gate layer 430a. FIG. 7G illustrates a cross-section view of a display device after a processing step of depositing a SiNx layer 450a and doping the IGZO layer 420a. FIG. 7H illustrates a cross-section view of a display device after a processing step of forming reflector layer 440a. FIG. 7I illustrates a cross-section view of a display device after an processing step of forming a barrier layer 460a. FIG. 7J illustrates a cross-section view of a display device after a processing step of forming FP layer 470a.

Figure 7K:
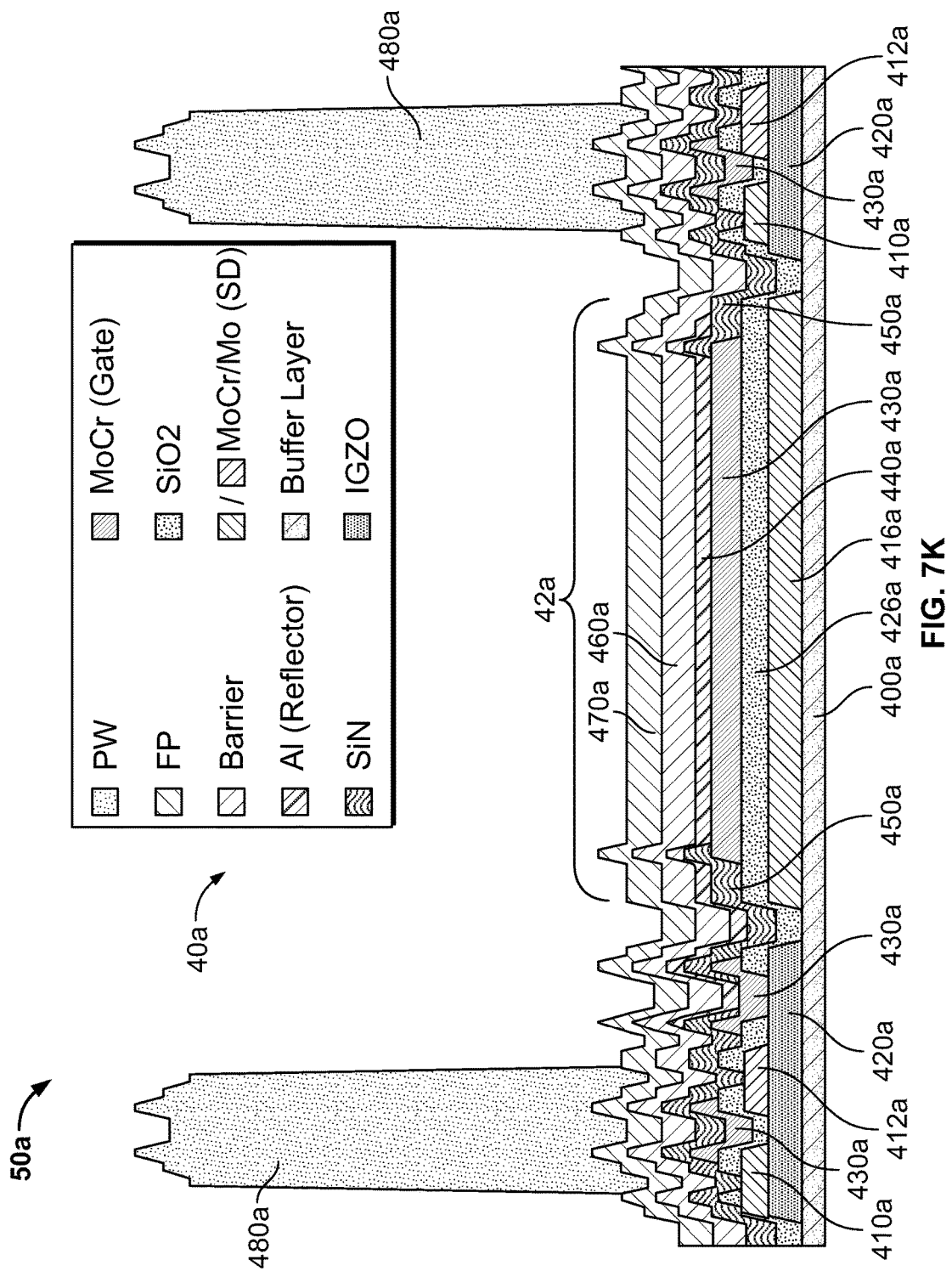

FIG. 7K illustrates a cross sectional view of a display device 50a along line 56a in FIG. 6J. The display device 50a is formed after forming the pixel wall (PW) layer 480a. The device 50a may include a pixel 40a in an electrowetting display using the above processing steps in FIGS. 6A-6J. One of the differences between the display device 50a in FIG. 7K and the display device 50 in FIG. 5J is that the IGZO layer 420a is directly disposed on the buffer layer 400a in FIG. 7K. Further, the source layer 410a and drain layer 412a are deposited on the IGZO layer 420a.

In FIG. 7K, the gate electrode 430a is disposed on the insulation layer 426a disposed on the IGZO layer 420a. The same material used for the gate electrode 430a is also deposited on the pixel region 42a between the pixel walls 480a.

In FIG. 7K, the SiNx layer 450a is deposited partially on the insulation layer 426a and the gate electrode 430a. The SiNx layer 450a also contacts the source contact region 410a and the drain contact region 412a via the contact regions, which may include contact holes. The SiNx layer 450a, however, is not deposited in the pixel region 42a, which is covered by the reflector 440a. Thus, the reflector 440a is disposed directly on the gate material in the pixel region 42a. The reflector 440a also partially covers the SiNx layer 450a near the boundaries of the pixel region 42a. The barrier layer 460a is deposited directly on the SiNx layer 450a and the reflector 440a. The FP layer 470a fully covers the barrier layer 460a. The pixel wall 480a is formed on the FP layer 470a so that the oil can be contained in each pixel.

Figure 8A:
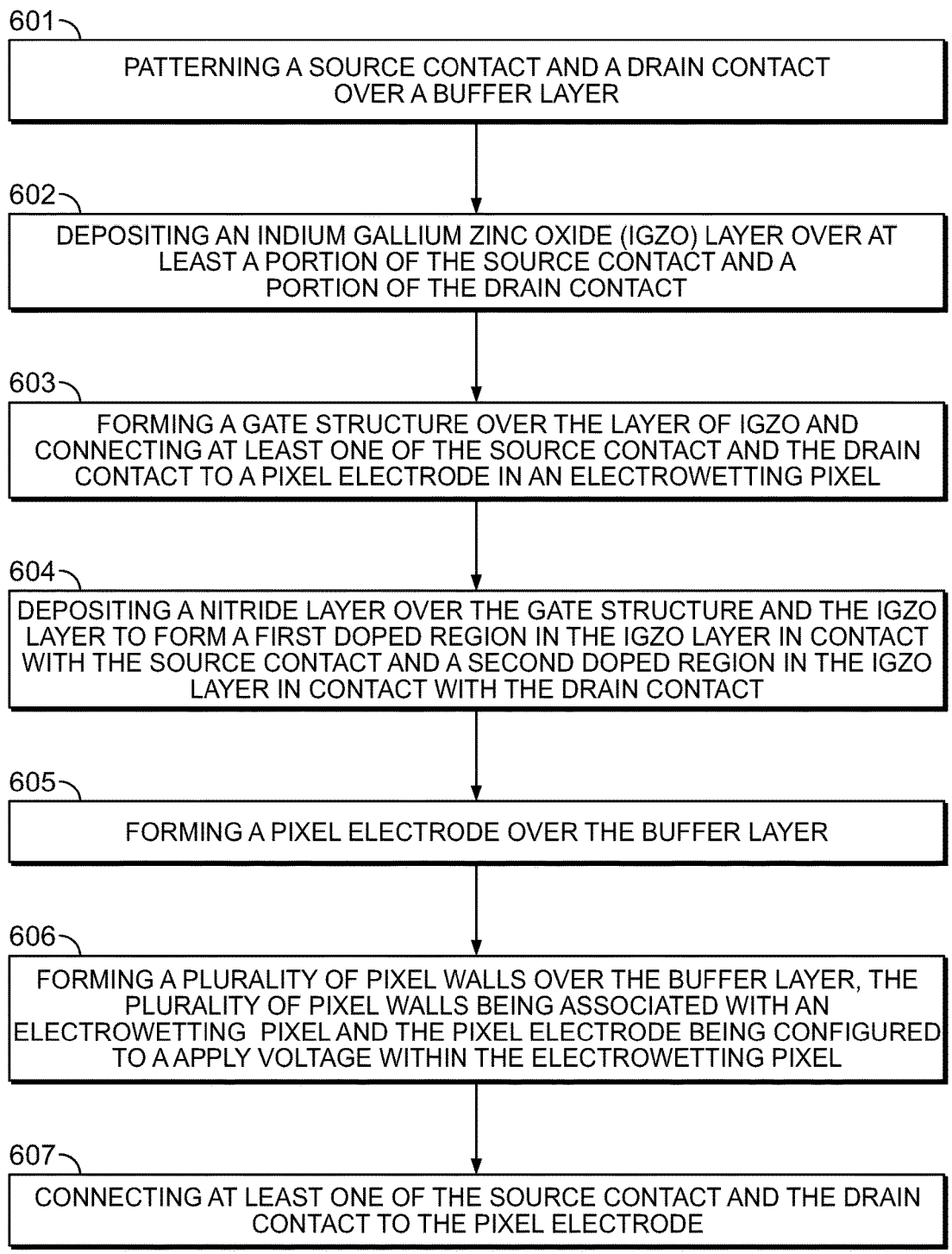
FIG. 8A is a flow chart that illustrates an example method for forming an electrowetting display device including a bottom contact top gate self-aligned IGZO TFT.

FIG. 8A shows an example method for fabricating an electrowetting display device including an IGZO TFT with self-aligned architecture. The IGZO TFT may be a bottom contact top gate TFT. In step 601, a source contact and a drain contact are patterned on a buffer layer. As disclosed above, the source contact and drain contact may include metal such as MoCr, Mo, etc.

In step 602, an IGZO layer is deposited over at least a portion of the source contact and a portion of the drain contact. The IGZO layer may be deposited by suitable deposition methods such as physical vapor deposition (PVD) or other suitable deposition methods.

In step 603, a gate structure is formed over the IGZO layer. At least one of the source contact and the drain contact is connected to a pixel electrode in an electrowetting pixel. The gate structure may include a metal layer 552 and an insulation layer 532 as shown in FIG. 7A, where the gate structure is formed over the undoped region 530b of the IGZO layer 530.

In step 604, a nitride layer is deposited over the gate structure and the IGZO layer. The deposition of the nitride layer, as described above, causes a first doped region to form in the IGZO layer in contact with the source contact and a second doped region to form in the IGZO layer in contact with the drain contact. The nitride layer may include SiNx or other material including nitride. Here, deposition of the nitride layer may lead to diffusion of H2 inside the IGZO layer which increase the conductivity of the doped IGZO region.

In step 605, a pixel electrode is formed over the buffer layer. The pixel electrode may include a TFT having a self-aligned IGZO, a source region contacting a first doped region of the self-aligned IGZO layer, and a drain region contacting a second doped region of the self-aligned IGZO layer. The pixel electrode may be connected to a common electrode. The electrowetting display device may apply a driving voltage to a hydrophobic surface via the electrode in conjunction with a common electrode to modify the wetting properties of the hydrophobic surface so that the surface becomes increasingly hydrophilic.

In step 606, a plurality of pixel walls are formed over the buffer layer, where the plurality of pixel walls are associated with an electrowetting pixel and the pixel electrode is configured to apply voltage within the electrowetting pixel to change the surface tension of a liquid in the pixel.

In step 607, at least one of the source contact and the drain contact is connected to the pixel electrode. Thus, the driving voltage may be applied to the IGZO TFT to control the corresponding pixel.

Figure 8B:
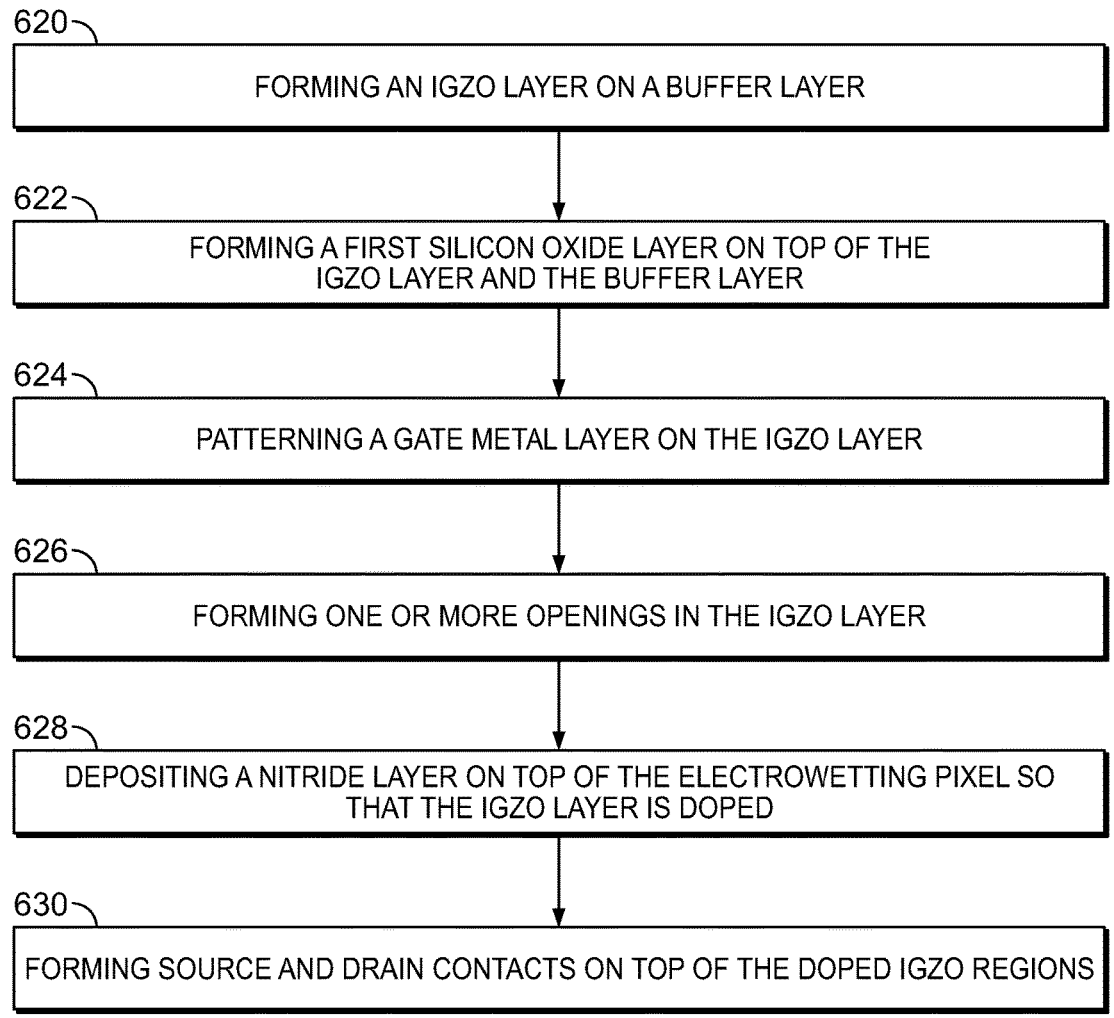
FIG. 8B is a flow chart that illustrates a process for forming a top gate top contact self-aligned IGZO TFT architecture.

FIG. 8B shows an example method for fabricating a top contact top gate TFT architecture. In step 620, an IGZO layer is formed on a buffer layer. The IGZO layer may be patterned or fabricated using a spray coating method. In step 622, a silicon oxide layer is formed on top of the IGZO layer and the buffer layer.

In step 624, a gate metal layer is patterned on the silicon oxide layer. The same metal layer may also be patterned in a pixel region of an electrowetting display device. In step 626, one or more openings are formed in the IGZO layer.

In step 628, a nitride layer is blanket deposited on top of the whole electrowetting pixel so that the IGZO layer is doped. For example, the IGZO regions that are not covered by the gate structure is doped while the region covered by the gate structure is undoped.

In step 630, source and drain contacts are formed on top of the doped IGZO regions. After the source and drain contact regions are formed, one or more passivation layers may be formed. Further, one or more contact holes may be formed in the passivation layers. A reflector may be formed in the pixel region by patterning one or more metal layers to reflect the light with desired wavelengths. Finally, one or more barrier layers and FP layers may also be formed in the electrowetting pixel.

Figure 9:
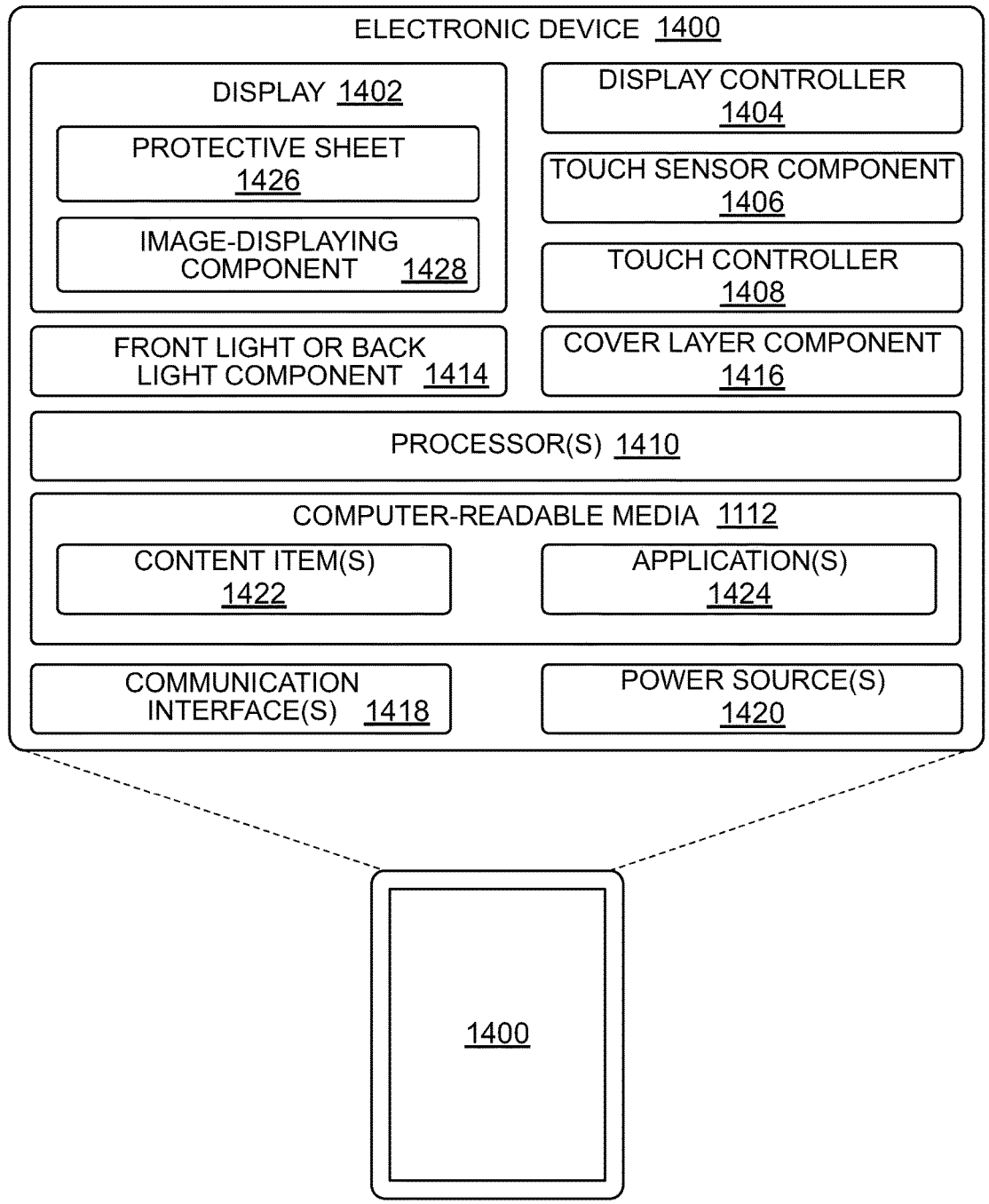
FIG. 9 illustrates an example electronic device that may incorporate a display device, according to various embodiments.

FIG. 9 illustrates an example electronic device 1400 that may incorporate any of the display devices discussed above. Electronic device 1400 may comprise any type of electronic device having a display. For instance, electronic device 1400 may be a mobile electronic device (e.g., an electronic book reader, a tablet computing device, a laptop computer, a smart phone or other multifunction communication device, a portable digital assistant, a wearable computing device, or an automotive display). Alternatively, electronic device 1400 may be a non-mobile electronic device (e.g., a computer display or a television). In addition, while FIG. 9 illustrates several example components of electronic device 1400, it is to be appreciated that electronic device 1400 may also include other conventional components, such as an operating system, system busses, input/output components, and the like. Further, in other embodiments, such as in the case of a television or computer monitor, electronic device 1400 may only include a subset of the components illustrated.

Regardless of the specific implementation of electronic device 1400, electronic device 1400 includes a display 1402 and a corresponding display controller 1404. The display 1402 may represent a reflective or transmissive display in some instances or, alternatively, a transflective display (partially transmissive and partially reflective).

In one embodiment, display 1402 comprises an electrowetting display that employs an applied voltage to change the surface tension of a fluid in relation to a surface. For example, such an electrowetting display may include an array of pixels as described herein, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of the display are independently activated, display 1402 may present a color or grayscale image. The pixels may form the basis for a transmissive, reflective, or transmissive/reflective (transflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "white" value of the pixel may correspond to a brightest red of the color filter. Furthermore, while some examples herein are described in the environment of a reflective display, in other examples, display 1402 may represent a backlit display, examples of which are mentioned above.

In addition to including display 1402, FIG. 9 illustrates that some examples of electronic device 1400 may include a touch sensor component 1406 and a touch controller 1408. In some instances, at least one touch sensor component 1406 resides with, or is stacked on, display 1402 to form a touch-sensitive display. Thus, display 1402 may be capable of both accepting user touch input and rendering content in response to or corresponding to the touch input. As several examples, touch sensor component 1406 may comprise a capacitive touch sensor, a force sensitive resistance (FSR), an interpolating force sensitive resistance (IFSR) sensor, or any other type of touch sensor. In some instances, touch sensor component 1406 is capable of detecting touches as well as determining an amount of pressure or force of these touches.

FIG. 9 further illustrates that electronic device 1400 may include one or more processors 1410 and one or more computer-readable media 1412, as well as a front light component 1414 (which may alternatively be a backlight component in the case of a backlit display) for lighting display 1402, a cover layer component 1416, such as a cover glass or cover sheet, one or more communication interfaces 1418 and one or more power sources 1420. The communication interfaces 1418 may support both wired and wireless connection to various networks, such as cellular networks, radio, WiFi networks, short range networks (e.g., Bluetooth® technology), and infrared (IR) networks, for example.

Depending on the configuration of electronic device 1400, computer-readable media 1412 (and other computer-readable media described throughout) is an example of computer storage media and may include volatile and nonvolatile memory. Thus, computer-readable media 1412 may include, without limitation, RAM, ROM, EEPROM, flash memory, and/or other memory technology, and/or any other suitable medium that may be used to store computer-readable instructions, programs, applications, media items, and/or data which may be accessed by electronic device 1400.

Computer-readable media 1412 may be used to store any number of functional components that are executable on processor 1410, as well as content items 1422 and applications 1424. Thus, computer-readable media 1412 may include an operating system and a storage database to store one or more content items 1422, such as eBooks, audio books, songs, videos, still images, and the like. Computer-readable media 1412 of electronic device 1400 may also store one or more content presentation applications to render content items on electronic device 1400. These content presentation applications may be implemented as various applications 1424 depending upon content items 1422. For instance, the content presentation application may be an electronic book reader application for rending textual electronic books, an audio player for playing audio books or songs, or a video player for playing video.

In some instances, electronic device 1400 may couple to a cover (not illustrated in FIG. 9) to protect the display 1402 (and other components in the display stack or display assembly) of electronic device 1400. In one example, the cover may include a back flap that covers a back portion of electronic device 1400 and a front flap that covers display 1402 and the other components in the stack. Electronic device 1400 and/or the cover may include a sensor (e.g., a Hall effect sensor) to detect whether the cover is open (i.e., if the front flap is not atop display 1402 and other components). The sensor may send a signal to front light component 1414 if the cover is open and, in response, front light component 1414 may illuminate display 1402. If the cover is closed, meanwhile, front light component 1414 may receive a signal indicating that the cover has closed and, in response, front light component 1414 may turn off.

Furthermore, the amount of light emitted by front light component 1414 may vary. For instance, upon a user opening the cover, the light from the front light may gradually increase to its full illumination. In some instances, electronic device 1400 includes an ambient light sensor (not illustrated in FIG. 9) and the amount of illumination of front light component 1414 may be based at least in part on the amount of ambient light detected by the ambient light sensor. For example, front light component 1414 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 1402 may vary depending on whether front light component 1414 is on or off, or based on the amount of light provided by front light component 1414. For instance, electronic device 1400 may implement a larger default font or a greater contrast when the light is off compared to when the light is on. In some embodiments, electronic device 1400 maintains, if the light is on, a contrast ratio for display 1402 that is within a certain defined percentage of the contrast ratio if the light is off.

As described above, touch sensor component 1406 may comprise a capacitive touch sensor that resides atop display 1402. In some examples, touch sensor component 1406 may be formed on or integrated with cover layer component 1416. In other examples, touch sensor component 1406 may be a separate component in the stack of the display assembly. Front light component 1414 may reside atop or below touch sensor component 1406. In some instances, either touch sensor component 1406 or front light component 1414 is coupled to a top surface of a protective sheet 1426 of display 1402. As one example, front light component 1414 may include a lightguide sheet and a light source (not illustrated in FIG. 9). The lightguide sheet may comprise a substrate (e.g., a transparent thermoplastic such as PMMA or other acrylic), a layer of lacquer and multiple grating elements formed in the layer of lacquer that function to propagate light from the light source towards display 1402; thus, illuminating display 1402.

Cover layer component 1416 may include a transparent substrate or sheet having an outer layer that functions to reduce at least one of glare or reflection of ambient light incident on electronic device 1400. In some instances, cover layer component 1416 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3h pencil). Without such scratch resistance, a device may be more easily scratched and a user may perceive the scratches from the light that is dispersed over the top of the reflective display. In some examples, protective sheet 1426 may include a similar UV-cured hard coating on the outer surface. Cover layer component 1416 may couple to another component or to protective sheet 1426 of display 1402. Cover layer component 1416 may, in some instances, also include a UV filter, a UV-absorbing dye, or the like, for protecting components lower in the stack from UV light incident on electronic device 1400. In still other examples, cover layer component 1416 may include a sheet of high-strength glass having an antiglare and/or antireflective coating.

Display 1402 includes protective sheet 1426 overlying an image-displaying component 1428. For example, display 1402 may be preassembled to have protective sheet 1426 as an outer surface on the upper or image-viewing side of display 1402. Accordingly, protective sheet 1426 may be integral with and may overlay image-displaying component 1428. Protective sheet 1426 may be optically transparent to enable a user to view, through protective sheet 1426, an image presented on image-displaying component 1428 of display 1402.

In some examples, protective sheet 1426 may be a transparent polymer film in the range of 25 to 200 micrometers in thickness. As several examples, protective sheet 1426 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 1426 may include a coating, such as the hard coating described above. For instance, the hard coating may be applied to the outer surface of protective sheet 1426 before or after assembly of protective sheet 1426 with image-displaying component 1428 of display 1402. In some examples, the hard coating may include a photoinitiator or other reactive species in its composition, such as for curing the hard coating on protective sheet 1426. Furthermore, in some examples, protective sheet 1426 may be dyed with a UV-light-absorbing dye, or may be treated with other UV-absorbing treatment. For example, protective sheet 1426 may be treated to have a specified UV cutoff such that UV light below a cutoff or threshold wavelength is at least partially absorbed by protective sheet 1426, thereby protecting image-displaying component 1428 from UV light.

According to some embodiments herein, one or more of the components discussed above may be coupled to display 1402 using fluid optically-clear adhesive (LOCA). For example, the lightguide portion of front light component 1414 may be coupled to display 1402 by placing LOCA on the outer or upper surface of protective sheet 1426. If the LOCA reaches the corner(s) and/or at least a portion of the perimeter of protective sheet 1426, UV-curing may be performed on the LOCA at the corners and/or the portion of the perimeter. Thereafter, the remaining LOCA may be UV-cured and front light component 1414 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 1414. In other embodiments, the LOCA may be placed near a center of protective sheet 1426, and pressed outwards towards a perimeter of the top surface of protective sheet 1426 by placing front light component 1414 on top of the LOCA. The LOCA may then be cured by directing UV light through front light component 1414. As discussed above, and as discussed additionally below, various techniques, such as surface treatment of the protective sheet, may be used to prevent discoloration of the LOCA and/or protective sheet 1426.

While FIG. 9 illustrates a few example components, electronic device 1400 may have additional features or functionality. For example, electronic device 1400 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 1400 may reside remotely from electronic device 1400 in some implementations. In these implementations, electronic device 1400 may utilize communication interfaces 1418 to communicate with and utilize this functionality.

In an aspect according to one or more embodiments of the disclosure, an electrowetting display device includes a first support plate and a second support plate. The electrowetting display device includes an oil between the first support plate and the second support plate. The electrowetting display device includes an electrolyte fluid that is immiscible with the oil disposed between the first support plate and the second support plate. The electrowetting display device includes a plurality of pixel walls over the first support plate, the plurality of pixel walls being associated with an electrowetting pixel. The electrowetting display device includes a pixel electrode over the first support plate for applying a voltage within the electrowetting pixel to cause relative displacement of the oil within the electrowetting pixel to modify a reflectance of the electrowetting pixel. The electrowetting display device includes a thin film transistor (TFT) connected to the pixel electrode to control the application of the voltage within the electrowetting pixel. The TFT includes: an indium gallium zinc oxide (IGZO) layer, the IGZO layer including a first doped region, a second doped region, and an undoped region between the first doped region and the second doped region; a gate structure over the IGZO layer and not overlapping the first doped region or the second doped region of the IGZO layer.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device, comprising:
a first support plate and a second support plate;
an oil between the first support plate and the second support plate;
an electrolyte fluid that is immiscible with the oil disposed between the first support plate and the second support plate;
a plurality of pixel walls over the first support plate, the plurality of pixel walls being associated with an electrowetting pixel;
a pixel electrode over the first support plate for applying a voltage within the electrowetting pixel to cause relative displacement of the oil within the electrowetting pixel to modify a reflectance of the electrowetting pixel; and a thin film transistor (TFT) connected to the pixel electrode to control an application of the voltage within the electrowetting pixel, the TFT including:
an indium gallium zinc oxide (IGZO) layer, the IGZO layer including a first doped region, a second doped region, and an undoped region between the first doped region and the second doped region,
a source contact contacting the first doped region in the layer of IGZO,
a drain contact contacting the second doped region in the layer of IGZO, and
a gate structure over the IGZO layer and not overlapping the first doped region or the second doped region of the IGZO layer.

2. The electrowetting display device of claim 1, wherein the gate structure is over the undoped region of the IGZO layer.

3. The electrowetting display device of claim 1, further comprising:
a silicon nitride layer over the IGZO layer and the gate structure;
a first conductive via through the silicon nitride layer in contact with the first doped region to form a source contact of the TFT; and
a second conductive via through the silicon nitride layer in contact with the second doped region to form a drain contact of the TFT.

4. A display device, comprising:
a support plate;
a thin film transistor (TFT) on the support plate, the TFT including:
a layer of indium gallium zinc oxide (IGZO) including a first doped region and a second doped region,
a source contact contacting the first doped region in the layer of IGZO, and
a drain contact contacting the second doped region in the layer of IGZO; and
a pixel electrode over the support plate and associated with an electrowetting pixel, the pixel electrode being connected to the drain contact.

5. The display device of claim 4, wherein the TFT further comprises a gate structure over the layer of IGZO and wherein a location of the first doped region in the layer of IGZO and a location of the second doped region in the layer of IMO are at least partially determined by a location of the gate structure over the layer of IGZO.

6. The display device of claim 5, wherein the gate structure does not overlap the first doped region in the layer of IGZO and the gate structure does not overlap the second doped region in the layer of IGZO.

7. The display device of claim 5, wherein the layer of IGZO includes a third undoped region between the first doped region and the second doped region.

8. The display device of claim 7, wherein the source contact of the TFT overlaps and is in contact with at least a portion of the first doped region in the layer of IGZO and the drain contact of the TFT overlaps and is in contact with at least a portion of the second doped region in the layer of IGZO.

9. The display device of claim 5, further comprising a layer of dielectric material over the layer of IGZO, the layer of dielectric material including a first opening that at least partially overlaps the layer of IGZO and a second opening that at least partially overlaps the layer of IGZO.

10. The display device of claim 9, wherein the first opening in the layer of dielectric material overlaps the first doped region in the layer of IGZO and the second opening in the layer of dielectric material overlaps the second doped region in the layer of IGZO.

11. The display device of claim 5, further comprising a silicon nitride layer over the layer of IGZO and wherein the first doped region in the layer of IGZO and the second doped region in the layer of IGZO are at least partially formed by the silicon nitride layer.

12. The display device of claim 11, further comprising:
a first conductive via formed through the silicon nitride layer in contact with the first doped region to connect the first doped region to the source contact; and
a second conductive via formed through the silicon nitride layer in contact with the second doped region to connect the second doped region to the drain contact.

13. The display device of claim 5, wherein the source contact only contacts the layer of IGZO on a top surface of the first doped region in the layer of IGZO and the drain contact only contacts the layer of IGZO on a top surface of the second doped region in the layer of IGZO.

14. A display device, comprising:
a support plate;
a transistor on the support plate, the transistor including a layer of indium gallium zinc oxide (IGZO);
a gate structure over the layer of IGZO, wherein a location of a first doped region in the layer of IGZO and a location of a second doped region in the layer of IGZO are at least partially determined by a location of the gate structure over the layer of IGZO, and wherein the gate structure does not overlap the first doped region or the second doped region;
a first contact electrically connected to the layer of IGZO;
a second contact electrically connected to the layer of IGZO; and
a pixel electrode over the support plate and associated with a pixel, the pixel electrode being electrically connected to the second contact.

15. The display device of claim 14, wherein the first contact overlaps and is in contact with at least a portion of the first doped region in the layer of IGZO and the second contact overlaps and is in contact with at least a portion of the second doped region in the layer of IGZO.

16. The display device of claim 14, further comprising a layer of dielectric material over the layer of IGZO, the layer of dielectric material including a first opening that at least partially overlaps the first doped region in the layer of IGZO and a second opening that at least partially overlaps the second doped region in the layer of IGZO.

17. The display device of claim 14, wherein the layer of IGZO includes a third undoped region between the first doped region and the second doped region.

18. The display device of claim 14, wherein the first contact only contacts the layer of IGZO on a top surface of the layer of IGZO and the second contact only contacts the layer of IGZO on a top surface of the layer of IGZO.

* * * * *